United States Patent
Flynn et al.

(10) Patent No.: US 8,489,817 B2
(45) Date of Patent: Jul. 16, 2013

(54) APPARATUS, SYSTEM, AND METHOD FOR CACHING DATA

(75) Inventors: David Flynn, Sandy, UT (US); David Atkisson, Draper, UT (US); Joshua Aune, South Jordan, UT (US)

(73) Assignee: Fusion-io, Inc., Salt Lake City, UT (US)

( * ) Notice: Subject to any disclaimer, the term of this patent is extended or adjusted under 35 U.S.C. 154(b) by 164 days.

(21) Appl. No.: 13/209,007

(22) Filed: Aug. 12, 2011

(65) Prior Publication Data

US 2012/0210041 A1    Aug. 16, 2012

Related U.S. Application Data

(63) Continuation-in-part of application No. 11/952,123, filed on Dec. 6, 2007, now Pat. No. 8,019,938, and a continuation-in-part of application No. 12/877,971, filed on Sep. 8, 2010, and a continuation-in-part of application No. 12/879,004, filed on Sep. 9, 2010.

(60) Provisional application No. 61/373,271, filed on Aug. 12, 2010.

(51) Int. Cl.
*G06F 12/00* (2006.01)

(52) U.S. Cl.
USPC ............... 711/128; 711/3; 711/103; 711/118; 711/170; 711/202

(58) Field of Classification Search
None
See application file for complete search history.

(56) References Cited

U.S. PATENT DOCUMENTS

| | | | |
|---|---|---|---|
| 4,571,674 A | 2/1986 | Hartung | |
| 4,980,861 A | 12/1990 | Herdt et al. | |
| 5,151,905 A | 9/1992 | Yokono et al. | |
| 5,261,068 A | 11/1993 | Gaskins et al. | |
| 5,291,496 A | 3/1994 | Andaleon et al. | |
| 5,307,497 A | 4/1994 | Feigenbaum et al. | |
| 5,313,475 A | 5/1994 | Cromer et al. | |
| 5,325,509 A | 6/1994 | Lautzenheiser | |
| 5,381,528 A | 1/1995 | Brunelle | |
| 5,392,427 A | 2/1995 | Barrett et al. | |

(Continued)

FOREIGN PATENT DOCUMENTS

| | | |
|---|---|---|
| EP | 1100001 | 5/2001 |
| EP | 1418502 | 5/2004 |

(Continued)

OTHER PUBLICATIONS

Wu, Michael, "eNVy: A Non-Volatile, Main Memory Storage System", Rice University, 1994, pp. 86-97, San Jose, California, US.

(Continued)

*Primary Examiner* — Shawn X Gu
(74) *Attorney, Agent, or Firm* — Kunzler Law Group, PC

(57) ABSTRACT

An apparatus, system, and method are disclosed for caching data. A storage request module detects an input/output ("I/O") request for a storage device cached by solid-state storage media of a cache. A direct mapping module references a single mapping structure to determine that the cache comprises data of the I/O request. The single mapping structure maps each logical block address of the storage device directly to a logical block address of the cache. The single mapping structure maintains a fully associative relationship between logical block addresses of the storage device and physical storage addresses on the solid-state storage media. A cache fulfillment module satisfies the I/O request using the cache in response to the direct mapping module determining that the cache comprises at least one data block of the I/O request.

20 Claims, 13 Drawing Sheets

U.S. PATENT DOCUMENTS

| | | |
|---|---|---|
| 5,404,485 A | 4/1995 | Ban |
| 5,438,671 A | 8/1995 | Miles |
| 5,469,555 A | 11/1995 | Ghosh et al. |
| 5,499,354 A | 3/1996 | Aschoff et al. |
| 5,504,882 A | 4/1996 | Chai et al. |
| 5,551,003 A | 8/1996 | Mattson et al. |
| 5,559,988 A | 9/1996 | Durante et al. |
| 5,586,291 A | 12/1996 | Lasker et al. |
| 5,594,883 A | 1/1997 | Pricer |
| 5,596,736 A | 1/1997 | Kerns |
| 5,603,001 A | 2/1997 | Sukegawa et al. |
| 5,680,579 A | 10/1997 | Young et al. |
| 5,701,434 A | 12/1997 | Nakagawa |
| 5,734,861 A | 3/1998 | Cohn et al. |
| 5,745,671 A | 4/1998 | Hodges |
| 5,745,792 A | 4/1998 | Jost |
| 5,754,563 A | 5/1998 | White |
| 5,787,486 A | 7/1998 | Chin et al. |
| 5,797,022 A | 8/1998 | Shimotono et al. |
| 5,798,968 A | 8/1998 | Lee et al. |
| 5,809,527 A | 9/1998 | Cooper et al. |
| 5,809,543 A | 9/1998 | Byers et al. |
| 5,822,759 A | 10/1998 | Treynor |
| 5,835,935 A | 11/1998 | Estakhri et al. |
| 5,845,313 A | 12/1998 | Estakhri et al. |
| 5,845,329 A | 12/1998 | Onishi et al. |
| 5,860,083 A | 1/1999 | Sukegawa |
| 5,890,192 A | 3/1999 | Lee et al. |
| 5,893,138 A | 4/1999 | Judd et al. |
| 5,907,856 A | 5/1999 | Estakhri et al. |
| 5,924,113 A | 7/1999 | Estakhri et al. |
| 5,930,815 A | 7/1999 | Estakhri et al. |
| 5,960,462 A | 9/1999 | Solomon et al. |
| 5,961,660 A | 10/1999 | Capps, Jr. et al. |
| 5,969,986 A | 10/1999 | Wong et al. |
| 6,000,019 A | 12/1999 | Dykstal et al. |
| 6,061,511 A | 5/2000 | Marantz et al. |
| 6,073,232 A | 6/2000 | Kroeker et al. |
| 6,101,601 A | 8/2000 | Matthews et al. |
| 6,105,076 A | 8/2000 | Beardsley et al. |
| 6,128,695 A | 10/2000 | Estakhri et al. |
| 6,141,249 A | 10/2000 | Estakhri et al. |
| 6,145,051 A | 11/2000 | Estakhri et al. |
| 6,170,039 B1 | 1/2001 | Kishida |
| 6,170,047 B1 | 1/2001 | Dye |
| 6,172,906 B1 | 1/2001 | Estakhri et al. |
| 6,173,381 B1 | 1/2001 | Dye |
| 6,185,654 B1 | 2/2001 | Van Doren |
| 6,209,088 B1 | 3/2001 | Reneris |
| 6,223,308 B1 | 4/2001 | Estakhri et al. |
| 6,230,234 B1 | 5/2001 | Estakhri et al. |
| 6,240,040 B1 | 5/2001 | Akaogi et al. |
| 6,278,633 B1 | 8/2001 | Wong et al. |
| 6,279,069 B1 | 8/2001 | Robinson et al. |
| 6,289,413 B1 | 9/2001 | Rogers et al. |
| 6,330,688 B1 | 12/2001 | Brown |
| 6,334,173 B1 | 12/2001 | Won et al. |
| 6,356,986 B1 | 3/2002 | Solomon et al. |
| 6,370,631 B1 | 4/2002 | Dye |
| 6,385,710 B1 | 5/2002 | Goldman et al. |
| 6,393,513 B2 | 5/2002 | Estakhri et al. |
| 6,404,647 B1 | 6/2002 | Minne |
| 6,412,030 B1 | 6/2002 | Adusumilli |
| 6,412,080 B1 | 6/2002 | Fleming et al. |
| 6,418,478 B1 | 7/2002 | Ignatius et al. |
| 6,418,509 B1 | 7/2002 | Yanai et al. |
| 6,424,872 B1 | 7/2002 | Glanzer et al. |
| 6,467,022 B1 | 10/2002 | Buckland et al. |
| 6,477,617 B1 | 11/2002 | Golding |
| 6,515,928 B2 | 2/2003 | Sato et al. |
| 6,516,380 B2 | 2/2003 | Kenchammana-Hoskote et al. |
| 6,519,185 B2 | 2/2003 | Harari et al. |
| 6,523,102 B1 | 2/2003 | Dye et al. |
| 6,532,527 B2 | 3/2003 | Selkirk et al. |
| 6,552,955 B1 | 4/2003 | Miki |
| 6,567,889 B1 | 5/2003 | DeKoning et al. |
| 6,587,915 B1 | 7/2003 | Kim |
| 6,601,211 B1 | 7/2003 | Norman |
| 6,608,793 B2 | 8/2003 | Park et al. |
| 6,625,685 B1 | 9/2003 | Cho et al. |
| 6,633,956 B1 | 10/2003 | Mitani |
| 6,671,757 B1 | 12/2003 | Multer et al. |
| 6,675,349 B1 | 1/2004 | Chen |
| 6,710,901 B2 | 3/2004 | Pastor |
| 6,715,046 B1 | 3/2004 | Shoham et al. |
| 6,728,851 B1 | 4/2004 | Estakhri et al. |
| 6,735,546 B2 | 5/2004 | Scheuerlein |
| 6,745,292 B1 | 6/2004 | Stevens |
| 6,751,155 B2 | 6/2004 | Gorobets |
| 6,754,774 B2 | 6/2004 | Gruner et al. |
| 6,754,800 B2 | 6/2004 | Wong et al. |
| 6,757,800 B1 | 6/2004 | Estakhri et al. |
| 6,760,806 B2 | 7/2004 | Jeon |
| 6,775,185 B2 | 8/2004 | Fujisawa et al. |
| 6,779,088 B1 | 8/2004 | Benveniste et al. |
| 6,779,094 B2 | 8/2004 | Selkirk et al. |
| 6,785,776 B2 | 8/2004 | Arimilli et al. |
| 6,785,785 B2 | 8/2004 | Piccirillo et al. |
| 6,801,979 B1 | 10/2004 | Estakhri |
| 6,804,755 B2 | 10/2004 | Selkirk et al. |
| 6,816,917 B2 | 11/2004 | Dicorpo et al. |
| 6,839,819 B2 | 1/2005 | Martin |
| 6,845,053 B2 | 1/2005 | Chevalier |
| 6,845,428 B1 | 1/2005 | Kedem |
| 6,871,257 B2 | 3/2005 | Conley et al. |
| 6,877,076 B1 | 4/2005 | Cho et al. |
| 6,880,049 B2 | 4/2005 | Gruner et al. |
| 6,883,068 B2 | 4/2005 | Tsirigotis et al. |
| 6,883,069 B2 | 4/2005 | Yoshida |
| 6,883,079 B1 | 4/2005 | Priborsky |
| 6,910,170 B2 | 6/2005 | Choi et al. |
| 6,912,537 B2 | 6/2005 | Selkirk et al. |
| 6,912,618 B2 | 6/2005 | Estakhri et al. |
| 6,922,754 B2 | 7/2005 | Liu et al. |
| 6,928,505 B1 | 8/2005 | Klingman |
| 6,938,133 B2 | 8/2005 | Johnson et al. |
| 6,977,599 B2 | 12/2005 | Widmer |
| 6,978,342 B1 | 12/2005 | Estakhri et al. |
| 6,981,070 B1 | 12/2005 | Luk et al. |
| 6,996,676 B2 | 2/2006 | Megiddo et al. |
| 7,010,652 B2 | 3/2006 | Piccirillo et al. |
| 7,010,662 B2 | 3/2006 | Aasheim et al. |
| 7,010,663 B2 | 3/2006 | George et al. |
| 7,013,376 B2 | 3/2006 | Hooper, III |
| 7,013,379 B1 | 3/2006 | Testardi |
| 7,043,599 B1 | 5/2006 | Ware et al. |
| 7,047,366 B1 | 5/2006 | Ezra |
| 7,050,337 B2 | 5/2006 | Iwase et al. |
| 7,057,936 B2 | 6/2006 | Yaegashi et al. |
| 7,058,769 B1 | 6/2006 | Danilak |
| 7,069,380 B2 | 6/2006 | Ogawa et al. |
| 7,076,723 B2 | 7/2006 | Saliba |
| 7,082,495 B2 | 7/2006 | DeWhitt et al. |
| 7,082,512 B2 | 7/2006 | Aasheim et al. |
| 7,085,879 B2 | 8/2006 | Aasheim et al. |
| 7,089,391 B2 | 8/2006 | Geiger et al. |
| 7,093,101 B2 | 8/2006 | Aasheim et al. |
| 7,096,321 B2 | 8/2006 | Modha |
| 7,111,140 B2 | 9/2006 | Estakhri et al. |
| 7,130,956 B2 | 10/2006 | Rao |
| 7,130,957 B2 | 10/2006 | Rao |
| 7,130,960 B1 | 10/2006 | Kano |
| 7,143,228 B2 | 11/2006 | Lida et al. |
| 7,149,947 B1 | 12/2006 | MacLellan et al. |
| 7,162,571 B2 | 1/2007 | Kilian et al. |
| 7,167,944 B1 | 1/2007 | Estakhri |
| 7,167,953 B2 | 1/2007 | Megiddo et al. |
| 7,177,197 B2 | 2/2007 | Cernea |
| 7,178,081 B2 | 2/2007 | Lee et al. |
| 7,181,572 B2 | 2/2007 | Walmsley |
| 7,194,577 B2 | 3/2007 | Johnson et al. |
| 7,197,567 B1 | 3/2007 | Fitzgerald |
| 7,203,815 B2 | 4/2007 | Haswell |
| 7,215,580 B2 | 5/2007 | Gorobets |
| 7,219,197 B2 | 5/2007 | Hatakeyama |
| 7,219,238 B2 | 5/2007 | Saito et al. |
| 7,227,777 B2 | 6/2007 | Roohparvar |

| | | |
|---|---|---|
| 7,234,082 B2 | 6/2007 | Lai et al. |
| 7,237,141 B2 | 6/2007 | Fredin |
| 7,243,203 B2 | 7/2007 | Scheuerlein |
| 7,246,179 B2 | 7/2007 | Camara et al. |
| 7,248,691 B1 | 7/2007 | Pandit et al. |
| 7,257,129 B2 | 8/2007 | Lee et al. |
| 7,263,591 B2 | 8/2007 | Estakhri et al. |
| 7,280,536 B2 | 10/2007 | Testardi |
| 7,305,520 B2 | 12/2007 | Voigt et al. |
| 7,328,307 B2 | 2/2008 | Hoogterp |
| 7,337,201 B1 | 2/2008 | Yellin et al. |
| 7,340,558 B2 | 3/2008 | Lee et al. |
| 7,340,566 B2 | 3/2008 | Voth et al. |
| 7,340,581 B2 | 3/2008 | Gorobets et al. |
| 7,356,651 B2 | 4/2008 | Liu et al. |
| 7,360,015 B2 | 4/2008 | Matthews et al. |
| 7,360,037 B2 | 4/2008 | Higaki et al. |
| 7,366,808 B2 | 4/2008 | Kano et al. |
| 7,370,163 B2 | 5/2008 | Yang et al. |
| 7,392,365 B2 | 6/2008 | Selkirk et al. |
| 7,424,593 B2 | 9/2008 | Estakhri et al. |
| 7,437,510 B2 | 10/2008 | Rosenbluth et al. |
| 7,441,067 B2 | 10/2008 | Gorobets et al. |
| 7,441,081 B2 | 10/2008 | Humlicek |
| 7,441,090 B2 | 10/2008 | Estakhri et al. |
| 7,447,847 B2 | 11/2008 | Louie et al. |
| 7,450,420 B2 | 11/2008 | Sinclair et al. |
| 7,460,432 B2 | 12/2008 | Warner |
| 7,463,521 B2 | 12/2008 | Li |
| 7,480,766 B2 | 1/2009 | Gorobets |
| 7,487,235 B2 | 2/2009 | Andrews et al. |
| 7,487,320 B2 | 2/2009 | Bansal et al. |
| 7,500,000 B2 | 3/2009 | Groves et al. |
| 7,523,249 B1 | 4/2009 | Estakhri et al. |
| 7,523,546 B2 | 4/2009 | Vatanparast et al. |
| 7,529,905 B2 | 5/2009 | Sinclair |
| 7,536,491 B2 | 5/2009 | Kano et al. |
| 7,549,013 B2 | 6/2009 | Estakhri et al. |
| 7,552,271 B2 | 6/2009 | Sinclair |
| 7,565,569 B2 | 7/2009 | Zohar et al. |
| 7,580,287 B2 | 8/2009 | Aritome |
| 7,631,138 B2 | 12/2009 | Gonzalez et al. |
| 7,640,390 B2 | 12/2009 | Iwamura et al. |
| 7,644,239 B2 | 1/2010 | Ergan et al. |
| 7,660,911 B2 | 2/2010 | McDaniel |
| 7,689,803 B2 | 3/2010 | Karr et al. |
| 7,725,628 B1 | 5/2010 | Phan et al. |
| 7,725,661 B2 | 5/2010 | Liu et al. |
| 7,856,528 B1 | 12/2010 | Frost et al. |
| 7,873,782 B2 | 1/2011 | Terry |
| 7,873,803 B2 | 1/2011 | Cheng |
| 7,908,501 B2 | 3/2011 | Kim et al. |
| 7,944,762 B2 | 5/2011 | Gorobets |
| 8,019,938 B2 | 9/2011 | Flynn et al. |
| 2002/0069317 A1 | 6/2002 | Chow et al. |
| 2002/0069318 A1 | 6/2002 | Chow et al. |
| 2002/0194451 A1 | 12/2002 | Mukaida et al. |
| 2003/0061296 A1 | 3/2003 | Craddock et al. |
| 2003/0070034 A1 | 4/2003 | Friedman et al. |
| 2003/0093741 A1 | 5/2003 | Argon et al. |
| 2003/0131182 A1 | 7/2003 | Kumar et al. |
| 2003/0163630 A1 | 8/2003 | Aasheim et al. |
| 2003/0163633 A1 | 8/2003 | Aasheim |
| 2003/0165076 A1 | 9/2003 | Gorobets et al. |
| 2003/0198084 A1 | 10/2003 | Fujisawa et al. |
| 2004/0059870 A1 | 3/2004 | Ash et al. |
| 2004/0093463 A1 | 5/2004 | Shang |
| 2004/0103245 A1 | 5/2004 | Fukusawa et al. |
| 2004/0186946 A1 | 9/2004 | Lee |
| 2004/0268359 A1 | 12/2004 | Hanes |
| 2005/0002263 A1 | 1/2005 | Iwase et al. |
| 2005/0015539 A1 | 1/2005 | Horii et al. |
| 2005/0027951 A1 | 2/2005 | Piccirillo et al. |
| 2005/0055497 A1 | 3/2005 | Estakhri et al. |
| 2005/0076107 A1 | 4/2005 | Goud et al. |
| 2005/0080994 A1 | 4/2005 | Cohen et al. |
| 2005/0132148 A1 | 6/2005 | Arimilli et al. |
| 2005/0132259 A1 | 6/2005 | Emmot et al. |
| 2005/0144361 A1 | 6/2005 | Gonzalez et al. |
| 2005/0149618 A1 | 7/2005 | Cheng |
| 2005/0149819 A1 | 7/2005 | Hwang |
| 2005/0177672 A1 | 8/2005 | Rao |
| 2005/0177687 A1 | 8/2005 | Rao |
| 2005/0193166 A1 | 9/2005 | Johnson et al. |
| 2005/0229090 A1 | 10/2005 | Shen et al. |
| 2005/0235132 A1 | 10/2005 | Karr et al. |
| 2005/0240713 A1 | 10/2005 | Wu |
| 2005/0246510 A1 | 11/2005 | Retnamma et al. |
| 2005/0257213 A1 | 11/2005 | Chu et al. |
| 2005/0276092 A1 | 12/2005 | Hansen et al. |
| 2006/0004955 A1 | 1/2006 | Ware |
| 2006/0026339 A1 | 2/2006 | Rostampour |
| 2006/0075057 A1 | 4/2006 | Gildea et al. |
| 2006/0090048 A1 | 4/2006 | Okumoto et al. |
| 2006/0106968 A1 | 5/2006 | Wooi Teoh |
| 2006/0106990 A1 | 5/2006 | Benhase et al. |
| 2006/0107097 A1 | 5/2006 | Zohar et al. |
| 2006/0143396 A1 | 6/2006 | Cabot |
| 2006/0152981 A1 | 7/2006 | Ryu |
| 2006/0184736 A1 | 8/2006 | Benhase et al. |
| 2006/0224849 A1 | 10/2006 | Islam et al. |
| 2006/0230295 A1 | 10/2006 | Schumacher et al. |
| 2006/0248387 A1 | 11/2006 | Nicholson et al. |
| 2006/0265624 A1 | 11/2006 | Moshayedi |
| 2007/0016699 A1 | 1/2007 | Minami et al. |
| 2007/0028053 A1 | 2/2007 | Shet et al. |
| 2007/0033376 A1 | 2/2007 | Sinclair et al. |
| 2007/0050571 A1 | 3/2007 | Nakamura |
| 2007/0061515 A1 | 3/2007 | Kano |
| 2007/0073975 A1 | 3/2007 | Lee et al. |
| 2007/0074092 A1 | 3/2007 | Dammann et al. |
| 2007/0118676 A1 | 5/2007 | Kano et al. |
| 2007/0124474 A1 | 5/2007 | Margulis |
| 2007/0124540 A1 | 5/2007 | Van Riel et al. |
| 2007/0150689 A1 | 6/2007 | Pandit et al. |
| 2007/0162830 A1 | 7/2007 | Stek et al. |
| 2007/0168698 A1 | 7/2007 | Coulson et al. |
| 2007/0198770 A1 | 8/2007 | Horii et al. |
| 2007/0204128 A1 | 8/2007 | Lee et al. |
| 2007/0204197 A1 | 8/2007 | Yokokawa |
| 2007/0204199 A1 | 8/2007 | Chung et al. |
| 2007/0230253 A1 | 10/2007 | Kim |
| 2007/0233455 A1 | 10/2007 | Zimmer et al. |
| 2007/0233937 A1 | 10/2007 | Coulson et al. |
| 2007/0233938 A1 | 10/2007 | Cho et al. |
| 2007/0234021 A1 | 10/2007 | Ruberg et al. |
| 2007/0245094 A1 | 10/2007 | Lee et al. |
| 2007/0245217 A1 | 10/2007 | Valle |
| 2007/0250660 A1 | 10/2007 | Gill et al. |
| 2007/0271468 A1 | 11/2007 | McKenney et al. |
| 2007/0271572 A1 | 11/2007 | Gupta et al. |
| 2007/0274150 A1 | 11/2007 | Gorobets |
| 2007/0276897 A1 | 11/2007 | Tameshige et al. |
| 2007/0300008 A1 | 12/2007 | Rogers et al. |
| 2008/0005465 A1 | 1/2008 | Matthews |
| 2008/0005748 A1 | 1/2008 | Mathew |
| 2008/0010395 A1 | 1/2008 | Mylly et al. |
| 2008/0016301 A1 | 1/2008 | Chen |
| 2008/0022187 A1 | 1/2008 | Bains |
| 2008/0034153 A1 | 2/2008 | Lee et al. |
| 2008/0043769 A1 | 2/2008 | Hirai |
| 2008/0052483 A1 | 2/2008 | Rangarajan et al. |
| 2008/0059752 A1 | 3/2008 | Serizawa |
| 2008/0059820 A1 | 3/2008 | Vaden et al. |
| 2008/0080243 A1 | 4/2008 | Edahiro et al. |
| 2008/0091876 A1 | 4/2008 | Fujibayashi et al. |
| 2008/0098159 A1 | 4/2008 | Song et al. |
| 2008/0104344 A1 | 5/2008 | Shimozono et al. |
| 2008/0117686 A1 | 5/2008 | Yamada |
| 2008/0120303 A1 | 5/2008 | Selkirk et al. |
| 2008/0120469 A1 | 5/2008 | Komegay |
| 2008/0123211 A1 | 5/2008 | Chng et al. |
| 2008/0126700 A1 | 5/2008 | El-Batal et al. |
| 2008/0126852 A1 | 5/2008 | Brandyberry et al. |
| 2008/0133963 A1 | 6/2008 | Katano et al. |
| 2008/0137658 A1 | 6/2008 | Wang |
| 2008/0140819 A1 | 6/2008 | Bailey et al. |
| 2008/0141043 A1 | 6/2008 | Flynn |

| | | | |
|---|---|---|---|
| 2008/0183965 | A1 | 7/2008 | Shiga et al. |
| 2008/0183968 | A1 | 7/2008 | Huang |
| 2008/0195801 | A1 | 8/2008 | Cheon |
| 2008/0201535 | A1 | 8/2008 | Hara |
| 2008/0205286 | A1 | 8/2008 | Li et al. |
| 2008/0209090 | A1 | 8/2008 | Kano et al. |
| 2008/0229046 | A1 | 9/2008 | Raciborski |
| 2008/0235443 | A1 | 9/2008 | Chow et al. |
| 2008/0266973 | A1 | 10/2008 | Sekar et al. |
| 2008/0276040 | A1 | 11/2008 | Moritoki |
| 2008/0294847 | A1 | 11/2008 | Maruyama et al. |
| 2008/0313364 | A1 | 12/2008 | Flynn |
| 2009/0043952 | A1 | 2/2009 | Estakhri et al. |
| 2009/0070541 | A1 | 3/2009 | Yochai |
| 2009/0083478 | A1 | 3/2009 | Kunimatsu et al. |
| 2009/0083485 | A1 | 3/2009 | Cheng |
| 2009/0089485 | A1 | 4/2009 | Yeh |
| 2009/0089518 | A1 | 4/2009 | Hobbet |
| 2009/0091996 | A1 | 4/2009 | Chen et al. |
| 2009/0125650 | A1 | 5/2009 | Sebire |
| 2009/0144496 | A1 | 6/2009 | Kawaguchi |
| 2009/0150605 | A1 | 6/2009 | Flynn et al. |
| 2009/0150621 | A1 | 6/2009 | Lee |
| 2009/0150641 | A1 | 6/2009 | Flynn et al. |
| 2009/0157956 | A1 | 6/2009 | Kano |
| 2009/0172250 | A1 | 7/2009 | Allen et al. |
| 2009/0204750 | A1 | 8/2009 | Estakhri et al. |
| 2009/0216944 | A1 | 8/2009 | Gill et al. |
| 2009/0228637 | A1 | 9/2009 | Moon et al. |
| 2009/0235017 | A1 | 9/2009 | Estakhri et al. |
| 2009/0276654 | A1 | 11/2009 | Butterworth et al. |
| 2009/0300277 | A1 | 12/2009 | Jeddeloh |
| 2009/0313453 | A1 | 12/2009 | Stefanus et al. |
| 2009/0327602 | A1 | 12/2009 | Moore et al. |
| 2009/0327804 | A1 | 12/2009 | Moshayedi |
| 2010/0017556 | A1 | 1/2010 | Chin et al. |
| 2010/0023674 | A1 | 1/2010 | Aviles |
| 2010/0023676 | A1 | 1/2010 | Moon et al. |
| 2010/0023682 | A1 | 1/2010 | Lee et al. |
| 2010/0030946 | A1 | 2/2010 | Kano et al. |
| 2010/0077194 | A1 | 3/2010 | Zhao |
| 2010/0091535 | A1 | 4/2010 | Sommer et al. |
| 2010/0102999 | A1 | 4/2010 | Lee et al. |
| 2010/0106917 | A1 | 4/2010 | Ruberg et al. |
| 2010/0174870 | A1 | 7/2010 | Banerjee |
| 2010/0205368 | A1 | 8/2010 | Gregg et al. |
| 2011/0016260 | A1 | 1/2011 | Lomelino et al. |
| 2011/0047437 | A1 | 2/2011 | Flynn |
| 2011/0182119 | A1 | 7/2011 | Strasser et al. |
| 2011/0258391 | A1 | 10/2011 | Atkisson et al. |
| 2011/0258512 | A1 | 10/2011 | Flynn et al. |

FOREIGN PATENT DOCUMENTS

| | | |
|---|---|---|
| EP | 1814039 | 8/2007 |
| GB | 0123416.0 | 9/2001 |
| JP | 04242848 | 8/1992 |
| JP | 08153014 | 11/1996 |
| JP | 2000259525 | 9/2000 |
| JP | 2009122850 | 6/2009 |
| KR | 1020100022811 | 3/2010 |
| WO | 9419746 | 9/1994 |
| WO | 9518407 | 7/1995 |
| WO | 9612225 | 4/1996 |
| WO | 0131512 | 5/2001 |
| WO | 0201365 | 1/2002 |
| WO | 2008070173 | 6/2008 |
| WO | 2008070796 | 6/2008 |
| WO | 2008073421 | 6/2008 |
| WO | 2010036757 | 4/2010 |

OTHER PUBLICATIONS

Yerrick, Damian, "Block Device", downloaded Mar. 1, 2010, pp. 3, http://www.pineight.com/ds/block/.
Application No. PCT/US11/46005, International Search Report and Written Opinion, Apr. 6, 2012.
Application No. 11952123, Notice of Allowance, May 5, 2011.
"DataDirect Storaage Systems Selected for NCSA Cluster", HPCWire, Aug. 15, 2003, pp. 2, vol. 12, No. 32, http://www.hpcwire.com/hpcwire/hpcwireWWW/03/0815/105731.html.
"Introducing Box Hill's Fibre Box", Box Hill Systems Corporation, Jan. 16, 1997, p. 5.
"jZip A Free WinZip Alternative", First JZip by Greg Kowal, 2012.
Application No. PCT/US2012/022244, International Search Report and Written Opinion, Jul. 30, 2012.
Makulowich, John, "Strategies, Players and Emerging Markets", Washington Technology, Jun. 26, 1997, pp. 6, http://washingtontechnology.com/Articles/1997/06/26/Strategies-Players-and-Emerging-Ma....
Application No. PCT/US2011/047659, International Search Report and Written Opinion, Apr. 9, 2012.
Application No. 11952123, Office Action, May 5, 2010.
Application No. 11952123, Final Office Action, Oct. 5, 2010.
"Hystor: Making SSDs the 'Survival of the Fittest' in High-Performance Storage Systems", Feb. 2010, pp. 14.
U.S. Appl. No. 11/952,091, Office Action, Feb. 7, 2012.
Benjauthrit, Boonsieng, "An Overview of Error Control Codes for Data Storage", DATATAPE Incorporated, 1996, pp. 7, International NonVolatile Memory Technology Conference, 0-7803-3510-4/96.
U.S. Appl. No. 11/952,091, Notice of Allowance, Jun. 28, 2012.
Application No. 200780050974.9, Office Action, Jul. 27, 2011.
Application No. 200780050974.9, Office Action, May 23, 2012.
Application No. PCT/US2007/086683, International Search Report and Written Opinion, Oct. 26, 2009.
Application No. PCT/US2007/086683, International Preliminary Report on Patentability, Nov. 5, 2009.
U.S. Appl. No. 13/600,077, Office Action, Jan. 7, 2013.
Whyte, Barry, "IBM SAN Volume Controller 4.2.1 Cache Partitioning", IBM Corp., 2008, pp. 12, Redpaper.
Megiddo, Nimrod, "ARC: A Self-Tuning, Low Overhead Replacement Cache", USENIX Association, Mar. 31-Apr. 2, 2003, pp. 17, Proceedings of FAST '03: 2nd USENIX Conference on File and Storage Technologies, San Francisco, California, US.
U.S. Appl. No. 12/885,285, Notice of Allowance, Feb. 4, 2013.
Application No. PCT/US2010/048321, International Search Report and Written Opinion, Apr. 28, 2011.
U.S. Appl. No. 12/885,285, Notice of Allowance, Oct. 17, 2012.
Application No. PCT/US2012/023373, International Search Report and Written Opinion, Jul. 30, 2012.
U.S. Appl. No. 12/098,427, Office Action, Aug. 5, 2011.
U.S. Appl. No. 12/098,427, Notice of Allowance, Sep. 27, 2012.
U.S. Appl. No. 12/098,427, Office Action, Jun. 19, 2012.
"High Speed, Elevated Board Stacking", Samtec, 2007, p. 1.
U.S. Appl. No. 12/981,394, Notice of Allowance, Feb. 6, 2012.
Application No. PCT/US2009/039572, International Search Report and Written Opinion, Jul. 30, 2009.
Application No. PCT/US2009/039572, International Preliminary Report on Patentability, Oct. 14, 2010.
Application No. PCT/US2007/086686, International Search Report and Written Opinion, Apr. 28, 2008.
Application No. PCT/US2007/086686, International Preliminary Report on Patentability, Dec. 16, 2008.
"Design and Use Considerations for NAND Flash Memory", Micron Technical Note, 2006, pp. 8, TN-29-17: NAND Flash Design and Use Considerations.
"Hamming Codes for NAND Flash Memory Devices", Micron Technical Note, 2005, pp. 7, TN-29-08: Hamming Codes for NAND Flash Memory Devices.
"The Advantages of Object-Based Storage—Secure, Scalable, Dynamic Storage Devices", Seagate Research, Apr. 2005, pp. 7, TP-536.
Wacha, Rosie, "Improving RAID-Based Storage Systems with Flash Memory", First Annual ISSDM/SRL Research Symposium, Oct. 20-21, 2009, pp. 21.
Wang, Feng, "OBFS: A File System for Object-based Storage Devices", 21st IEEE/12th NASA Goddard Conference on Mass Storage Systems and Technologies (MSST2004), Apr. 2004, pp. 18, College Park, Maryland, US.
"Windows PC Accelerators", Nov. 30, 2006, pp. 1-16, XP002476842, URL:http://download.microsoft.com/download/9/c/5/9c5b2167-8017-4bae-9fde-d599bac8184a/perfaccel.doc.

Volos, Haris, "Mnemosyne: Lightweight Persistent Memory", ASPLOS'11, Mar. 5-11, 2011, pp. 13, Newport Beach, California, US.

Brandon, Jr., Daniel, "Sparse Matrices in CS Education", Consortium for Computing Sciences in Colleges, May 2009, pp. 93-98.

Application No. 200780050973.4, First Office Action, Jan. 26, 2011.

Application No. 07867661.6, Office Action, Oct. 6, 2011.

Application No. PCT/US2007/025049, International Preliminary Report on Patentability, Mar. 11, 2009.

Application No. PCT/US2007/025049, International Search Report and Written Opinion, May 14, 2008.

Am29DL322D/323D/324D, Data Sheet, Spansion, XP-002476181, Oct. 7, 2004, Publication No. 21534, Revision D. Amendment #7.

Ari, Ismail, "Performance Boosting and Workload Isolation in Storage Area Networks with SANCache", Proceedings of the 23rd IEEE/14th NASA Goddard Conference on Mass Storage Systems and Technologies, May 2006, pp. 263-273, College Park, Maryland, US.

"ASPMC-660 Rugged IDE Flash Disk PMC Module", Asine, downloaded Nov. 18, 2009, pp. 3, http://www.asinegroup.com/products/aspmc660html.

Bandulet, Christian, "Object-Based Storage Devices", Sun Developer Network, Jul. 2007, pp. 7, http://developers.xun/com/solaris/articles/osd.html.

"BiTMICRO Introduces E-Disk PMC Flash Disk Module", Military and Aerospace Electronics East, 2004, pp. 2, http://www.bitmicro.com/press_news_releases?20040518/prt.php.

Bulletproof Memory for RAID Servers, Part 1-3, agigatech com., 2009, pp. 12, http://agigatech.com/blog/bulletproof-memory-for-raid-servers-part-1/.

Casey, Michael, "Solid State File-Caching for Performance and Scalability", Solidata, downloaded Jan. 5, 2011, pp. 5, http://www.storagesearch.com/3dram.html.

"S2A9550 Overview", White Paper, DataDirect Networks, 2007, pp. 17, Chatsworth, California, US.

"EMC Virtual Infrastructure for Microsoft Applications—Data Center Solution Enabled by EMC Symmetrix V-Max and VMware ESC 3.5", White Paper, EMC, Apr. 2009, pp. 30.

Feresten, Paul, "NETAPP Thin Provisioning: Better for Business", NETAPP White Paper, Network Appliance, Inc., Mar. 2007, WP-7017-0307, pp. 11.

"File System Primer", CoolSolutionsWiki, downloaded Oct. 18, 2006, pp. 5, http://wiki.novell.com/index.php/File_System_Primer.

Van Hensbergen, Eric, "Dynamic Policy Disk Caching for Storage Networking", IBM Research Report, Nov. 28, 2006, pp. 13, RC24123 (W0611-189).

"How NTFS Works", Updated Mar. 28, 2003, pp. 34, http://technet.microsoft.com/en-us/library/cc781134(WS.10).aspx.

Dan, Raz, "Implementing MLC NAND Flash for Cost-Effective, High-Capacity Memory", White Paper M-Systems, Sep. 2003, pp. 13, 92-SR-014-02-8L, Rev. 1.1, Newark, California, US.

Weber, Ralph O., "Information Technology-SCSI Object-Based Storage Device Commands (OSD)", Seagate Technology, Jul. 30, 2004, pp. 171, Project T10/1355-D, Revision 10, Reference No. ISO/IEC 14776-391 : 200x ANSI INCITS.***:200x.

"Intel Turbo Memory with User Pinning", Intel NAND Storage Solutions, 2008, pp. 4, www.intel.com/go/nand.

"Introduction to Samsung's Linux Flash File System—RFS", Samsung Electronics Application Note, Nov. 2006, Version 1.0, pp. 6.

"ioDrive—Frequently Asked Questions", Clustered Storage Solutions: Products, downloaded Feb. 16, 2010, pp. 2, http://www.clusteredstorage.com/clustered_storage_solutions.html.

Johnson, Michael K., "An Introduction to Block Device Drivers", Jan. 1, 1995, pp. 6.

Leventhal, Adam, "Flash Storage Memory", Communications of the ACM, Jul. 2008, pp. 47-51, vol. 51, No. 7.

"Method for Fault Tolerance in Nonvolatile Storage", ip.com PriorArtDatabase Technical Disclosure, Feb. 3, 2005, pp. 6, IPCOM000042269D, www.ip.com.

IBM, "Method to Improve Reliability of SSD Arrays", ip.com PriorArtDatabase Technical Disclosure, Nov. 5, 2009, pp. 6, IPCOM000189338D, www.ip.com.

Morgenstern, David, "Is There a Flash Memory RAID in Your Future?" Ziff Davis Enterprise Holdings, Inc., Nov. 8, 2006, pp. 4, http://www.eweek.com.

"NAND Flash 101: An Introduction to NAND Flash and How to Design It in to Your Next Product", Micron Technical Note, Rev. A Nov. 2006, pp. 28, TN-29-19: NAND Flash 101.

Coburn, Joel, "NV-Heaps: Making Persistent Objects Fast and Safe with Next-Generation, Non-Volatile Memories", ASPLOS'II, Mar. 5-11, 2011, pp. 13, Newport Beach, California, US.

Mesnier, Mike, "Object-Based Storage", IEEE Communications Magazine, Aug. 2003, pp. 84-90.

"Pivot3 RAIGE Storage Cluster", White Paper Technology Overview, Jun. 2007, pp. 17, www.pivot3.com.

Rosenblum, Mendel, "The Design and Implementation of a Log-structured File System", 1992, pp. 101.

Casey, Michael, "San Cache: SSD in the SAN", Computer Technology Review's Storage Inc., Quarter 1, 2000, pp. 4, SolidData, Santa Clara, California, US.

"Hynix 48-GB Flash MCP", Slashdot, downloaded Nov. 4, 2010, pp. 17, http://hardware.slashdot.org/article.pl?sid=07/09/06/146218&from=rss.

"Sybase: Maximizing Performance through Solid State File-Caching", SolidData Systems Best Practices Guide, May 2000, pp. 4, Santa Clara, California, US.

Stokes, Jon, "Intel's New Flash Tech to Bring Back Turbo Memory, for Real", downloaded Apr. 23, 2012, pp. 2, http://arstechnica.com/hardware/news/2009/09intels-new-flash-tech-to-b....

Application No. PCT/US2012/026790, International Search Report and Written Opinion, Dec. 27, 2012.

Application No. PCT/US2011/047659, International Preliminary Report on Patentability, Feb. 21, 2013.

U.S. Appl. No. 11/952,123, Notice of Allowance, Jan. 19, 2011.

U.S. Appl. No. 11/952,123, Notice of Allowance, Apr. 8, 2011.

— -

APPARATUS, SYSTEM, AND METHOD FOR CACHING DATA

CROSS-REFERENCES TO RELATED APPLICATIONS

This application claims priority to U.S. Provisional Patent Application No. 61/373,271 entitled "APPARATUS, SYSTEM, AND METHOD FOR CACHING DATA" and filed on Aug. 12, 2010 for David Flynn, and is a continuation-in-part application of and claims priority to U.S. patent application Ser. No. 11/952,123 entitled "APPARATUS, SYSTEM, AND METHOD FOR SOLID-STATE STORAGE AS CACHE FOR HIGH-CAPACITY, NON-VOLATILE STORAGE" and filed on Dec. 6, 2007 for David Flynn, et al., to U.S. patent application Ser. No. 12/877,971 entitled "APPARATUS, SYSTEM, AND METHOD FOR CACHING DATA ON A SOLID-STATE STORAGE DEVICE" and filed on Sep. 8, 2010 for David Flynn, et al., and to U.S. patent application Ser. No. 12/879,004 entitled "APPARATUS, SYSTEM, AND METHOD FOR ALLOCATING STORAGE" and filed on Sep. 9, 2010 for Jonathan Thatcher, et al., each of which are incorporated herein by reference. U.S. patent application Ser. No. 11/952,123 claims priority to U.S. Provisional Patent Application No. 60/873,111 filed on Dec. 6, 2006, U.S. patent application Ser. No. 12/877,971 claims priority to U.S. Provisional Patent Application No. 61/240,573 filed on Sep. 8, 2009, and U.S. patent application Ser. No. 12/879,004 claims priority to U.S. Provisional Patent Application No. 61/240,966 filed on Sep. 9, 2009.

FIELD OF THE INVENTION

This invention relates to caching data and more particularly relates to caching data using solid-state storage media.

BACKGROUND

Description of the Related Art

Data storage caches are typically direct mapped, fully associative, or set associative. In direct mapped caches, each storage block of a backing store is directly mapped to a single cache block, but since a cache typically has a smaller capacity than an associated backing store, several storage blocks often share the same cache block, causing cache collisions. Direct mapped caches usually address a cache collision for a cache block by overwriting the cache block with the most recently accessed data.

In fully associative caches, storage blocks typically are not mapped to a specific cache block, but can be cached in any cache block. The processing overhead for locating cached data in a fully associative cache is typically greater than for a direct mapped cache, because a cache map, cache index, cache tags, or another separate cache translation layer is used to locate the cached data.

Set associative caches typically divide cache storage into sets, where each storage block of a backing store is mapped to a set and can be stored in any cache block in the set. Set associative caches typically have more cache collision issues than fully associative caches and more processing overhead for locating cached data than direct mapped caches.

SUMMARY

From the foregoing discussion, it should be apparent that a need exists for an apparatus, system, and method for efficiently caching data. Beneficially, such an apparatus, system, and method would minimize cache collisions and processing overhead for accessing cached data.

The present invention has been developed in response to the present state of the art, and in particular, in response to the problems and needs in the art that have not yet been fully solved by currently available data storage caches. Accordingly, the present invention has been developed to provide an apparatus, system, and method for caching data that overcome many or all of the above-discussed shortcomings in the art.

A method of the present invention is presented for caching data. The method in the disclosed embodiments substantially includes the steps necessary to carry out the functions presented below with respect to the operation of the described apparatus and system. In one embodiment, the method includes detecting an input/output ("I/O") request for a storage device cached by solid-state storage media of a cache. The method, in a further embodiment, may include referencing a single mapping structure to determine that the cache comprises data of the I/O request. In certain embodiments, the method includes satisfying the I/O request using the cache in response to determining that the cache comprises at least one data block of the I/O request.

In one embodiment, the single mapping structure maps each logical block address of the storage device directly to a logical block address of the cache. The single mapping structure, in a further embodiment, comprises or maintains a fully associative relationship between logical block addresses of the storage device and physical storage addresses on the solid-state storage media.

Satisfying the I/O request, in certain embodiments, comprises storing data of the I/O request to the cache sequentially on the solid-state storage media to preserve an ordered sequence of storage operations performed on the solid-state storage media at one or more logical block addresses of the cache. In another embodiment, satisfying the I/O request comprises reading data of the I/O request from the cache using a physical storage address of the solid-state storage media associated with a logical block address of the I/O request.

Storing data of the I/O request to the cache sequentially, in one embodiment, comprises appending the data of the I/O request to an append point of a sequential, log-based, cyclic writing structure of the solid-state storage media. The single mapping structure, in certain embodiments, is configured so that each logical block address of the storage device maps to a distinct unique entry in the single mapping structure and the unique entry maps to a distinct physical storage address on the solid-state storage media.

The method, in a further embodiment, includes storing data of the I/O request on the solid-state storage media in a format that associates the data with respective logical block addresses of the data. In one embodiment, the method includes associating sequence indicators with data of the I/O request on the solid-state storage media. The sequence indicators, in certain embodiments, record an ordered sequence of storage operations performed on the solid-state storage media.

In one embodiment, the method includes storing data of the I/O request in a format that associates the data with respective logical block addresses on the solid-state storage media. The method, in a further embodiment, includes maintaining an entry in the single mapping structure. The entry, in certain embodiments, comprises an association between logical block addresses of the data of the I/O request and physical storage locations comprising the data of the I/O request on the solid-state storage media. The method, in one embodiment, includes reconstructing the entry in the single mapping structure using the logical block addresses of the data and the sequence indicators associated with the data on the solid-state storage media.

In one embodiment, the single mapping structure includes a plurality of entries. Each entry, in a further embodiment, maps a variable length range of logical block addresses of the cache to a location on the solid-state storage media of the cache. The presence of an entry for a logical block address of the cache in the single mapping structure, in certain embodiments, indicates that the cache stores data associated with a corresponding logical block address of the storage device at a physical storage address on the solid-state storage media indicated by the entry.

In certain embodiments, the I/O request includes one or more sets of non-contiguous logical block address ranges for the storage device. The solid-state storage media, in one embodiment, is managed by a solid-state storage controller configured to mask differences in latency for storage operations performed on the solid-state storage media.

In one embodiment, the method includes performing one or more actions on the cache in response to detecting one or more predefined commands for the storage device. The one or more predefined commands, in various embodiments, may include a read command, a write command, a flush command, a pin command, an unpin command, a freeze command, and/or a thaw command. In a further embodiment, the method includes dynamically reducing a cache size for the cache in response to an age characteristic for storage media of the cache.

The single mapping structure, in one embodiment, maps each logical block address of the storage device directly to a logical block address of the cache. In certain embodiments, the single mapping structure uses an address of the I/O request directly to identify both an entry in the single mapping structure for a logical block address of the cache and to identify a logical block address of the storage device. In a further embodiment, a cache data block associated with a logical block address of the cache is equal in size to a storage device data block associated with a logical block address of the storage device.

An apparatus to cache data is provided with a plurality of modules configured to functionally execute the necessary steps of the method described above. These modules in the described embodiments include a storage request module, a direct mapping module, and a cache fulfillment module.

In one embodiment, the storage request module detects an I/O request for a storage device cached by solid-state storage media of a cache. The direct mapping module, in one embodiment, references a single mapping structure using an address of the I/O request to determine that the cache comprises data of the I/O request. The address of the I/O request, in certain embodiment, directly identifies both an entry in the single mapping structure and a logical block address of the storage device. In a further embodiment, the single mapping structure maintains a fully associative relationship between logical block addresses of the storage device and physical storage addresses on the solid-state storage media.

The cache fulfillment module, in one embodiment, satisfies the I/O request using the cache in response to the direct mapping module determining that the cache comprises at least one data block of the I/O request. In certain embodiments, the cache fulfillment module satisfies the I/O request by storing data of the I/O request to the cache sequentially on the solid-state storage media to preserve an ordered sequence of storage operations performed on the solid-state storage media at one or more logical block addresses of the cache. In another embodiment, the cache fulfillment module satisfies the I/O request by reading data of the I/O request from the cache using a physical storage address of the solid-state storage media associated with a logical block address of the I/O request.

A system of the present invention is also presented for caching data. The system may be embodied by a processor, a storage controller, and a cache controller. In particular, the system, in one embodiment, includes a host computer system comprising the processor and the storage controller and the cache controller each comprise a device driver executing on the processor of the host computer system.

The storage controller, in one embodiment, is for a non-volatile solid-state storage cache. The cache, in certain embodiments, is in communication with the processor over one or more communications buses. The cache controller, in a further embodiment, is in communication with the storage controller. In one embodiment, the cache controller comprises a storage request module, a direct mapping module, and a cache fulfillment module as described above with regard to the disclosed apparatus.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Figure 1:
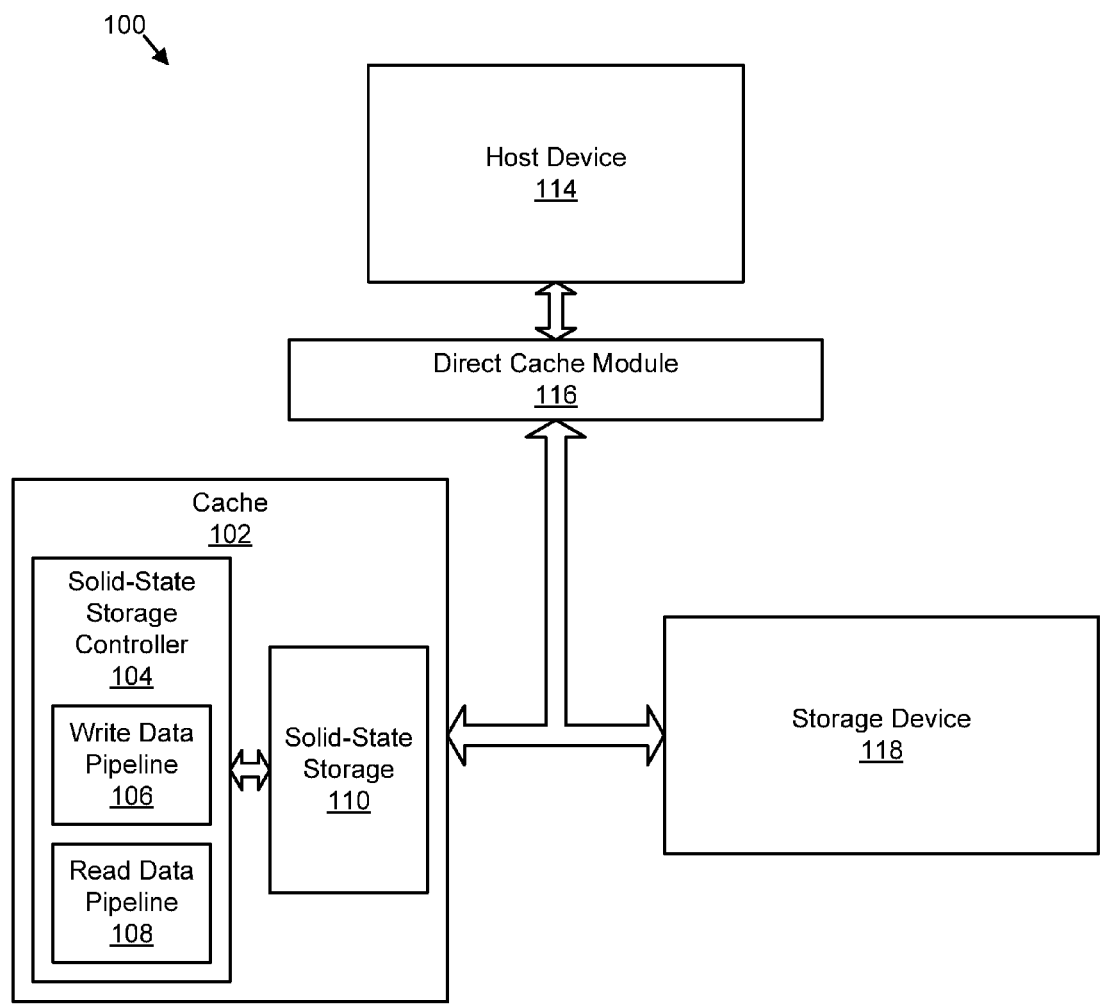
FIG. 1 is a schematic block diagram illustrating one embodiment of a system for caching data in accordance with the present invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of computer readable program code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of computer readable program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the computer readable program code may be stored and/or propagated on or in one or more computer readable medium(s).

The computer readable medium may be a tangible computer readable storage medium storing the computer readable program code. The computer readable storage medium may be, for example, but not limited to, an electronic, magnetic, optical, electromagnetic, infrared, holographic, micromechanical, or semiconductor system, apparatus, or device, or any suitable combination of the foregoing.

More specific examples of the computer readable medium may include but are not limited to a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), an optical storage device, a magnetic storage device, a holographic storage medium, a micromechanical storage device, or any suitable combination of the foregoing. In the context of this document, a computer readable storage medium may be any tangible medium that can contain, and/or store computer readable program code for use by and/or in connection with an instruction execution system, apparatus, or device.

The computer readable medium may also be a computer readable signal medium. A computer readable signal medium may include a propagated data signal with computer readable program code embodied therein, for example, in baseband or as part of a carrier wave. Such a propagated signal may take any of a variety of forms, including, but not limited to, electrical, electro-magnetic, magnetic, optical, or any suitable combination thereof. A computer readable signal medium may be any computer readable medium that is not a computer readable storage medium and that can communicate, propagate, or transport computer readable program code for use by or in connection with an instruction execution system, apparatus, or device. Computer readable program code embodied on a computer readable signal medium may be transmitted using any appropriate medium, including but not limited to wireless, wireline, optical fiber cable, Radio Frequency (RF), or the like, or any suitable combination of the foregoing. In one embodiment, the computer readable medium may comprise a combination of one or more computer readable storage mediums and one or more computer readable signal mediums. For example, computer readable program code may be both propagated as an electro-magnetic signal through a fiber optic cable for execution by a processor and stored on RAM storage device for execution by the processor.

Computer readable program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The computer readable program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and computer program products according to embodiments of the invention. It will be understood that each block of the schematic flowchart diagrams and/or schematic block diagrams, and combinations of blocks in the schematic flowchart diagrams and/or schematic block diagrams, can be implemented by computer readable program code. These computer readable program code may be provided to a processor of a general purpose computer, special purpose computer, sequencer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The computer readable program code may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

The computer readable program code may also be loaded onto a computer, other programmable data processing apparatus, or other devices to cause a series of operational steps to be performed on the computer, other programmable apparatus or other devices to produce a computer implemented process such that the program code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and computer readable program code.

Caching System

FIG. 1 depicts one embodiment of a system 100 for caching data in accordance with the present invention. The system 100, in the depicted embodiment, includes a cache 102 a host device 114, a direct cache module 116, and a storage device 118. The cache 102, in the depicted embodiment, includes a solid-state storage controller 104, a write data pipeline 106, a read data pipeline 108, and a solid-state storage media 110. In general, the system 100 caches data for the storage device 118 in the cache 102.

In the depicted embodiment, the system 100 includes a single cache 102. In another embodiment, the system 100 may include two or more caches 102. For example, in various embodiments, the system 100 may minor cached data between several caches 102, may virtually stripe cached data across multiple caches 102, or otherwise cache data in more than one cache 102. In general, the cache 102 serves as a read and/or a write cache for the storage device 118 and the storage device 118 is a backing store for the cache 102.

In the depicted embodiment, the cache 102 is embodied by a non-volatile, solid-state storage device, with a solid-state storage controller 104 and non-volatile, solid-state storage media 110. The non-volatile, solid-state storage media 110 may include flash memory, nano random access memory ("nano RAM or NRAM"), magneto-resistive RAM ("MRAM"), phase change RAM ("PRAM"), etc. In further embodiments, the cache 102 may include other types of non-volatile and/or volatile data storage, such as dynamic RAM ("DRAM"), static RAM ("SRAM"), magnetic data storage, optical data storage, and/or other data storage technologies.

Figure 2:
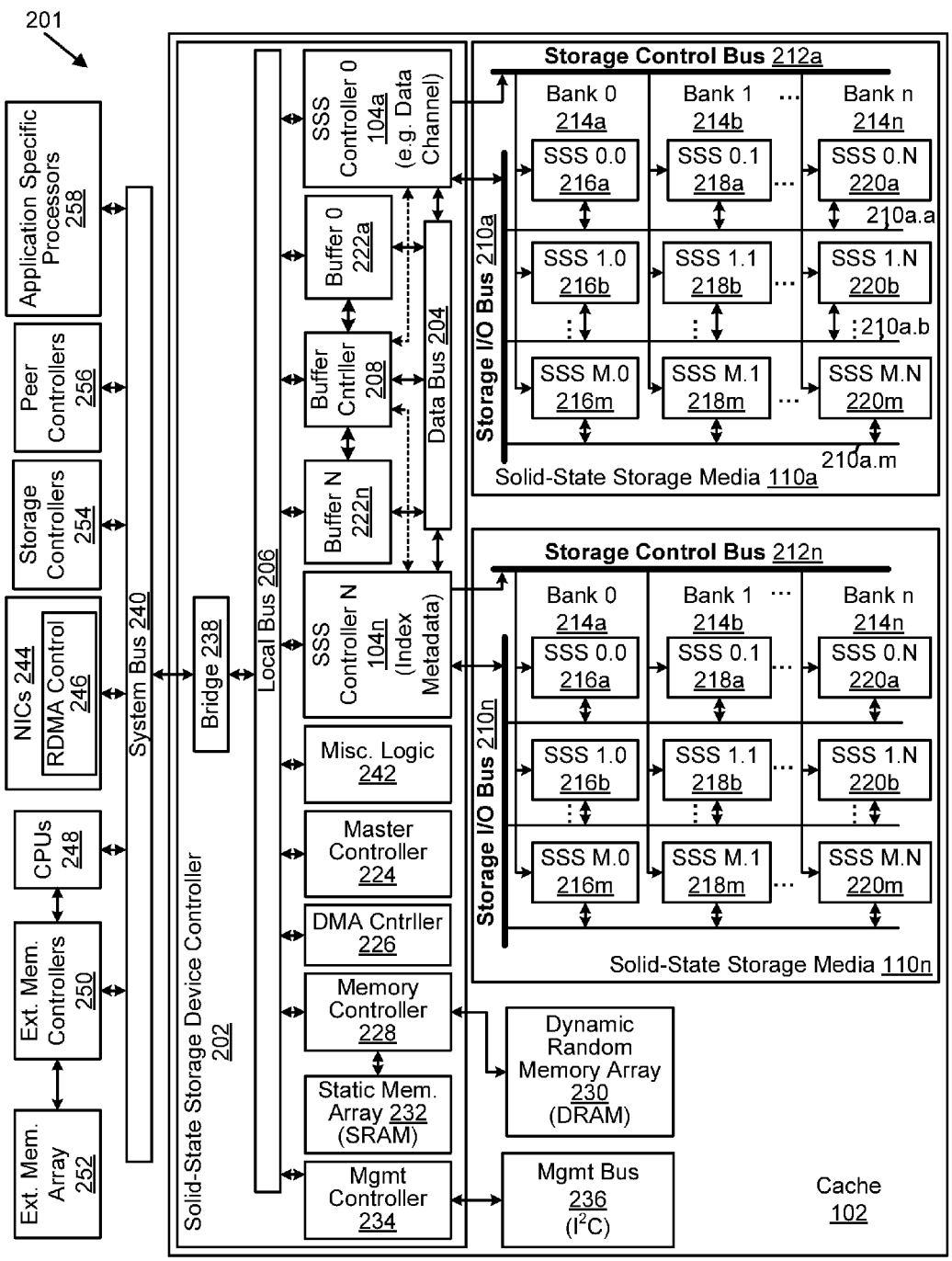
FIG. 2 is a schematic block diagram illustrating one embodiment of a solid-state storage device controller in a cache device in accordance with the present invention.
Figure 3:
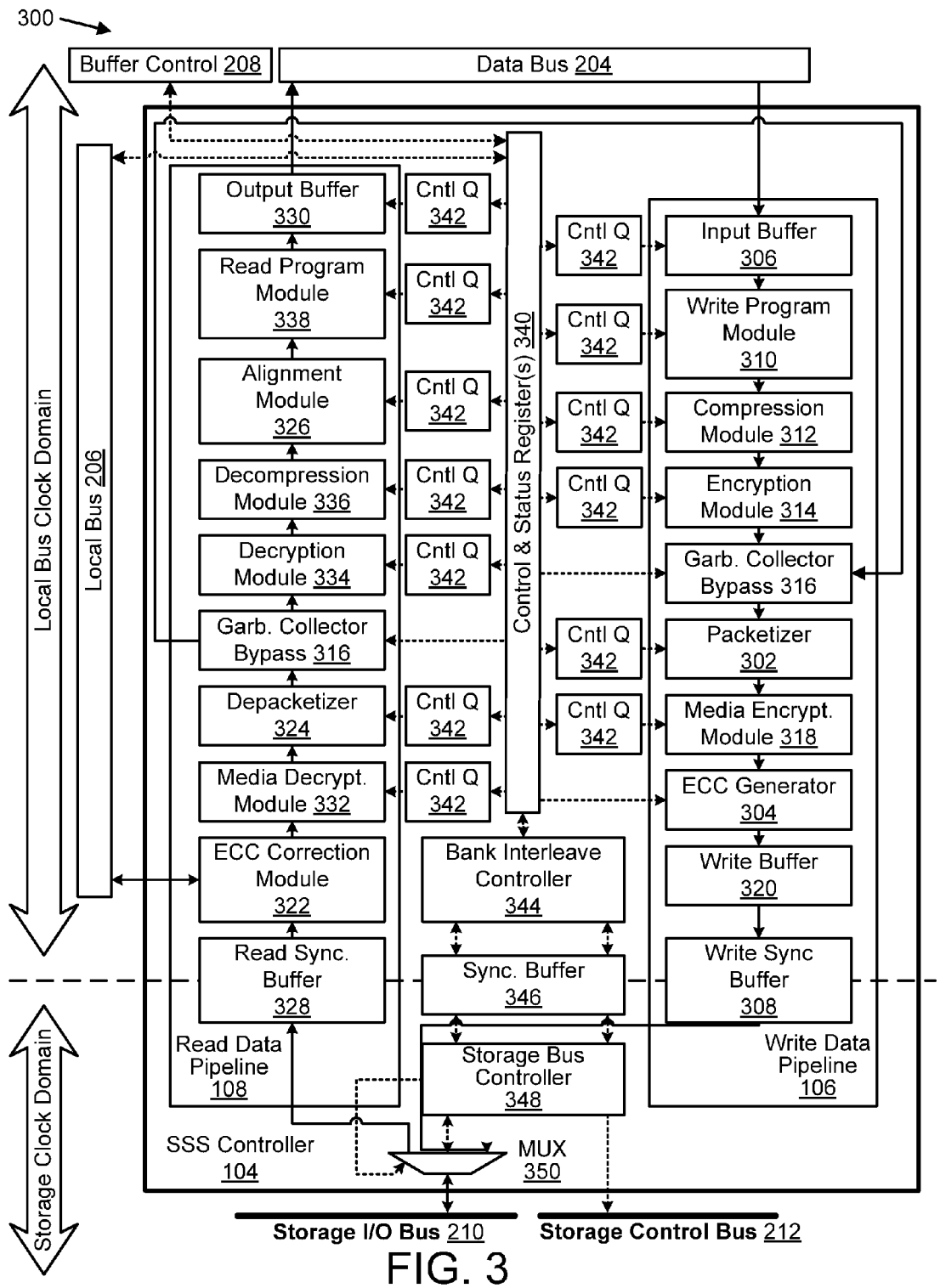
FIG. 3 is a schematic block diagram illustrating one embodiment of a solid-state storage controller with a write data pipeline and a read data pipeline in a solid-state storage device in accordance with the present invention.

Embodiments of the cache 102 that include a solid-state storage controller 104 and solid-state storage media 110 are described in more detail with respect to FIGS. 2 and 3. The solid-state storage controller 104, in certain embodiments, may mask differences in latency for storage operations performed on the solid-state storage media 110 by grouping erase blocks by access time, wear level, and/or health, by queuing storage operations based on expected completion times, by splitting storage operations, by coordinating storage operation execution in parallel among multiple buses, or the like.

In general, the cache 102 caches data for the storage device 118. The storage device 118, in one embodiment, is a backing store associated with the cache 102 and/or with the direct cache module 116. The storage device 118 may include a hard disk drive, an optical drive with optical media, a magnetic tape drive, or another type of storage device. In one embodiment, the storage device 118 may have a greater data storage capacity than the cache 102. In another embodiment, the storage device 118 may have a higher latency, a lower throughput, or the like, than the cache 102.

The storage device 118 may have a higher latency, a lower throughput, or the like due to properties of the storage device 118 itself, or due to properties of a connection to the storage device 118. For example, in one embodiment, the cache 102 and the storage device 118 may each include non-volatile, solid-state storage media 110 with similar properties, but the storage device 118 may be in communication with the host device 114 over a data network, while the cache 102 may be directly connected to the host device 114, causing the storage device 118 to have a higher latency relative to the host 114 than the cache 102.

In the depicted embodiment, the cache 102 and the storage device 118 are in communication with the host device 114 through the direct cache module 116. The cache 102 and/or the storage device 118, in one embodiment, may be direct attached storage ("DAS") of the host device 114. DAS, as used herein, is data storage that is connected to a device, either internally or externally, without a storage network in between.

In one embodiment, the cache 102 and/or the storage device 118 are internal to the host device 114 and are connected using a system bus, such as a peripheral component interconnect express ("PCI-e") bus, a Serial Advanced Technology Attachment ("SATA") bus, or the like. In another embodiment, the cache 102 and/or the storage device 118 may be external to the host device 114 and may be connected using a universal serial bus ("USB") connection, an Institute of Electrical and Electronics Engineers ("IEEE") 1394 bus ("FireWire"), an external SATA ("eSATA") connection, or the like. In other embodiments, the cache 102 and/or the storage device 118 may be connected to the host device 114 using a peripheral component interconnect ("PCI") express bus using external electrical or optical bus extension or bus networking solution such as Infiniband or PCI Express Advanced Switching ("PCIe-AS"), or the like.

In various embodiments, the cache 102 and/or the storage device 118 may be in the form of a dual-inline memory module ("DIMM"), a daughter card, or a micro-module. In another embodiment, the cache 102 and/or the storage device 118 may be elements within a rack-mounted blade. In another embodiment, the cache 102 and/or the storage device 118 may be contained within packages that are integrated directly onto a higher level assembly (e.g. mother board, lap top, graphics processor). In another embodiment, individual components comprising the cache 102 and/or the storage device 118 are integrated directly onto a higher level assembly without intermediate packaging. In the depicted embodiment, the cache 102 includes one or more solid-state storage controllers 104 with a write data pipeline 106 and a read data pipeline 108, and a solid-state storage media 110, which are described in more detail below with respect to FIGS. 2 and 3.

In a further embodiment, instead of being connected directly to the host device 114 as DAS, the cache 102 and/or the storage device 118 may be connected to the host device 114 over a data network. For example, the cache 102 and/or the storage device 118 may include a storage area network ("SAN") storage device, a network attached storage ("NAS") device, a network share, or the like. In one embodiment, the system 100 may include a data network, such as the Internet, a wide area network ("WAN"), a metropolitan area network ("MAN"), a local area network ("LAN"), a token ring, a wireless network, a fiber channel network, a SAN, a NAS, ESCON, or the like, or any combination of networks. A data network may also include a network from the IEEE 802 family of network technologies, such Ethernet, token ring, Wi-Fi, Wi-Max, and the like. A data network may include servers, switches, routers, cabling, radios, and other equipment used to facilitate networking between the host device 114 and the cache 102 and/or the storage device 118.

In one embodiment, at least the cache 102 is connected directly to the host device 114 as a DAS device. In a further embodiment, the cache 102 is directly connected to the host device 114 as a DAS device and the storage device 118 is directly connected to the cache 102. For example, the cache 102 may be connected directly to the host device 114, and the storage device 118 may be connected directly to the cache 102 using a direct, wire-line connection, such as a PCI express bus, an SATA bus, a USB connection, an IEEE 1394 connection, an eSATA connection, a proprietary direct connection, an external electrical or optical bus extension or bus networking solution such as Infiniband or PCIe-AS, or the like. One of skill in the art, in light of this disclosure, will recognize other arrangements and configurations of the host device 114, the cache 102, and the storage device 118 suitable for use in the system 100.

The system 100 includes the host device 114 in communication with the cache 102 and the storage device 118 through the direct cache module 116. A host device 114 may be a host, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like.

In the depicted embodiment, the host device 114 is in communication with the direct cache module 116. The direct cache module 116, in general, receives or otherwise detects read and write requests from the host device 114 for the storage device 118 and manages the caching of data in the cache 102. In one embodiment, the direct cache module 116 comprises a software application, file system filter driver, or the like.

The direct cache module 116, in various embodiments, may include one or more software drivers on the host device 114, one or more storage controllers, such as the solid-state storage controllers 104 of the cache 102, a combination of one or more software drivers and storage controllers, or the like.

In certain embodiments, hardware and/or software of the direct cache module 116 comprises a cache controller that is in communication with the solid-state storage controller 104 to manage operation of the cache 102.

In one embodiment, the host device 114 loads one or more device drivers for the cache 102 and/or the storage device 118 and the direct cache module 116 communicates with the one or more device drivers on the host device 114. In another embodiment, the direct cache module 116 may communicate directly with a hardware interface of the cache 102 and/or the storage device 118. In a further embodiment, the direct cache module 116 may be integrated with the cache 102 and/or the storage device 118.

In one embodiment, the cache 102 and/or the storage device 118 have block device interfaces that support block device commands. For example, the cache 102 and/or the storage device 118 may support the standard block device interface, the ATA interface standard, the ATA Packet Interface ("ATAPI") standard, the small computer system interface ("SCSI") standard, and/or the Fibre Channel standard which are maintained by the InterNational Committee for Information Technology Standards ("INCITS"). The direct cache module 116 may interact with the cache 102 and/or the storage device 118 using block device commands to read, write, and clear (or trim) data.

In one embodiment, the direct cache module 116 serves as a proxy for the storage device 118, receiving read and write requests for the storage device 118 directly from the host device 114. The direct cache module 116 may represent itself to the host device 114 as a storage device having a capacity similar to and/or matching the capacity of the storage device 118. In certain embodiments, the direct cache module 116 and/or the solid-state storage controller 104 dynamically reduce a cache size for the cache 102 in response to an age characteristic for the solid-state storage media 110 of the cache 102. For example, as storage elements of the cache 102 age, the direct cache module 116 and/or the solid-state storage controller 104 may remove the storage elements from operation, thereby reducing the cache size for the cache 102. Examples of age characteristics, in various embodiments, may include a program/erase count, a bit error rate, an uncorrectable bit error rate, or the like that satisfies a predefined age threshold.

The direct cache module 116, upon receiving a read request or write request from the host device 114, in one embodiment, fulfills the request by caching write data in the cache 102 or by retrieving read data from one of the cache 102 and the storage device 118 and returning the read data to the host device 114.

Data caches are typically organized into cache lines which divide up the physical capacity of the cache, these cache lines may be divided into several sets. A cache line is typically larger than a block or sector of a backing store associated with a data cache, to provide for prefetching of additional blocks or sectors and to reduce cache misses and increase the cache hit rate. Data caches also typically evict an entire, fixed size, cache line at a time to make room for newly requested data in satisfying a cache miss. Data caches may be direct mapped, fully associative, N-way set associative, or the like.

In a direct mapped cache, each block or sector of a backing store has a one-to-one mapping to a cache line in the direct mapped cache. For example, if a direct mapped cache has T number of cache lines, the backing store associated with the direct mapped cache may be divided into T sections, and the direct mapped cache caches data from a section exclusively in the cache line corresponding to the section. Because a direct mapped cache always caches a block or sector in the same location or cache line, the mapping between a block or sector address and a cache line can be a simple manipulation of an address of the block or sector.

In a fully associative cache, any cache line can store data from any block or sector of a backing store. A fully associative cache typically has lower cache miss rates than a direct mapped cache, but has longer hit times (i.e. it takes longer to locate data in the cache) than a direct mapped cache. To locate data in a fully associative cache, either cache tags of the entire cache can be searched, a separate cache index can be used, or the like.

In an N-way set associative cache, each sector or block of a backing store may be cached in any of a set of N different cache lines. For example, in a 2-way set associative cache, either of two different cache lines may cache data for a sector or block. In an N-way set associative cache, both the cache and the backing store are typically divided into sections or sets, with one or more sets of sectors or blocks of the backing store assigned to a set of N cache lines. To locate data in an N-way set associative cache, a block or sector address is typically mapped to a set of cache lines, and cache tags of the set of cache lines are searched, a separate cache index is searched, or the like to determine which cache line in the set is storing data for the block or sector. An N-way set associative cache typically has miss rates and hit rates between those of a direct mapped cache and those of a fully associative cache.

The cache 102, in one embodiment, has characteristics of both a directly mapped cache and a fully associative cache. A logical address space of the cache 102, in one embodiment, is directly mapped to an address space of the storage device 118 while the physical storage media 110 of the cache 102 is fully associative with regard to the storage device 118. In other words, each block or sector of the storage device 118, in one embodiment, is directly mapped to a single logical address of the cache 102 while any portion of the physical storage media 110 of the cache 102 may store data for any block or sector of the storage device 118. In one embodiment, a logical address is an identifier of a block of data and is distinct from a physical address of the block of data, but may be mapped to the physical address of the block of data. Examples of logical addresses, in various embodiments, include logical block addresses ("LBAs"), logical identifiers, object identifiers, pointers, references, and the like.

Instead of traditional cache lines, in one embodiment, the cache 102 has logical or physical cache data blocks associated with each logical address that are equal in size to a block or sector of the storage device 118. In a further embodiment, the cache 102 caches ranges and/or sets of ranges of blocks or sectors for the storage device 118 at a time, providing dynamic or variable length cache line functionality. A range or set of ranges of blocks or sectors, in a further embodiment, may include a mixture of contiguous and/or noncontiguous blocks. For example, the cache 102, in one embodiment, supports block device requests that include a mixture of contiguous and/or noncontiguous blocks and that may include "holes" or intervening blocks that the cache 102 does not cache or otherwise store.

In one embodiment, one or more groups of addresses of the storage device 118 are directly mapped to corresponding logical addresses of the cache 102. The addresses of the storage device 118 may comprise physical addresses or logical addresses. Directly mapping logical addresses of the storage device 118 to logical addresses of the cache 102, in one embodiment, provides a one-to-one relationship between the logical addresses of the storage device 118 and the logical addresses of the cache 102. Directly mapping logical or physical address space of the storage device 118 to logical addresses of the cache 102, in one embodiment, precludes the use of an extra translation layer in the direct cache module 116, such as the use of cache tags, a cache index, the maintenance of a translation data structure, or the like. In one embodiment, while the logical address space of the cache 102 may be larger than a logical address space of the storage device 118, both logical address spaces include at least logical addresses 0-N. In a further embodiment, at least a portion of the logical address space of the cache 102 represents or appears as the logical address space of the storage device 118 to a client, such as the host device 114.

Alternatively, in certain embodiments where physical blocks or sectors of the storage device 118 are directly accessible using physical addresses, at least a portion of logical addresses in a logical address space of the cache 102 may be mapped to physical addresses of the storage device 118. At least a portion of the logical address space of the cache 102, in one embodiment, may correspond to the physical address space of the storage device 118. At least a subset of the logical addresses of the cache 102, in this embodiment, are directly mapped to corresponding physical addresses of the storage device 118.

In one embodiment, the logical address space of the cache 102 is a sparse address space that is either as large as or is larger than the physical storage capacity of the cache 102. This allows the storage device 118 to have a larger storage capacity than the cache 102, while maintaining a direct mapping between the logical addresses of the cache 102 and logical or physical addresses of the storage device 118. The sparse logical address space may be thinly provisioned, in one embodiment. In a further embodiment, as the direct cache module 116 writes data to the cache 102 using logical addresses, the cache 102 directly maps the logical addresses to distinct physical addresses or locations on the solid-state storage media 110 of the cache 102, such that the physical addresses or locations of data on the solid-state storage media 110 are fully associative with the storage device 118. In one embodiment, the direct cache module 116 and/or the cache 102 use the same single mapping structure to map addresses (either logical or physical) of the storage device 118 to logical addresses of the cache 102 and to map logical addresses of the cache 102 to locations/physical addresses of a block or sector (or range of blocks or sectors) on the physical solid state storage media 110. In one embodiment, using a single mapping structure for both functions eliminates the need for a separate cache map, cache index, cache tags, or the like, decreasing access times of the cache 102.

As the direct cache module 116 clears, trims, replaces, expires, and/or evicts, cached data from the cache 102, the physical addresses and associated physical storage media, the solid state storage media 110 in the depicted embodiment, are freed to store data for other logical addresses. In one embodiment, the solid state storage controller 104 stores the data at the physical addresses using a log-based, append only writing structure such that data evicted from the cache 102 or overwritten by a subsequent write request invalidates other data in the log. Consequently, a garbage collection process recovers the physical capacity of the invalid data in the log. One embodiment of the log-based, append only writing structure is a logically ring-like, cyclic data structure, as new data is appended to the log-based writing structure, previously used physical capacity is reused in a circular, theoretically infinite manner.

Solid-State Storage Device

FIG. 2 is a schematic block diagram illustrating one embodiment 201 of a solid-state storage device controller 202 that includes a write data pipeline 106 and a read data pipeline 108 in a cache 102 in accordance with the present invention. The solid-state storage device controller 202 may be embodied as hardware, as software, or as a combination of hardware and software.

The solid-state storage device controller 202 may include a number of solid-state storage controllers 0-N 104a-n, each controlling solid-state storage media 110. In the depicted embodiment, two solid-state controllers are shown: solid-state controller 0 104a and solid-state storage controller N 104n, and each controls solid-state storage media 110a-n. In the depicted embodiment, solid-state storage controller 0 104a controls a data channel so that the attached solid-state storage media 110a stores data. Solid-state storage controller N 104n controls an index metadata channel associated with the stored data and the associated solid-state storage media 110n stores index metadata. In an alternate embodiment, the solid-state storage device controller 202 includes a single solid-state controller 104a with a single solid-state storage media 110a. In another embodiment, there are a plurality of solid-state storage controllers 104a-n and associated solid-state storage media 110a-n. In one embodiment, one or more solid-state controllers 104a-104n-1, coupled to their associated solid-state storage media 110a-110n-1, control data while at least one solid-state storage controller 104n, coupled to its associated solid-state storage media 110n, controls index metadata.

In one embodiment, at least one solid-state controller 104 is field-programmable gate array ("FPGA") and controller functions are programmed into the FPGA. In a particular embodiment, the FPGA is a Xilinx® FPGA. In another embodiment, the solid-state storage controller 104 comprises components specifically designed as a solid-state storage controller 104, such as an application-specific integrated circuit ("ASIC") or custom logic solution. Each solid-state storage controller 104 typically includes a write data pipeline 106 and a read data pipeline 108, which are describe further in relation to FIG. 3. In another embodiment, at least one solid-state storage controller 104 is made up of a combination FPGA, ASIC, and custom logic components.

Solid-State Storage

The solid-state storage media 110 is an array of non-volatile solid-state storage elements 216, 218, 220, arranged in banks 214, and accessed in parallel through a bi-directional storage input/output ("I/O") bus 210. The storage I/O bus 210, in one embodiment, is capable of unidirectional communication at any one time. For example, when data is being written to the solid-state storage media 110, data cannot be read from the solid-state storage media 110. In another embodiment, data can flow both directions simultaneously. However bi-directional, as used herein with respect to a data bus, refers to a data pathway that can have data flowing in only one direction at a time, but when data flowing one direction on the bi-directional data bus is stopped, data can flow in the opposite direction on the bi-directional data bus.

A solid-state storage element (e.g. SSS 0.0 216a) is typically configured as a chip (a package of one or more dies) or a die on a circuit board. As depicted, a solid-state storage element (e.g. 216a) operates independently or semi-independently of other solid-state storage elements (e.g. 218a) even if these several elements are packaged together in a chip package, a stack of chip packages, or some other package element. As depicted, a column of solid-state storage elements 216, 218, 220 is designated as a bank 214. As depicted, there may be "n" banks 214a-n and "m" solid-state storage elements 216a-m, 218a-m, 220a-m per bank in an array of n×m solid-state storage elements 216, 218, 220 in a solid-state storage media 110. In one embodiment, a solid-state storage media 110a includes twenty solid-state storage elements per bank (e.g. 216a-m in bank 214a, 218 a-m in bank 214b, 220a-m in bank 214n, where m=22) with eight banks (e.g. 214a-n where n=8) and a solid-state storage media 110n includes two solid-state storage elements (e.g. 216a-m where m=2) per bank 214 with one bank 214a. There is no requirement that two solid-state storage media 110a, 110n have the same number of solid-state storage elements and/or same number of banks 214. In one embodiment, each solid-state storage element 216, 218, 220 is comprised of a single-level cell ("SLC") devices. In another embodiment, each solid-state storage element 216, 218, 220 is comprised of multi-level cell ("MLC") devices.

In one embodiment, solid-state storage elements for multiple banks that share a common storage I/O bus 210a row (e.g. 216b, 218b, 220b) are packaged together. In one embodiment, a solid-state storage element 216, 218, 220 may have one or more dies per chip with one or more chips stacked vertically and each die may be accessed independently. In another embodiment, a solid-state storage element (e.g. SSS 0.0 216a) may have one or more virtual dies per die and one or more dies per chip and one or more chips stacked vertically and each virtual die may be accessed independently. In another embodiment, a solid-state storage element SSS 0.0 216a may have one or more virtual dies per die and one or more dies per chip with some or all of the one or more dies stacked vertically and each virtual die may be accessed independently.

In one embodiment, two dies are stacked vertically with four stacks per group to form eight storage elements (e.g. SSS 0.0-SSS 0.8) 216a-220a, each in a separate bank 214a-n. In another embodiment, 20 storage elements (e.g. SSS 0.0-SSS 20.0) 216 form a virtual bank 214a so that each of the eight virtual banks has 20 storage elements (e.g. SSS0.0-SSS 20.8). Data is sent to the solid-state storage media 110 over the storage I/O bus 210 to all storage elements of a particular group of storage elements (SSS 0.0-SSS 0.8) 216a, 218a, 220a. The storage control bus 212a is used to select a particular bank (e.g. Bank-0 214a) so that the data received over the storage I/O bus 210 connected to all banks 214 is written just to the selected bank 214a.

In certain embodiments, the storage control bus 212 and storage I/O bus 210 are used together by the solid-state controller 104 to communicate addressing information, storage element command information, and data to be stored. Those of skill in the art recognize that this address, data, and command information may be communicated using one or the other of these buses 212, 210, or using separate buses for each type of control information. In one embodiment, addressing information, storage element command information, and storage data travel on the storage I/O bus 210 and the storage control bus 212 carries signals for activating a bank as well as identifying whether the data on the storage I/O bus 210 lines constitute addressing information, storage element command information, or storage data.

For example, a control signal on the storage control bus 212 such as "command enable" may indicate that the data on the storage I/O bus 210 lines is a storage element command such as program, erase, reset, read, and the like. A control signal on the storage control bus 212 such as "address enable" may indicate that the data on the storage I/O bus 210 lines is addressing information such as erase block identifier, page identifier, and optionally offset within the page within a particular storage element. Finally, an absence of a control signal on the storage control bus 212 for both "command enable" and "address enable" may indicate that the data on the storage I/O bus 210 lines is storage data that is to be stored on the storage element at a previously addressed erase block, physical page, and optionally offset within the page of a particular storage element.

In one embodiment, the storage I/O bus 210 is comprised of one or more independent I/O buses ("IIOBa-m" comprising 210a.a-m, 210n.a-m) wherein the solid-state storage elements within each row share one of the independent I/O buses across each solid-state storage element 216, 218, 220 in parallel so that all banks 214 are accessed simultaneously. For example, one IIOB 210a.a of the storage I/O bus 210 may access a first solid-state storage element 216a, 218a, 220a of each bank 214a-n simultaneously. A second IIOB 210a.b of the storage I/O bus 210 may access a second solid-state storage element 216b, 218b, 220b of each bank 214a-n simultaneously. Each row of solid-state storage elements 216, 218, 220 is accessed simultaneously. In one embodiment, where solid-state storage elements 216, 218, 220 are multi-level (physically stacked), all physical levels of the solid-state storage elements 216, 218, 220 are accessed simultaneously. As used herein, "simultaneously" also includes near simultaneous access where devices are accessed at slightly different intervals to avoid switching noise. Simultaneously is used in this context to be distinguished from a sequential or serial access wherein commands and/or data are sent individually one after the other.

Typically, banks 214a-n are independently selected using the storage control bus 212. In one embodiment, a bank 214 is selected using a chip enable or chip select. Where both chip select and chip enable are available, the storage control bus 212 may select one level of a multi-level solid-state storage element 216, 218, 220 using either of the chip select signal and the chip enable signal. In other embodiments, other commands are used by the storage control bus 212 to individually select one level of a multi-level solid-state storage element 216, 218, 220. Solid-state storage elements 216, 218, 220 may also be selected through a combination of control and of address information transmitted on storage I/O bus 210 and the storage control bus 212.

In one embodiment, each solid-state storage element 216, 218, 220 is partitioned into erase blocks and each erase block is partitioned into pages. A typical page is 2000 bytes ("2 kB"). In one example, a solid-state storage element (e.g. SSS0.0) includes two registers and can program two pages so that a two-register solid-state storage element has a page size of 4 kB. A single bank 214a of 20 solid-state storage elements 216a-m would then have an 80 kB capacity of pages accessed with the same address going out of the storage I/O bus 210.

This group of pages in a bank 214 of solid-state storage elements 216, 218, 220 of 80 kB may be called a logical or virtual page. Similarly, an erase block of each storage element 216a-m of a bank 214a may be grouped to form a logical erase block. In one embodiment, erasing a logical erase block causes a physical erase block of each storage element 216a-m of a bank 214a to be erased. In one embodiment, an erase block of pages within a solid-state storage element 216, 218, 220 is erased when an erase command is received within a solid-state storage element 216, 218, 220. In another embodiment, a single physical erase block on each storage element (e.g. SSS M.N) collectively forms a logical erase block for the solid-state storage media 110a. In such an embodiment, erasing a logical erase block comprises erasing an erase block at the same address within each storage element (e.g. SSS M.N) in the solid-state storage media 110a. Whereas the size and number of erase blocks, pages, planes, or other logical and physical divisions within a solid-state storage element 216, 218, 220 may change over time with advancements in technology, it is to be expected that many embodiments consistent with new configurations are possible and are consistent with the general description herein.

In one embodiment, data is written in packets to the storage elements. The solid-state controller 104 uses the storage I/O bus 210 and storage control bus 212 to address a particular bank 214, storage element 216, 218, 220, physical erase block, physical page, and optionally offset within a physical page for writing the data packet. In one embodiment, the solid-state controller 104 sends the address information for the data packet by way of the storage I/O bus 210 and signals that the data on the storage I/O bus 210 is address data by way of particular signals set on the storage control bus 212. The solid-state controller 104 follows the transmission of the address information with transmission of the data packet of data that is to be stored. The physical address contains enough information for the solid-state storage element 216, 218, 220 to direct the data packet to the designated location within the page.

In one embodiment, the storage I/O bus 210a.a connects to each storage element in a row of storage elements (e.g. SSS 0.0-SSS 0.N 216a, 218a, 220a). In such an embodiment, the solid-state controller 104a activates a desired bank 214a using the storage control bus 212a, such that data on storage I/O bus 210a.a reaches the proper page of a single storage element (e.g. SSS 0.0 216a).

In addition, in certain embodiments, the solid-state controller 104a simultaneously activates the same bank 214a using the storage control bus 212a, such that different data (a different data packet) on storage I/O bus 210a.b reaches the proper page of a single storage element on another row (e.g. SSS 1.0 216b). In this manner, multiple physical pages of multiple storage elements 216, 218, 220 may be written to simultaneously within a single bank 214 to store a logical page.

Similarly, a read command may require a command on the storage control bus 212 to select a single bank 214a and the appropriate page within that bank 214a. In one embodiment, a read command reads an entire physical page from each storage element, and because there are multiple solid-state storage elements 216, 218, 220 in parallel in a bank 214, an entire logical page is read with a read command. However, the read command may be broken into subcommands, as will be explained below with respect to bank interleave. A logical page may also be accessed in a write operation.

In one embodiment, a solid-state controller 104 may send an erase block erase command over all the lines of the storage I/O bus 210 to erase a physical erase block having a particular erase block address. In addition, the solid-state controller 104 may simultaneously activate a single bank 214 using the storage control bus 212 such that each physical erase block in the single activated bank 214 is erased as part of a logical erase block.

In another embodiment, the solid-state controller 104 may send an erase block erase command over all the lines of the storage I/O bus 210 to erase a physical erase block having a particular erase block address on each storage element 216, 218, 220 (SSS 0.0-SSS M.N). These particular physical erase blocks together may form a logical erase block. Once the address of the physical erase blocks is provided to the storage elements 216, 218, 220, the solid-state controller 104 may initiate the erase command on a bank 214a by bank 214b by bank 214n basis (either in order or based on some other sequence). Other commands may also be sent to a particular location using a combination of the storage I/O bus 210 and the storage control bus 212. One of skill in the art will recognize other ways to select a particular storage location using the bi-directional storage I/O bus 210 and the storage control bus 212.

In one embodiment, the storage controller 104 sequentially writes data on the solid-state storage media 110 in a log structured format and within one or more physical structures of the storage elements, the data is sequentially stored on the solid-state storage media 110. Sequentially writing data involves the storage controller 104 streaming data packets into storage write buffers for storage elements, such as a chip (a package of one or more dies) or a die on a circuit board. When the storage write buffers are full, the data packets are programmed to a designated virtual or logical page ("LP"). Data packets then refill the storage write buffers and, when full, the data packets are written to the next LP. The next virtual page may be in the same bank 214a or another bank (e.g. 214b). This process continues, LP after LP, typically until a virtual or logical erase block ("LEB") is filled. LPs and LEBs are described in more detail below.

In another embodiment, the streaming may continue across LEB boundaries with the process continuing, LEB after LEB. Typically, the storage controller 104 sequentially stores data packets in an LEB by order of processing. In one embodiment, where a write data pipeline 106 is used, the storage controller 104 stores packets in the order that they come out of the write data pipeline 106. This order may be a result of data segments arriving from a requesting device mixed with packets of valid data that are being read from another storage location as valid data is being recovered from another LEB during a recovery operation.

The sequentially stored data, in one embodiment, can serve as a log to reconstruct data indexes and other metadata using information from data packet headers. For example, in one embodiment, the storage controller 104 may reconstruct a storage index by reading headers to determine the data structure to which each packet belongs and sequence information to determine where in the data structure the data or metadata belongs. The storage controller 104, in one embodiment, uses physical address information for each packet and timestamp or sequence information to create a mapping between the physical locations of the packets and the data structure identifier and data segment sequence. Timestamp or sequence information is used by the storage controller 104 to replay the sequence of changes made to the index and thereby reestablish the most recent state.

In one embodiment, erase blocks are time stamped or given a sequence number as packets are written and the timestamp or sequence information of an erase block is used along with information gathered from container headers and packet headers to reconstruct the storage index. In another embodiment, timestamp or sequence information is written to an erase block when the erase block is recovered.

In a read, modify, write operation, data packets associated with the logical structure are located and read in a read operation. Data segments of the modified structure that have been modified are not written to the location from which they are read. Instead, the modified data segments are again converted to data packets and then written to the next available location in the virtual page currently being written. Index entries for the respective data packets are modified to point to the packets that contain the modified data segments. The entry or entries in the index for data packets associated with the same logical structure that have not been modified will include pointers to original location of the unmodified data packets. Thus, if the original logical structure is maintained, for example to maintain a previous version of the logical structure, the original logical structure will have pointers in the index to all data packets as originally written. The new logical structure will have pointers in the index to some of the original data packets and pointers to the modified data packets in the virtual page that is currently being written.

In a copy operation, the index includes an entry for the original logical structure mapped to a number of packets stored on the solid-state storage media 110. When a copy is made, a new logical structure is created and a new entry is created in the index mapping the new logical structure to the original packets. The new logical structure is also written to the solid-state storage media 110 with its location mapped to the new entry in the index. The new logical structure packets may be used to identify the packets within the original logical structure that are referenced in case changes have been made in the original logical structure that have not been propagated to the copy and the index is lost or corrupted. In another embodiment, the index includes a logical entry for a logical block.

Beneficially, sequentially writing packets facilitates a more even use of the solid-state storage media 110 and allows the solid-storage device controller 202 to monitor storage hot spots and level usage of the various virtual pages in the solid-state storage media 110. Sequentially writing packets also facilitates a powerful, efficient garbage collection system, which is described in detail below. One of skill in the art will recognize other benefits of sequential storage of data packets.

The system 100 may comprise a log-structured storage system or log-structured array similar to a log-structured file system and the order that data is stored may be used to recreate an index. Typically an index that includes a logical-to-physical mapping is stored in volatile memory. If the index is corrupted or lost, the index may be reconstructed by addressing the solid-state storage media 110 in the order that the data was written. Within a logical erase block ("LEB"), data is typically stored sequentially by filling a first logical page, then a second logical page, etc. until the LEB is filled. The solid-state storage controller 104 then chooses another LEB and the process repeats. By maintaining an order that the LEBs were written to and by knowing that each LEB is written sequentially, the index can be rebuilt by traversing the solid-state storage media 110 in order from beginning to end. In other embodiments, if part of the index is stored in non-volatile memory, such as on the solid-state storage media 110, the solid-state storage controller 104 may only need to replay a portion of the solid-state storage media 110 to rebuild a portion of the index that was not stored in non-volatile memory. One of skill in the art will recognize other benefits of sequential storage of data packets.

Solid-State Storage Device Controller

In various embodiments, the solid-state storage device controller 202 also includes a data bus 204, a local bus 206, a buffer controller 208, buffers 0-N 222a-n, a master controller 224, a direct memory access ("DMA") controller 226, a memory controller 228, a dynamic memory array 230, a static random memory array 232, a management controller 234, a management bus 236, a bridge 238 to a system bus 240, and miscellaneous logic 242, which are described below. In other embodiments, the system bus 240 is coupled to one or more network interface cards ("NICs") 244, some of which may include remote DMA ("RDMA") controllers 246, one or more central processing unit ("CPU") 248, one or more external memory controllers 250 and associated external memory arrays 252, one or more storage controllers 254, peer controllers 256, and application specific processors 258, which are described below. The components 244-258 connected to the system bus 240 may be located in the host device 114 or may be other devices.

In one embodiment, the solid-state storage controller(s) 104 communicate data to the solid-state storage media 110 over a storage I/O bus 210. In a certain embodiment where the solid-state storage is arranged in banks 214 and each bank 214 includes multiple storage elements 216, 218, 220 accessible in parallel, the storage I/O bus 210 comprises an array of busses, one for each row of storage elements 216, 218, 220 spanning the banks 214. As used herein, the term "storage I/O bus" may refer to one storage I/O bus 210 or an array of data independent busses 204. In one embodiment, each storage I/O bus 210 accessing a row of storage elements (e.g. 216a, 218a, 220a) may include a logical-to-physical mapping for storage divisions (e.g. erase blocks) accessed in a row of storage elements 216a, 218a, 220a. This mapping allows a logical address mapped to a physical address of a storage division to be remapped to a different storage division if the first storage division fails, partially fails, is inaccessible, or has some other problem. Remapping is explained further in relation to the remapping module 430 of FIG. 4.

Data may also be communicated to the solid-state storage controller(s) 104 from a requesting device 155 through the system bus 240, bridge 238, local bus 206, buffer(s) 222, and finally over a data bus 204. The data bus 204 typically is connected to one or more buffers 222a-n controlled with a buffer controller 208. The buffer controller 208 typically controls transfer of data from the local bus 206 to the buffers 222 and through the data bus 204 to the pipeline input buffer 306 and output buffer 330. The buffer controller 208 typically controls how data arriving from a requesting device 155 can be temporarily stored in a buffer 222 and then transferred onto a data bus 204, or vice versa, to account for different clock domains, to prevent data collisions, etc. The buffer controller 208 typically works in conjunction with the master controller 224 to coordinate data flow. As data arrives, the data will arrive on the system bus 240, be transferred to the local bus 206 through a bridge 238.

Typically the data is transferred from the local bus 206 to one or more data buffers 222 as directed by the master controller 224 and the buffer controller 208. The data then flows out of the buffer(s) 222 to the data bus 204, through a solid-state controller 104, and on to the solid-state storage media 110 such as NAND flash or other storage media. In one embodiment, data and associated out-of-band metadata ("metadata") arriving with the data is communicated using one or more data channels comprising one or more solid-state storage controllers 104a-104n-1 and associated solid-state storage media 110a-110n-1 while at least one channel (solid-state storage controller 104n, solid-state storage media 110n) is dedicated to in-band metadata, such as index information and other metadata generated internally to the cache 102.

The local bus 206 is typically a bidirectional bus or set of busses that allows for communication of data and commands between devices internal to the solid-state storage device controller 202 and between devices internal to the cache 102 and devices 244-258 connected to the system bus 240. The bridge 238 facilitates communication between the local bus 206 and system bus 240. One of skill in the art will recognize other embodiments such as ring structures or switched star configurations and functions of buses 240, 206, 204 and bridges 238.

The system bus 240 is typically a bus of a host device 114 or other device in which the cache 102 is installed or connected. In one embodiment, the system bus 240 may be a PCI-e bus, a Serial Advanced Technology Attachment ("serial ATA") bus, parallel ATA, or the like. In another embodiment, the system bus 240 is an external bus such as small computer system interface ("SCSI"), FireWire, Fiber Channel, USB, PCIe-AS, or the like. The cache 102 may be packaged to fit internally to a device or as an externally connected device.

The solid-state storage device controller 202 includes a master controller 224 that controls higher-level functions within the cache 102. The master controller 224, in various embodiments, controls data flow by interpreting requests, directs creation of indexes to map identifiers associated with data to physical locations of associated data, coordinating DMA requests, etc. Many of the functions described herein are controlled wholly or in part by the master controller 224.

In one embodiment, the master controller 224 uses embedded controller(s). In another embodiment, the master controller 224 uses local memory such as a dynamic memory array 230 (dynamic random access memory "DRAM"), a static memory array 232 (static random access memory "SRAM"), etc. In one embodiment, the local memory is controlled using the master controller 224. In another embodiment, the master controller 224 accesses the local memory via a memory controller 228. In another embodiment, the master controller 224 runs a Linux server and may support various common server interfaces, such as the World Wide Web, hyper-text markup language ("HTML"), etc. In another embodiment, the master controller 224 uses a nano-processor. The master controller 224 may be constructed using programmable or standard logic, or any combination of controller types listed above. The master controller 224 may be embodied as hardware, as software, or as a combination of hardware and software. One skilled in the art will recognize many embodiments for the master controller 224.

In one embodiment, where the storage controller 152/solid-state storage device controller 202 manages multiple data storage devices/solid-state storage media 110a-n, the master controller 224 divides the work load among internal controllers, such as the solid-state storage controllers 104a-n. For example, the master controller 224 may divide a data structure to be written to the data storage devices (e.g. solid-state storage media 110a-n) so that a portion of the data structure is stored on each of the attached data storage devices. This feature is a performance enhancement allowing quicker storage and access to a data structure. In one embodiment, the master controller 224 is implemented using an FPGA. In another embodiment, the firmware within the master controller 224 may be updated through the management bus 236, the system bus 240 over a network connected to a NIC 244 or other device connected to the system bus 240.

In one embodiment, the master controller 224 emulates block storage such that a host device 114 or other device connected to the storage device/cache 102 views the storage device/cache 102 as a block storage device and sends data to specific physical or logical addresses in the storage device/cache 102. The master controller 224 then divides up the blocks and stores the data blocks. The master controller 224 then maps the blocks and physical or logical address sent with the block to the actual locations determined by the master controller 224. The mapping is stored in the index. Typically, for block emulation, a block device application program interface ("API") is provided in a driver in the host device 114, or other device wishing to use the storage device/cache 102 as a block storage device.

In another embodiment, the master controller 224 coordinates with NIC controllers 244 and embedded RDMA controllers 246 to deliver just-in-time RDMA transfers of data and command sets. NIC controller 244 may be hidden behind a non-transparent port to enable the use of custom drivers. Also, a driver on a host device 114 may have access to a computer network through an I/O memory driver using a standard stack API and operating in conjunction with NICs 244.

In one embodiment, the master controller 224 is also a redundant array of independent drive ("RAID") controller. Where the data storage device/cache 102 is networked with one or more other data storage devices, the master controller 224 may be a RAID controller for single tier RAID, multi-tier RAID, progressive RAID, etc. The master controller 224 may also allows some objects and other data structures to be stored in a RAID array and other data structures to be stored without RAID. In another embodiment, the master controller 224 may be a distributed RAID controller element. In another embodiment, the master controller 224 may comprise many RAID, distributed RAID, and other functions as described elsewhere.

In one embodiment, the master controller 224 coordinates with single or redundant network managers (e.g. switches) to establish routing, to balance bandwidth utilization, failover, etc. In another embodiment, the master controller 224 coordinates with integrated application specific logic (via local bus 206) and associated driver software. In another embodiment, the master controller 224 coordinates with attached application specific processors 258 or logic (via the external system bus 240) and associated driver software. In another embodiment, the master controller 224 coordinates with remote application specific logic (via a computer network) and associated driver software. In another embodiment, the master controller 224 coordinates with the local bus 206 or external bus attached hard disk drive ("HDD") storage controller.

In one embodiment, the master controller 224 communicates with one or more storage controllers 254 where the storage device/cache 102 may appear as a storage device connected through a SCSI bus, Internet SCSI ("iSCSI"), fiber channel, etc. Meanwhile the storage device/cache 102 may autonomously manage objects or other data structures and may appear as an object file system or distributed object file system. The master controller 224 may also be accessed by peer controllers 256 and/or application specific processors 258.

In another embodiment, the master controller 224 coordinates with an autonomous integrated management controller to periodically validate FPGA code and/or controller software, validate FPGA code while running (reset) and/or validate controller software during power on (reset), support external reset requests, support reset requests due to watchdog timeouts, and support voltage, current, power, temperature, and other environmental measurements and setting of threshold interrupts. In another embodiment, the master controller 224 manages garbage collection to free erase blocks for reuse. In another embodiment, the master controller 224 manages wear leveling. In another embodiment, the master controller 224 allows the data storage device/cache 102 to be partitioned into multiple virtual devices and allows partition-based media encryption. In yet another embodiment, the master controller 224 supports a solid-state storage controller 104 with advanced, multi-bit ECC correction. One of skill in the art will recognize other features and functions of a master controller 224 in a storage controller 152, or more specifically in a cache 102.

In one embodiment, the solid-state storage device controller 202 includes a memory controller 228 which controls a dynamic random memory array 230 and/or a static random memory array 232. As stated above, the memory controller 228 may be independent or integrated with the master controller 224. The memory controller 228 typically controls volatile memory of some type, such as DRAM (dynamic random memory array 230) and SRAM (static random memory array 232). In other examples, the memory controller 228 also controls other memory types such as electrically erasable programmable read only memory ("EEPROM"), etc. In other embodiments, the memory controller 228 controls two or more memory types and the memory controller 228 may include more than one controller. Typically, the memory controller 228 controls as much SRAM 232 as is feasible and by DRAM 230 to supplement the SRAM 232.

In one embodiment, the logical-to-physical index is stored in memory 230, 232 and then periodically off-loaded to a channel of the solid-state storage media 110n or other non-volatile memory. One of skill in the art will recognize other uses and configurations of the memory controller 228, dynamic memory array 230, and static memory array 232.

In one embodiment, the solid-state storage device controller 202 includes a DMA controller 226 that controls DMA operations between the storage device/cache 102 and one or more external memory controllers 250 and associated external memory arrays 252 and CPUs 248. Note that the external memory controllers 250 and external memory arrays 252 are called external because they are external to the storage device/cache 102. In addition the DMA controller 226 may also control RDMA operations with requesting devices through a NIC 244 and associated RDMA controller 246.

In one embodiment, the solid-state storage device controller 202 includes a management controller 234 connected to a management bus 236. Typically the management controller 234 manages environmental metrics and status of the storage device/cache 102. The management controller 234 may monitor device temperature, fan speed, power supply settings, etc. over the management bus 236. The management controller 234 may support the reading and programming of erasable programmable read only memory ("EEPROM") for storage of FPGA code and controller software. Typically the management bus 236 is connected to the various components within the storage device/cache 102. The management controller 234 may communicate alerts, interrupts, etc. over the local bus 206 or may include a separate connection to a system bus 240 or other bus. In one embodiment the management bus 236 is an Inter-Integrated Circuit ("I2C") bus. One of skill in the art will recognize other related functions and uses of a management controller 234 connected to components of the storage device/cache 102 by a management bus 236.

In one embodiment, the solid-state storage device controller 202 includes miscellaneous logic 242 that may be customized for a specific application. Typically where the solid-state device controller 202 or master controller 224 is/are configured using a FPGA or other configurable controller, custom logic may be included based on a particular application, customer requirement, storage requirement, etc.

Data Pipeline

FIG. 3 is a schematic block diagram illustrating one embodiment 300 of a solid-state storage controller 104 with a write data pipeline 106 and a read data pipeline 108 in a cache 102 in accordance with the present invention. The embodiment 300 includes a data bus 204, a local bus 206, and buffer control 208, which are substantially similar to those described in relation to the solid-state storage device controller 202 of FIG. 2. The write data pipeline 106 includes a packetizer 302 and an error-correcting code ("ECC") generator 304. In other embodiments, the write data pipeline 106 includes an input buffer 306, a write synchronization buffer 308, a write program module 310, a compression module 312, an encryption module 314, a garbage collector bypass 316 (with a portion within the read data pipeline 108), a media encryption module 318, and a write buffer 320. The read data pipeline 108 includes a read synchronization buffer 328, an ECC correction module 322, a depacketizer 324, an alignment module 326, and an output buffer 330. In other embodiments, the read data pipeline 108 may include a media decryption module 332, a portion of the garbage collector bypass 316, a decryption module 334, a decompression module 336, and a read program module 338. The solid-state storage controller 104 may also include control and status registers 340 and control queues 342, a bank interleave controller 344, a synchronization buffer 346, a storage bus controller 348, and a multiplexer ("MUX") 350. The components of the solid-state controller 104 and associated write data pipeline 106 and read data pipeline 108 are described below. In other embodiments, synchronous solid-state storage media 110 may be used and synchronization buffers 308 328 may be eliminated.

Write Data Pipeline

The write data pipeline 106 includes a packetizer 302 that receives a data or metadata segment to be written to the solid-state storage, either directly or indirectly through another write data pipeline 106 stage, and creates one or more packets sized for the solid-state storage media 110. The data or metadata segment is typically part of a data structure such as an object, but may also include an entire data structure. In another embodiment, the data segment is part of a block of data, but may also include an entire block of data. Typically, a set of data such as a data structure is received from a computer such as the host device 114, or other computer or device and is transmitted to the cache 102 in data segments streamed to the cache 102 and/or the host device 114. A data segment may also be known by another name, such as data parcel, but as referenced herein includes all or a portion of a data structure or data block.

Each data structure is stored as one or more packets. Each data structure may have one or more container packets. Each packet contains a header. The header may include a header type field. Type fields may include data, attribute, metadata, data segment delimiters (multi-packet), data structures, data linkages, and the like. The header may also include information regarding the size of the packet, such as the number of bytes of data included in the packet. The length of the packet may be established by the packet type. The header may include information that establishes the relationship of the packet to a data structure. An example might be the use of an offset in a data packet header to identify the location of the data segment within the data structure. One of skill in the art will recognize other information that may be included in a header added to data by a packetizer 302 and other information that may be added to a data packet.

Each packet includes a header and possibly data from the data or metadata segment. The header of each packet includes pertinent information to relate the packet to the data structure to which the packet belongs. For example, the header may include an object identifier or other data structure identifier and offset that indicate the data segment, object, data structure or data block from which the data packet was formed. The header may also include a logical address used by the storage bus controller 348 to store the packet. The header may also include information regarding the size of the packet, such as the number of bytes included in the packet. The header may also include a sequence number that identifies where the data segment belongs with respect to other packets within the data structure when reconstructing the data segment or data structure. The header may include a header type field. Type fields may include data, data structure attributes, metadata, data segment delimiters (multi-packet), data structure types, data structure linkages, and the like. One of skill in the art will recognize other information that may be included in a header added to data or metadata by a packetizer 302 and other information that may be added to a packet.

The write data pipeline 106 includes an ECC generator 304 that that generates one or more error-correcting codes ("ECC") for the one or more packets received from the packetizer 302. The ECC generator 304 typically uses an error correcting algorithm to generate ECC check bits which are stored with the one or more data packets. The ECC codes generated by the ECC generator 304 together with the one or more data packets associated with the ECC codes comprise an ECC chunk. The ECC data stored with the one or more data packets is used to detect and to correct errors introduced into the data through transmission and storage. In one embodiment, packets are streamed into the ECC generator 304 as un-encoded blocks of length N. A syndrome of length S is calculated, appended and output as an encoded block of length N+S. The value of N and S are dependent upon the characteristics of the algorithm which is selected to achieve specific performance, efficiency, and robustness metrics. In one embodiment, there is no fixed relationship between the ECC blocks and the packets; the packet may comprise more than one ECC block; the ECC block may comprise more than one packet; and a first packet may end anywhere within the ECC block and a second packet may begin after the end of the first packet within the same ECC block. In one embodiment, ECC algorithms are not dynamically modified. In one embodiment, the ECC data stored with the data packets is robust enough to correct errors in more than two bits.

Beneficially, using a robust ECC algorithm allowing more than single bit correction or even double bit correction allows the life of the solid-state storage media 110 to be extended. For example, if flash memory is used as the storage medium in the solid-state storage media 110, the flash memory may be written approximately 100,000 times without error per erase cycle. This usage limit may be extended using a robust ECC algorithm. Having the ECC generator 304 and corresponding ECC correction module 322 onboard the cache 102, the cache 102 can internally correct errors and has a longer useful life than if a less robust ECC algorithm is used, such as single bit correction. However, in other embodiments the ECC generator 304 may use a less robust algorithm and may correct single-bit or double-bit errors. In another embodiment, the solid-state storage device 110 may comprise less reliable storage such as multi-level cell ("MLC") flash in order to increase capacity, which storage may not be sufficiently reliable without more robust ECC algorithms.

In one embodiment, the write pipeline 106 includes an input buffer 306 that receives a data segment to be written to the solid-state storage media 110 and stores the incoming data segments until the next stage of the write data pipeline 106, such as the packetizer 302 (or other stage for a more complex write data pipeline 106) is ready to process the next data segment. The input buffer 306 typically allows for discrepancies between the rate data segments are received and processed by the write data pipeline 106 using an appropriately sized data buffer. The input buffer 306 also allows the data bus 204 to transfer data to the write data pipeline 106 at rates greater than can be sustained by the write data pipeline 106 in order to improve efficiency of operation of the data bus 204. Typically when the write data pipeline 106 does not include an input buffer 306, a buffering function is performed elsewhere, such as in the cache 102, but outside the write data pipeline 106, in the host device 114, such as within a network interface card ("NIC"), or at another device, for example when using remote direct memory access ("RDMA").

In another embodiment, the write data pipeline 106 also includes a write synchronization buffer 308 that buffers packets received from the ECC generator 304 prior to writing the packets to the solid-state storage media 110. The write synch buffer 308 is located at a boundary between a local clock domain and a solid-state storage clock domain and provides buffering to account for the clock domain differences. In other embodiments, synchronous solid-state storage media 110 may be used and synchronization buffers 308 328 may be eliminated.

In one embodiment, the write data pipeline 106 also includes a media encryption module 318 that receives the one or more packets from the packetizer 302, either directly or indirectly, and encrypts the one or more packets using an encryption key unique to the cache 102 prior to sending the packets to the ECC generator 304. Typically, the entire packet is encrypted, including the headers. In another embodiment, headers are not encrypted. In this document, encryption key is understood to mean a secret encryption key that is managed externally from a solid-state storage controller 104.

The media encryption module 318 and corresponding media decryption module 332 provide a level of security for data stored in the solid-state storage media 110. For example, where data is encrypted with the media encryption module 318, if the solid-state storage media 110 is connected to a different solid-state storage controller 104, cache 102, or server, the contents of the solid-state storage media 110 typically could not be read without use of the same encryption key used during the write of the data to the solid-state storage media 110 without significant effort.

In a typical embodiment, the cache 102 does not store the encryption key in non-volatile storage and allows no external access to the encryption key. The encryption key is provided to the solid-state storage controller 104 during initialization. The cache 102 may use and store a non-secret cryptographic nonce that is used in conjunction with an encryption key. A different nonce may be stored with every packet. Data segments may be split between multiple packets with unique nonces for the purpose of improving protection by the encryption algorithm.

The encryption key may be received from a host device 114, a server, key manager, or other device that manages the encryption key to be used by the solid-state storage controller 104. In another embodiment, the solid-state storage media 110 may have two or more partitions and the solid-state storage controller 104 behaves as though it was two or more solid-state storage controllers 104, each operating on a single partition within the solid-state storage media 110. In this embodiment, a unique media encryption key may be used with each partition.

In another embodiment, the write data pipeline 106 also includes an encryption module 314 that encrypts a data or metadata segment received from the input buffer 306, either directly or indirectly, prior sending the data segment to the packetizer 302, the data segment encrypted using an encryption key received in conjunction with the data segment. The encryption keys used by the encryption module 314 to encrypt data may not be common to all data stored within the cache 102 but may vary on an per data structure basis and received in conjunction with receiving data segments as described below. For example, an encryption key for a data segment to be encrypted by the encryption module 314 may be received with the data segment or may be received as part of a command to write a data structure to which the data segment belongs. The cache 102 may use and store a non-secret cryptographic nonce in each data structure packet that is used in conjunction with the encryption key. A different nonce may be stored with every packet. Data segments may be split between multiple packets with unique nonces for the purpose of improving protection by the encryption algorithm.

The encryption key may be received from a host device 114, a computer, key manager, or other device that holds the encryption key to be used to encrypt the data segment. In one embodiment, encryption keys are transferred to the solid-state storage controller 104 from one of a cache 102, a computer, a host device 114, or other external agent which has the ability to execute industry standard methods to securely transfer and protect private and public keys.

In one embodiment, the encryption module 314 encrypts a first packet with a first encryption key received in conjunction with the packet and encrypts a second packet with a second encryption key received in conjunction with the second packet. In another embodiment, the encryption module 314 encrypts a first packet with a first encryption key received in conjunction with the packet and passes a second data packet on to the next stage without encryption. Beneficially, the encryption module 314 included in the write data pipeline 106 of the cache 102 allows data structure-by-data structure or segment-by-segment data encryption without a single file system or other external system to keep track of the different encryption keys used to store corresponding data structures or data segments. Each requesting device 155 or related key manager independently manages encryption keys used to encrypt only the data structures or data segments sent by the requesting device 155.

In one embodiment, the encryption module 314 may encrypt the one or more packets using an encryption key unique to the cache 102. The encryption module 314 may perform this media encryption independently, or in addition to the encryption described above. Typically, the entire packet is encrypted, including the headers. In another embodiment, headers are not encrypted. The media encryption by the encryption module 314 provides a level of security for data stored in the solid-state storage media 110. For example, where data is encrypted with media encryption unique to the specific cache 102 if the solid-state storage media 110 is connected to a different solid-state storage controller 104, cache 102, or host device 114, the contents of the solid-state storage media 110 typically could not be read without use of the same encryption key used during the write of the data to the solid-state storage media 110 without significant effort.

In another embodiment, the write data pipeline 106 includes a compression module 312 that compresses the data for metadata segment prior to sending the data segment to the packetizer 302. The compression module 312 typically compresses a data or metadata segment using a compression routine known to those of skill in the art to reduce the storage size of the segment. For example, if a data segment includes a string of 512 zeros, the compression module 312 may replace the 512 zeros with code or token indicating the 512 zeros where the code is much more compact than the space taken by the 512 zeros.

In one embodiment, the compression module 312 compresses a first segment with a first compression routine and passes along a second segment without compression. In another embodiment, the compression module 312 compresses a first segment with a first compression routine and compresses the second segment with a second compression routine. Having this flexibility within the cache 102 is beneficial so that the host device 114 or other devices writing data to the cache 102 may each specify a compression routine or so that one can specify a compression routine while another specifies no compression. Selection of compression routines may also be selected according to default settings on a per data structure type or data structure class basis. For example, a first data structure of a specific data structure may be able to override default compression routine settings and a second data structure of the same data structure class and data structure type may use the default compression routine and a third data structure of the same data structure class and data structure type may use no compression.

In one embodiment, the write data pipeline 106 includes a garbage collector bypass 316 that receives data segments from the read data pipeline 108 as part of a data bypass in a garbage collection system. A garbage collection system typically marks packets that are no longer valid, typically because the packet is marked for deletion or has been modified and the modified data is stored in a different location. At some point, the garbage collection system determines that a particular section of storage may be recovered. This determination may be due to a lack of available storage capacity, the percentage of data marked as invalid reaching a threshold, a consolidation of valid data, an error detection rate for that section of storage reaching a threshold, or improving performance based on data distribution, etc. Numerous factors may be considered by a garbage collection algorithm to determine when a section of storage is to be recovered.

Once a section of storage has been marked for recovery, valid packets in the section typically must be relocated. The garbage collector bypass 316 allows packets to be read into the read data pipeline 108 and then transferred directly to the write data pipeline 106 without being routed out of the solid-state storage controller 104. In one embodiment, the garbage collector bypass 316 is part of an autonomous garbage collector system that operates within the cache 102. This allows the cache 102 to manage data so that data is systematically spread throughout the solid-state storage media 110 to improve performance, data reliability and to avoid overuse and underuse of any one location or area of the solid-state storage media 110 and to lengthen the useful life of the solid-state storage media 110.

The garbage collector bypass 316 coordinates insertion of segments into the write data pipeline 106 with other segments being written by a host device 114 or other devices. In the depicted embodiment, the garbage collector bypass 316 is before the packetizer 302 in the write data pipeline 106 and after the depacketizer 324 in the read data pipeline 108, but may also be located elsewhere in the read and write data pipelines 106, 108. The garbage collector bypass 316 may be used during a flush of the write pipeline 108 to fill the remainder of the virtual page in order to improve the efficiency of storage within the solid-state storage media 110 and thereby reduce the frequency of garbage collection.

In one embodiment, the write data pipeline 106 includes a write buffer 320 that buffers data for efficient write operations. Typically, the write buffer 320 includes enough capacity for packets to fill at least one virtual page in the solid-state storage media 110. This allows a write operation to send an entire page of data to the solid-state storage media 110 without interruption. By sizing the write buffer 320 of the write data pipeline 106 and buffers within the read data pipeline 108 to be the same capacity or larger than a storage write buffer within the solid-state storage media 110, writing and reading data is more efficient since a single write command may be crafted to send a full virtual page of data to the solid-state storage media 110 instead of multiple commands.

While the write buffer 320 is being filled, the solid-state storage media 110 may be used for other read operations. This is advantageous because other solid-state devices with a smaller write buffer or no write buffer may tie up the solid-state storage when data is written to a storage write buffer and data flowing into the storage write buffer stalls. Read operations will be blocked until the entire storage write buffer is filled and programmed. Another approach for systems without a write buffer or a small write buffer is to flush the storage write buffer that is not full in order to enable reads. Again this is inefficient because multiple write/program cycles are required to fill a page.

For depicted embodiment with a write buffer 320 sized larger than a virtual page, a single write command, which includes numerous subcommands, can then be followed by a single program command to transfer the page of data from the storage write buffer in each solid-state storage element 216, 218, 220 to the designated page within each solid-state storage element 216, 218, 220. This technique has the benefits of eliminating partial page programming, which is known to reduce data reliability and durability and freeing up the destination bank for reads and other commands while the buffer fills.

In one embodiment, the write buffer 320 is a ping-pong buffer where one side of the buffer is filled and then designated for transfer at an appropriate time while the other side of the ping-pong buffer is being filled. In another embodiment, the write buffer 320 includes a first-in first-out ("FIFO") register with a capacity of more than a virtual page of data segments. One of skill in the art will recognize other write buffer 320 configurations that allow a virtual page of data to be stored prior to writing the data to the solid-state storage media 110.

In another embodiment, the write buffer 320 is sized smaller than a virtual page so that less than a page of information could be written to a storage write buffer in the solid-state storage media 110. In the embodiment, to prevent a stall in the write data pipeline 106 from holding up read operations, data is queued using the garbage collection system that needs to be moved from one location to another as part of the garbage collection process. In case of a data stall in the write data pipeline 106, the data can be fed through the garbage collector bypass 316 to the write buffer 320 and then on to the storage write buffer in the solid-state storage media 110 to fill the pages of a virtual page prior to programming the data. In this way a data stall in the write data pipeline 106 would not stall reading from the cache 102.

In another embodiment, the write data pipeline 106 includes a write program module 310 with one or more user-definable functions within the write data pipeline 106. The write program module 310 allows a user to customize the write data pipeline 106. A user may customize the write data pipeline 106 based on a particular data requirement or application. Where the solid-state storage controller 104 is an FPGA, the user may program the write data pipeline 106 with custom commands and functions relatively easily. A user may also use the write program module 310 to include custom functions with an ASIC, however, customizing an ASIC may be more difficult than with an FPGA. The write program module 310 may include buffers and bypass mechanisms to allow a first data segment to execute in the write program module 310 while a second data segment may continue through the write data pipeline 106. In another embodiment, the write program module 310 may include a processor core that can be programmed through software.

Note that the write program module 310 is shown between the input buffer 306 and the compression module 312, however, the write program module 310 could be anywhere in the write data pipeline 106 and may be distributed among the various stages 302-320. In addition, there may be multiple write program modules 310 distributed among the various states 302-320 that are programmed and operate independently. In addition, the order of the stages 302-320 may be altered. One of skill in the art will recognize workable alterations to the order of the stages 302-320 based on particular user requirements.

Read Data Pipeline

The read data pipeline 108 includes an ECC correction module 322 that determines if a data error exists in ECC blocks a requested packet received from the solid-state storage media 110 by using ECC stored with each ECC block of the requested packet. The ECC correction module 322 then corrects any errors in the requested packet if any error exists and the errors are correctable using the ECC. For example, if the ECC can detect an error in six bits but can only correct three bit errors, the ECC correction module 322 corrects ECC blocks of the requested packet with up to three bits in error. The ECC correction module 322 corrects the bits in error by changing the bits in error to the correct one or zero state so that the requested data packet is identical to when it was written to the solid-state storage media 110 and the ECC was generated for the packet.

If the ECC correction module 322 determines that the requested packets contains more bits in error than the ECC can correct, the ECC correction module 322 cannot correct the errors in the corrupted ECC blocks of the requested packet and sends an interrupt. In one embodiment, the ECC correction module 322 sends an interrupt with a message indicating that the requested packet is in error. The message may include information that the ECC correction module 322 cannot correct the errors or the inability of the ECC correction module 322 to correct the errors may be implied. In another embodiment, the ECC correction module 322 sends the corrupted ECC blocks of the requested packet with the interrupt and/or the message.

In one embodiment, a corrupted ECC block or portion of a corrupted ECC block of the requested packet that cannot be corrected by the ECC correction module 322 is read by the master controller 224, corrected, and returned to the ECC correction module 322 for further processing by the read data pipeline 108. In one embodiment, a corrupted ECC block or portion of a corrupted ECC block of the requested packet is sent to the device requesting the data. The requesting device 155 may correct the ECC block or replace the data using another copy, such as a backup or mirror copy, and then may use the replacement data of the requested data packet or return it to the read data pipeline 108. The requesting device 155 may use header information in the requested packet in error to identify data required to replace the corrupted requested packet or to replace the data structure to which the packet belongs. In another embodiment, the solid-state storage controller 104 stores data using some type of RAID and is able to recover the corrupted data. In another embodiment, the ECC correction module 322 sends an interrupt and/or message and the receiving device fails the read operation associated with the requested data packet. One of skill in the art will recognize other options and actions to be taken as a result of the ECC correction module 322 determining that one or more ECC blocks of the requested packet are corrupted and that the ECC correction module 322 cannot correct the errors.

The read data pipeline 108 includes a depacketizer 324 that receives ECC blocks of the requested packet from the ECC correction module 322, directly or indirectly, and checks and removes one or more packet headers. The depacketizer 324 may validate the packet headers by checking packet identifiers, data length, data location, etc. within the headers. In one embodiment, the header includes a hash code that can be used to validate that the packet delivered to the read data pipeline 108 is the requested packet. The depacketizer 324 also removes the headers from the requested packet added by the packetizer 302. The depacketizer 324 may directed to not operate on certain packets but pass these forward without modification. An example might be a container label that is requested during the course of a rebuild process where the header information is required for index reconstruction. Further examples include the transfer of packets of various types destined for use within the cache 102. In another embodiment, the depacketizer 324 operation may be packet type dependent.

The read data pipeline 108 includes an alignment module 326 that receives data from the depacketizer 324 and removes unwanted data. In one embodiment, a read command sent to the solid-state storage media 110 retrieves a packet of data. A device requesting the data may not require all data within the retrieved packet and the alignment module 326 removes the unwanted data. If all data within a retrieved page is requested data, the alignment module 326 does not remove any data.

The alignment module 326 re-formats the data as data segments of a data structure in a form compatible with a device requesting the data segment prior to forwarding the data segment to the next stage. Typically, as data is processed by the read data pipeline 108, the size of data segments or packets changes at various stages. The alignment module 326 uses received data to format the data into data segments suitable to be sent to the requesting device 155 and joined to form a response. For example, data from a portion of a first data packet may be combined with data from a portion of a second data packet. If a data segment is larger than a data requested by the requesting device 155, the alignment module 326 may discard the unwanted data.

In one embodiment, the read data pipeline 108 includes a read synchronization buffer 328 that buffers one or more requested packets read from the solid-state storage media 110 prior to processing by the read data pipeline 108. The read synchronization buffer 328 is at the boundary between the solid-state storage clock domain and the local bus clock domain and provides buffering to account for the clock domain differences.

In another embodiment, the read data pipeline 108 includes an output buffer 330 that receives requested packets from the alignment module 326 and stores the packets prior to transmission to the requesting device 155. The output buffer 330 accounts for differences between when data segments are received from stages of the read data pipeline 108 and when the data segments are transmitted to other parts of the solid-state storage controller 104 or to the requesting device 155. The output buffer 330 also allows the data bus 204 to receive data from the read data pipeline 108 at rates greater than can be sustained by the read data pipeline 108 in order to improve efficiency of operation of the data bus 204.

In one embodiment, the read data pipeline 108 includes a media decryption module 332 that receives one or more encrypted requested packets from the ECC correction module 322 and decrypts the one or more requested packets using the encryption key unique to the cache 102 prior to sending the one or more requested packets to the depacketizer 324. Typically the encryption key used to decrypt data by the media decryption module 332 is identical to the encryption key used by the media encryption module 318. In another embodiment, the solid-state storage media 110 may have two or more partitions and the solid-state storage controller 104 behaves as though it was two or more solid-state storage controllers 104 each operating on a single partition within the solid-state storage media 110. In this embodiment, a unique media encryption key may be used with each partition.

In another embodiment, the read data pipeline 108 includes a decryption module 334 that decrypts a data segment formatted by the depacketizer 324 prior to sending the data segment to the output buffer 330. The data segment may be decrypted using an encryption key received in conjunction with the read request that initiates retrieval of the requested packet received by the read synchronization buffer 328. The decryption module 334 may decrypt a first packet with an encryption key received in conjunction with the read request for the first packet and then may decrypt a second packet with a different encryption key or may pass the second packet on to the next stage of the read data pipeline 108 without decryption. When the packet was stored with a non-secret cryptographic nonce, the nonce is used in conjunction with an encryption key to decrypt the data packet. The encryption key may be received from a host device 114, a computer, key manager, or other device that manages the encryption key to be used by the solid-state storage controller 104.

In another embodiment, the read data pipeline 108 includes a decompression module 336 that decompresses a data segment formatted by the depacketizer 324. In one embodiment, the decompression module 336 uses compression information stored in one or both of the packet header and the container label to select a complementary routine to that used to compress the data by the compression module 312. In another embodiment, the decompression routine used by the decompression module 336 is dictated by the device requesting the data segment being decompressed. In another embodiment, the decompression module 336 selects a decompression routine according to default settings on a per data structure type or data structure class basis. A first packet of a first object may be able to override a default decompression routine and a second packet of a second data structure of the same data structure class and data structure type may use the default decompression routine and a third packet of a third data structure of the same data structure class and data structure type may use no decompression.

In another embodiment, the read data pipeline 108 includes a read program module 338 that includes one or more user-definable functions within the read data pipeline 108. The read program module 338 has similar characteristics to the write program module 310 and allows a user to provide custom functions to the read data pipeline 108. The read program module 338 may be located as shown in FIG. 3, may be located in another position within the read data pipeline 108, or may include multiple parts in multiple locations within the read data pipeline 108. Additionally, there may be multiple read program modules 338 within multiple locations within the read data pipeline 108 that operate independently. One of skill in the art will recognize other forms of a read program module 338 within a read data pipeline 108. As with the write data pipeline 106, the stages of the read data pipeline 108 may be rearranged and one of skill in the art will recognize other orders of stages within the read data pipeline 108.

The solid-state storage controller 104 includes control and status registers 340 and corresponding control queues 342. The control and status registers 340 and control queues 342 facilitate control and sequencing commands and subcommands associated with data processed in the write and read data pipelines 106, 108. For example, a data segment in the packetizer 302 may have one or more corresponding control commands or instructions in a control queue 342 associated with the ECC generator 304. As the data segment is packetized, some of the instructions or commands may be executed within the packetizer 302. Other commands or instructions may be passed to the next control queue 342 through the control and status registers 340 as the newly formed data packet created from the data segment is passed to the next stage.

Commands or instructions may be simultaneously loaded into the control queues 342 for a packet being forwarded to the write data pipeline 106 with each pipeline stage pulling the appropriate command or instruction as the respective packet is executed by that stage. Similarly, commands or instructions may be simultaneously loaded into the control queues 342 for a packet being requested from the read data pipeline 108 with each pipeline stage pulling the appropriate command or instruction as the respective packet is executed by that stage. One of skill in the art will recognize other features and functions of control and status registers 340 and control queues 342.

Figure 4:
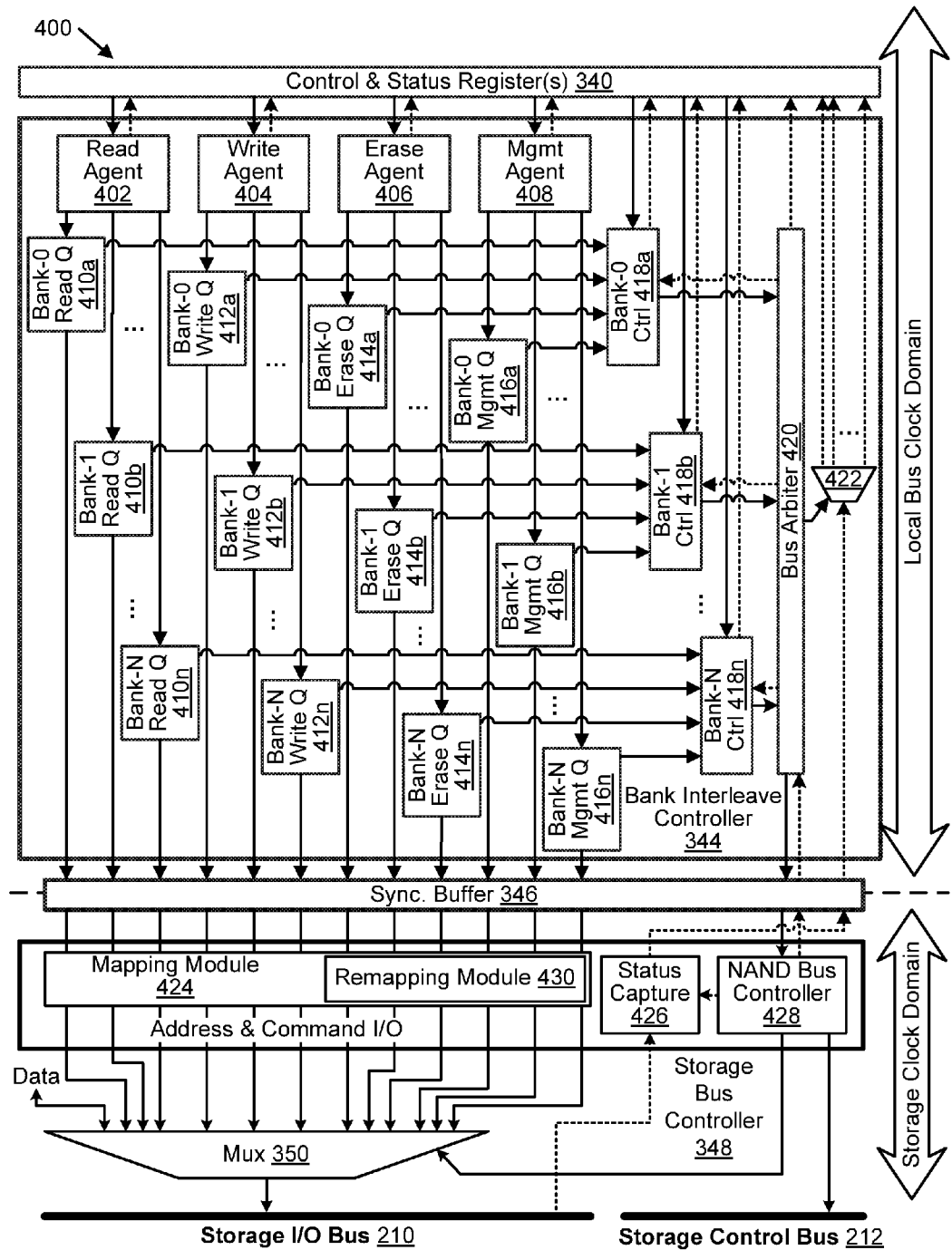
FIG. 4 is a schematic block diagram illustrating one embodiment of a bank interleave controller in the solid-state storage controller in accordance with the present invention.

The solid-state storage controller 104 and or the cache 102 may also include a bank interleave controller 344, a synchronization buffer 346, a storage bus controller 348, and a multiplexer ("MUX") 350, which are described in relation to FIG. 4.

Bank Interleave

FIG. 4 is a schematic block diagram illustrating one embodiment 400 of a bank interleave controller 344 in the solid-state storage controller 104 in accordance with the present invention. The bank interleave controller 344 is connected to the control and status registers 340 and to the storage I/O bus 210 and storage control bus 212 through the MUX 350, storage bus controller 348, and synchronization buffer 346, which are described below. The bank interleave controller 344 includes a read agent 402, a write agent 404, an erase agent 406, a management agent 408, read queues 410a-n, write queues 412a-n, erase queues 414a-n, and management queues 416a-n for the banks 214 in the solid-state storage media 110, bank controllers 418a-n, a bus arbiter 420, and a status MUX 422, which are described below. The storage bus controller 348 includes a mapping module 424 with a remapping module 430, a status capture module 426, and a NAND bus controller 428, which are described below.

The bank interleave controller 344 directs one or more commands to two or more queues in the bank interleave controller 104 and coordinates among the banks 214 of the solid-state storage media 110 execution of the commands stored in the queues, such that a command of a first type executes on one bank 214a while a command of a second type executes on a second bank 214b. The one or more commands are separated by command type into the queues. Each bank 214 of the solid-state storage media 110 has a corresponding set of queues within the bank interleave controller 344 and each set of queues includes a queue for each command type.

The bank interleave controller 344 coordinates among the banks 214 of the solid-state storage media 110 execution of the commands stored in the queues. For example, a command of a first type executes on one bank 214a while a command of a second type executes on a second bank 214b. Typically the command types and queue types include read and write commands and queues 410, 412, but may also include other commands and queues that are storage media specific. For example, in the embodiment depicted in FIG. 4, erase and management queues 414, 416 are included and would be appropriate for flash memory, NRAM, MRAM, DRAM, PRAM, etc.

For other types of solid-state storage media 110, other types of commands and corresponding queues may be included without straying from the scope of the invention. The flexible nature of an FPGA solid-state storage controller 104 allows flexibility in storage media. If flash memory were changed to another solid-state storage type, the bank interleave controller 344, storage bus controller 348, and MUX 350 could be altered to accommodate the media type without significantly affecting the data pipelines 106, 108 and other solid-state storage controller 104 functions.

In the embodiment depicted in FIG. 4, the bank interleave controller 344 includes, for each bank 214, a read queue 410 for reading data from the solid-state storage media 110, a write queue 412 for write commands to the solid-state storage media 110, an erase queue 414 for erasing an erase block in the solid-state storage, an a management queue 416 for management commands. The bank interleave controller 344 also includes corresponding read, write, erase, and management agents 402, 404, 406, 408. In another embodiment, the control and status registers 340 and control queues 342 or similar components queue commands for data sent to the banks 214 of the solid-state storage media 110 without a bank interleave controller 344.

The agents 402, 404, 406, 408, in one embodiment, direct commands of the appropriate type destined for a particular bank 214a to the correct queue for the bank 214a. For example, the read agent 402 may receive a read command for bank-1 214b and directs the read command to the bank-1 read queue 410b. The write agent 404 may receive a write command to write data to a location in bank-0 214a of the solid-state storage media 110 and will then send the write command to the bank-0 write queue 412a. Similarly, the erase agent 406 may receive an erase command to erase an erase block in bank-1 214b and will then pass the erase command to the bank-1 erase queue 414b. The management agent 408 typically receives management commands, status requests, and the like, such as a reset command or a request to read a configuration register of a bank 214, such as bank-0 214a. The management agent 408 sends the management command to the bank-0 management queue 416a.

The agents 402, 404, 406, 408 typically also monitor status of the queues 410, 412, 414, 416 and send status, interrupt, or other messages when the queues 410, 412, 414, 416 are full, nearly full, non-functional, etc. In one embodiment, the agents 402, 404, 406, 408 receive commands and generate corresponding sub-commands. In one embodiment, the agents 402, 404, 406, 408 receive commands through the control & status registers 340 and generate corresponding sub-commands which are forwarded to the queues 410, 412, 414, 416. One of skill in the art will recognize other functions of the agents 402, 404, 406, 408.

The queues 410, 412, 414, 416 typically receive commands and store the commands until required to be sent to the solid-state storage banks 214. In a typical embodiment, the queues 410, 412, 414, 416 are first-in, first-out ("FIFO") registers or a similar component that operates as a FIFO. In another embodiment, the queues 410, 412, 414, 416 store commands in an order that matches data, order of importance, or other criteria.

The bank controllers 418 typically receive commands from the queues 410, 412, 414, 416 and generate appropriate sub-commands. For example, the bank-0 write queue 412a may receive a command to write a page of data packets to bank-0 214a. The bank-0 controller 418a may receive the write command at an appropriate time and may generate one or more write subcommands for each data packet stored in the write buffer 320 to be written to the page in bank-0 214a. For example, bank-0 controller 418a may generate commands to validate the status of bank 0 214a and the solid-state storage array 216, select the appropriate location for writing one or more data packets, clear the input buffers within the solid-state storage memory array 216, transfer the one or more data packets to the input buffers, program the input buffers into the selected location, verify that the data was correctly programmed, and if program failures occur do one or more of interrupting the master controller 224, retrying the write to the same physical location, and retrying the write to a different physical location. Additionally, in conjunction with example write command, the storage bus controller 348 will cause the one or more commands to multiplied to each of the each of the storage I/O buses 210*a-n* with the logical address of the command mapped to a first physical addresses for storage I/O bus 210*a*, and mapped to a second physical address for storage I/O bus 210*b*, and so forth as further described below.

Typically, bus arbiter 420 selects from among the bank controllers 418 and pulls subcommands from output queues within the bank controllers 418 and forwards these to the Storage Bus Controller 348 in a sequence that optimizes the performance of the banks 214. In another embodiment, the bus arbiter 420 may respond to a high level interrupt and modify the normal selection criteria. In another embodiment, the master controller 224 can control the bus arbiter 420 through the control and status registers 340. One of skill in the art will recognize other means by which the bus arbiter 420 may control and interleave the sequence of commands from the bank controllers 418 to the solid-state storage media 110.

The bus arbiter 420 typically coordinates selection of appropriate commands, and corresponding data when required for the command type, from the bank controllers 418 and sends the commands and data to the storage bus controller 348. The bus arbiter 420 typically also sends commands to the storage control bus 212 to select the appropriate bank 214. For the case of flash memory or other solid-state storage media 110 with an asynchronous, bi-directional serial storage I/O bus 210, only one command (control information) or set of data can be transmitted at a time. For example, when write commands or data are being transmitted to the solid-state storage media 110 on the storage I/O bus 210, read commands, data being read, erase commands, management commands, or other status commands cannot be transmitted on the storage I/O bus 210. For example, when data is being read from the storage I/O bus 210, data cannot be written to the solid-state storage media 110.

For example, during a write operation on bank-0 the bus arbiter 420 selects the bank-0 controller 418*a* which may have a write command or a series of write sub-commands on the top of its queue which cause the storage bus controller 348 to execute the following sequence. The bus arbiter 420 forwards the write command to the storage bus controller 348, which sets up a write command by selecting bank-0 214*a* through the storage control bus 212, sending a command to clear the input buffers of the solid-state storage elements 110 associated with the bank-0 214*a*, and sending a command to validate the status of the solid-state storage elements 216, 218, 220 associated with the bank-0 214*a*. The storage bus controller 348 then transmits a write subcommand on the storage I/O bus 210, which contains the physical addresses including the address of the logical erase block for each individual physical erase solid-stage storage element 216*a-m* as mapped from the logical erase block address. The storage bus controller 348 then muxes the write buffer 320 through the write sync buffer 308 to the storage I/O bus 210 through the MUX 350 and streams write data to the appropriate page. When the page is full, then storage bus controller 348 causes the solid-state storage elements 216*a-m* associated with the bank-0 214*a* to program the input buffer to the memory cells within the solid-state storage elements 216*a-m*. Finally, the storage bus controller 348 validates the status to ensure that page was correctly programmed.

A read operation is similar to the write example above. During a read operation, typically the bus arbiter 420, or other component of the bank interleave controller 344, receives data and corresponding status information and sends the data to the read data pipeline 108 while sending the status information on to the control and status registers 340. Typically, a read data command forwarded from bus arbiter 420 to the storage bus controller 348 will cause the MUX 350 to gate the read data on storage I/O bus 210 to the read data pipeline 108 and send status information to the appropriate control and status registers 340 through the status MUX 422.

The bus arbiter 420 coordinates the various command types and data access modes so that only an appropriate command type or corresponding data is on the bus at any given time. If the bus arbiter 420 has selected a write command, and write subcommands and corresponding data are being written to the solid-state storage media 110, the bus arbiter 420 will not allow other command types on the storage I/O bus 210. Beneficially, the bus arbiter 420 uses timing information, such as predicted command execution times, along with status information received concerning bank 214 status to coordinate execution of the various commands on the bus with the goal of minimizing or eliminating idle time of the busses.

The master controller 224 through the bus arbiter 420 typically uses expected completion times of the commands stored in the queues 410, 412, 414, 416, along with status information, so that when the subcommands associated with a command are executing on one bank 214*a*, other subcommands of other commands are executing on other banks 214*b-n*. When one command is fully executed on a bank 214*a*, the bus arbiter 420 directs another command to the bank 214*a*. The bus arbiter 420 may also coordinate commands stored in the queues 410, 412, 414, 416 with other commands that are not stored in the queues 410, 412, 414, 416.

For example, an erase command may be sent out to erase a group of erase blocks within the solid-state storage media 110. An erase command may take 10 to 1000 times more time to execute than a write or a read command or 10 to 100 times more time to execute than a program command. For N banks 214, the bank interleave controller 344 may split the erase command into N commands, each to erase a virtual erase block of a bank 214*a*. While bank-0 214*a* is executing an erase command, the bus arbiter 420 may select other commands for execution on the other banks 214*b-n*. The bus arbiter 420 may also work with other components, such as the storage bus controller 348, the master controller 224, etc., to coordinate command execution among the buses. Coordinating execution of commands using the bus arbiter 420, bank controllers 418, queues 410, 412, 414, 416, and agents 402, 404, 406, 408 of the bank interleave controller 344 can dramatically increase performance over other solid-state storage systems without a bank interleave function.

In one embodiment, the solid-state controller 104 includes one bank interleave controller 344 that serves all of the storage elements 216, 218, 220 of the solid-state storage media 110. In another embodiment, the solid-state controller 104 includes a bank interleave controller 344 for each column of storage elements 216*a-m*, 218*a-m*, 220*a-m*. For example, one bank interleave controller 344 serves one column of storage elements SSS 0.0-SSS M.0 216*a*, 216*b*, . . . 216*m*, a second bank interleave controller 344 serves a second column of storage elements SSS 0.1-SSS M.1 218*a*, 218*b*, . . . 218*m* etc.

Storage-Specific Components

The solid-state storage controller 104 includes a synchronization buffer 346 that buffers commands and status messages sent and received from the solid-state storage media 110. The synchronization buffer 346 is located at the boundary between the solid-state storage clock domain and the local bus clock domain and provides buffering to account for the clock domain differences. The synchronization buffer 346, write synchronization buffer 308, and read synchronization buffer 328 may be independent or may act together to buffer data, commands, status messages, etc. In one embodiment, the synchronization buffer 346 is located where there are the fewest number of signals crossing the clock domains. One skilled in the art will recognize that synchronization between clock domains may be arbitrarily moved to other locations within the cache 102 in order to optimize some aspect of design implementation.

The solid-state storage controller 104 includes a storage bus controller 348 that interprets and translates commands for data sent to and read from the solid-state storage media 110 and status messages received from the solid-state storage media 110 based on the type of solid-state storage media 110. For example, the storage bus controller 348 may have different timing requirements for different types of storage, storage with different performance characteristics, storage from different manufacturers, etc. The storage bus controller 348 also sends control commands to the storage control bus 212.

In one embodiment, the solid-state storage controller 104 includes a MUX 350 that comprises an array of multiplexers 350a-n where each multiplexer is dedicated to a row in the solid-state storage array 110. For example, multiplexer 350a is associated with solid-state storage elements 216a, 218a, 220a. MUX 350 routes the data from the write data pipeline 106 and commands from the storage bus controller 348 to the solid-state storage media 110 via the storage I/O bus 210 and routes data and status messages from the solid-state storage media 110 via the storage I/O bus 210 to the read data pipeline 108 and the control and status registers 340 through the storage bus controller 348, synchronization buffer 346, and bank interleave controller 344.

In one embodiment, the solid-state storage controller 104 includes a MUX 350 for each row of solid-state storage elements (e.g. SSS 0.1 216a, SSS 0.2 218a, SSS 0.N 220a). A MUX 350 combines data from the write data pipeline 106 and commands sent to the solid-state storage media 110 via the storage I/O bus 210 and separates data to be processed by the read data pipeline 108 from commands. Packets stored in the write buffer 320 are directed on busses out of the write buffer 320 through a write synchronization buffer 308 for each row of solid-state storage elements (SSS x.0 to SSS x.N 216, 218, 220) to the MUX 350 for each row of solid-state storage elements (SSS x.0 to SSS x.N 216, 218, 220). The commands and read data are received by the MUXes 350 from the storage I/O bus 210. The MUXes 350 also direct status messages to the storage bus controller 348.

The storage bus controller 348 includes a mapping module 424. The mapping module 424 maps a logical address of an erase block to one or more physical addresses of an erase block. For example, a solid-state storage media 110 with an array of twenty storage elements (e.g. SSS 0.0 to SSS M.0 216) per block 214a may have a logical address for a particular erase block mapped to twenty physical addresses of the erase block, one physical address per storage element. Because the storage elements are accessed in parallel, erase blocks at the same position in each storage element in a row of storage elements 216a, 218a, 220a will share a physical address. To select one erase block (e.g. in storage element SSS 0.0 216a) instead of all erase blocks in the row (e.g. in storage elements SSS 0.0, 0.1, . . . 0.N 216a, 218a, 220a), one bank (in this case bank-0 214a) is selected.

This logical-to-physical mapping for erase blocks is beneficial because if one erase block becomes damaged or inaccessible, the mapping can be changed to map to another erase block. This mitigates the loss of losing an entire virtual erase block when one element's erase block is faulty. The remapping module 430 changes a mapping of a logical address of an erase block to one or more physical addresses of a virtual erase block (spread over the array of storage elements). For example, virtual erase block 1 may be mapped to erase block 1 of storage element SSS 0.0 216a, to erase block 1 of storage element SSS 1.0 216b, . . . , and to storage element M.0 216m, virtual erase block 2 may be mapped to erase block 2 of storage element SSS 0.1 218a, to erase block 2 of storage element SSS 1.1 218b, . . . , and to storage element M.1 218m, etc. Alternatively, virtual erase block 1 may be mapped to one erase block from each storage element in an array such that virtual erase block 1 includes erase block 1 of storage element SSS 0.0 216a to erase block 1 of storage element SSS 1.0 216b to storage element M.0 216m, and erase block 1 of storage element SSS 0.1 218a to erase block 1 of storage element SSS 1.1 218b, . . . , and to storage element M.1 218m, for each storage element in the array up to erase block 1 of storage element M.N 220m.

If erase block 1 of a storage element SSS0.0 216a is damaged, experiencing errors due to wear, etc., or cannot be used for some reason, the remapping module 430 could change the logical-to-physical mapping for the logical address that pointed to erase block 1 of virtual erase block 1. If a spare erase block (call it erase block 221) of storage element SSS 0.0 216a is available and currently not mapped, the remapping module 430 could change the mapping of virtual erase block 1 to point to erase block 221 of storage element SSS 0.0 216a, while continuing to point to erase block 1 of storage element SSS 1.0 216b, erase block 1 of storage element SSS 2.0 (not shown) . . . , and to storage element M.0 216m. The mapping module 424 or remapping module 430 could map erase blocks in a prescribed order (virtual erase block 1 to erase block 1 of the storage elements, virtual erase block 2 to erase block 2 of the storage elements, etc.) or may map erase blocks of the storage elements 216, 218, 220 in another order based on some other criteria.

In one embodiment, the erase blocks could be grouped by access time. Grouping by access time, meaning time to execute a command, such as programming (writing) data into pages of specific erase blocks, can level command completion so that a command executed across the erase blocks of a virtual erase block is not limited by the slowest erase block. In other embodiments, the erase blocks may be grouped by wear level, health, etc. One of skill in the art will recognize other factors to consider when mapping or remapping erase blocks.

In one embodiment, the storage bus controller 348 includes a status capture module 426 that receives status messages from the solid-state storage media 110 and sends the status messages to the status MUX 422. In another embodiment, when the solid-state storage media 110 is flash memory, the storage bus controller 348 includes a NAND bus controller 428. The NAND bus controller 428 directs commands from the read and write data pipelines 106, 108 to the correct location in the solid-state storage media 110, coordinates timing of command execution based on characteristics of the flash memory, etc. If the solid-state storage media 110 is another solid-state storage type, the NAND bus controller 428 would be replaced by a bus controller specific to the storage type. One of skill in the art will recognize other functions of a NAND bus controller 428.

Data Caching

Figure 5:
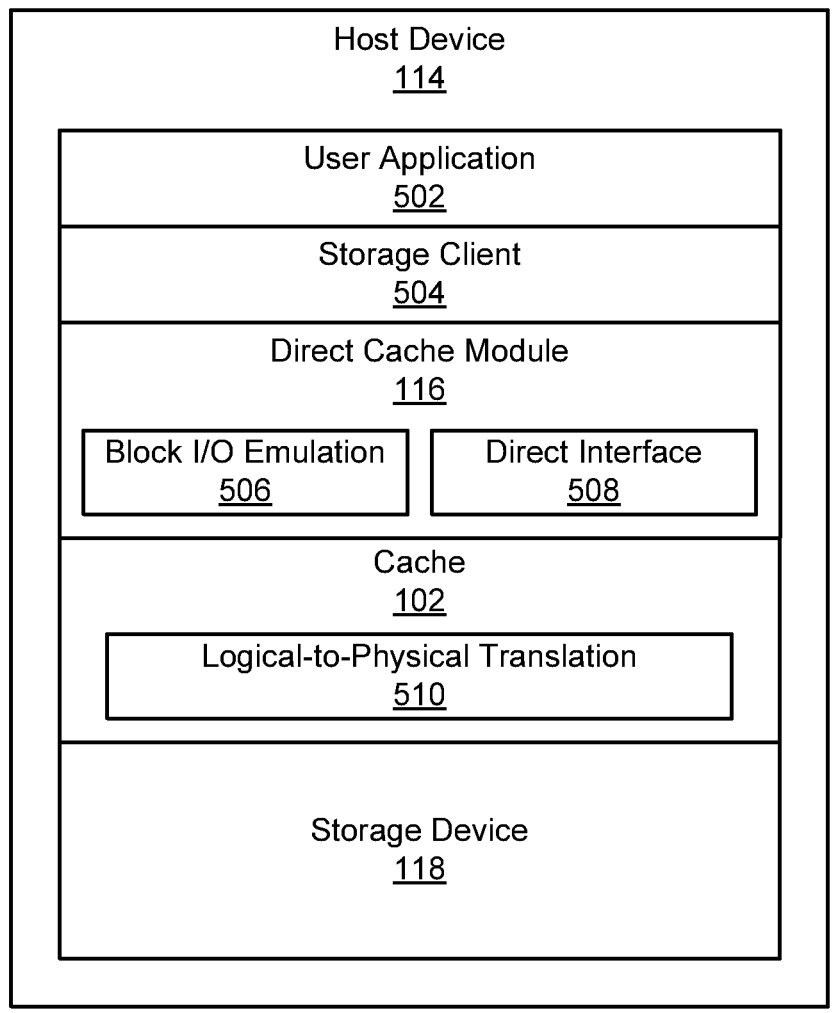
FIG. 5 is a schematic block diagram illustrating one embodiment of a host device in accordance with the present invention.

FIG. 5 depicts one embodiment of a host device 114. The host device 114 may be similar, in certain embodiments, to the host device 114 depicted in FIG. 1. The depicted embodiment includes a user application 502 in communication with a storage client 504. The storage client 504 is in communication with a direct cache module 116, which, in one embodiment, is substantially similar to the direct cache module 116 of FIG. 1, described above. The direct cache module 116, in the depicted embodiment, is in communication with the cache 102 and the storage device 118.

In one embodiment, the user application 502 is a software application operating on or in conjunction with the storage client 504. The storage client 504 manages file systems, files, data, and the like and utilizes the functions and features of the direct cache module 116, the cache 102, and the storage device 118. Representative examples of storage clients include, but are not limited to, a server, a file system, an operating system, a database management system ("DBMS"), a volume manager, and the like.

In the depicted embodiment, the storage client 504 is in communication with the direct cache module 116. In a further embodiment, the storage client 504 may also be in communication with the cache 102 and/or the storage device 118 directly. The storage client 504, in one embodiment, reads data from and writes data to the storage device 118 through the direct cache module 116, which uses the cache 102 to cache read data and write data for the storage device 118. In a further embodiment, the direct cache module 116 caches data in a manner that is substantially transparent to the storage client 504, with the storage client 504 sending read requests and write requests directly to the direct cache module 116.

In one embodiment, the direct cache module 116 has exclusive access to, and/or control over the cache 102 and the storage device 118. The direct cache module 116 may represent itself to the storage client 504 as a storage device. For example, the direct cache module 116 may represent itself as a conventional block storage device. In a particular embodiment, the direct cache module 116 may represent itself to the storage client 504 as a storage device having the same number of logical blocks (0 to N) as the storage device 118.

In another embodiment, the direct cache module 116 may represent itself to the storage client 504 as a storage device have the more logical blocks (0 to N+X) as the storage device 118, where X=the number of logical blocks addressable by the direct cache module 116 beyond N. In certain embodiments, X=2^64−N.

As described above with regard to the direct cache module 116 depicted in the embodiment of FIG. 1, in various embodiments, the direct cache module 116 may be embodied by one or more of a storage controller of the cache 102 and/or a storage controller of the storage device 118; a separate hardware controller device that interfaces with the cache 102 and the storage device 118; a device driver/software controller loaded on the host device 114; and the like.

In one embodiment, the host device 114 loads a device driver for the direct cache module 116. In a further embodiment, the host device 114 loads device drivers for the cache 102 and/or the storage device 118. The direct cache module 116 may communicate with the cache 102 and/or the storage device 118 through device drivers loaded on the host device 114, through a storage controller of the cache 102 and/or through a storage controller of the storage device 118, or the like. Hardware and/or software elements of the direct cache module 116 may form a cache controller for the cache 102 and may be in communication with the solid-state storage controller 104, sending commands to the solid-state storage controller 104 to manage operation of the cache 102.

In one embodiment, the storage client 504 communicates with the direct cache module 116 through an input/output ("I/O") interface represented by a block I/O emulation layer 506. In certain embodiments, the fact that the direct cache module 116 is providing caching services in front of one or more caches 102, and/or one or more backing stores, such as the storage device 118, may be transparent to the storage client 504. In such an embodiment, the direct cache module 116 may present (i.e. identify itself as) a conventional block device to the storage client 504.

In a further embodiment, the cache 102 and/or the storage device 118 either include a distinct block I/O emulation layer 506 or are conventional block storage devices. Certain conventional block storage devices divide the storage media into volumes or partitions. Each volume or partition may include a plurality of sectors. One or more sectors are organized into a logical block. In certain storage systems, such as those interfacing with the Windows® operating systems, the logical blocks are referred to as clusters. In other storage systems, such as those interfacing with UNIX, Linux, or similar operating systems, the logical blocks are referred to simply as blocks. A logical block or cluster represents a smallest physical amount of storage space on the storage media that is addressable by the storage client 504. A block storage device may associate n logical blocks available for user data storage across the storage media with a logical block address, numbered from 0 to n. In certain block storage devices, the logical block addresses may range from 0 to n per volume or partition. In conventional block storage devices, a logical block address maps directly to a particular logical block. In conventional block storage devices, each logical block maps to a particular set of physical sectors on the storage media.

However, the direct cache module 116, the cache 102 and/or the storage device 118 may not directly or necessarily associate logical block addresses with particular physical blocks. The direct cache module 116, the cache 102, and/or the storage device 118 may emulate a conventional block storage interface to maintain compatibility with block storage clients 504 and with conventional block storage commands and protocols.

When the storage client 504 communicates through the block I/O emulation layer 506, the direct cache module 116 appears to the storage client 504 as a conventional block storage device. In one embodiment, the direct cache module 116 provides the block I/O emulation layer 506 which serves as a block device interface, or API. In this embodiment, the storage client 504 communicates with the direct cache module 116 through this block device interface. In one embodiment, the block I/O emulation layer 506 receives commands and logical block addresses from the storage client 504 in accordance with this block device interface. As a result, the block I/O emulation layer 506 provides the direct cache module 116 compatibility with block storage clients 504. In a further embodiment, the direct cache module 116 may communicate with the cache 102 and/or the storage device 118 using corresponding block device interfaces.

In one embodiment, a storage client 504 communicates with the direct cache module 116 through a direct interface layer 508. In this embodiment, the direct cache module 116 directly exchanges information specific to the cache 102 and/or the storage device 118 with the storage client 504. Similarly, the direct cache module 116, in one embodiment, may communicate with the cache 102 and/or the storage device 118 through direct interface layers 508.

A direct cache module 116 using the direct interface 508 may store data on the cache 102 and/or the storage device 118 as blocks, sectors, pages, logical blocks, logical pages, erase blocks, logical erase blocks, ECC chunks or in any other format or structure advantageous to the technical characteristics of the cache 102 and/or the storage device 118. For example, in one embodiment, the storage device 118 comprises a hard disk drive and the direct cache module 116 stores data on the storage device 118 as contiguous sectors of 512 bytes, or the like, using physical cylinder-head-sector addresses for each sector, logical block addresses for each sector, or the like. The direct cache module 116 may receive a logical address and a command from the storage client 504 and perform the corresponding operation in relation to the cache 102, and/or the storage device 118. The direct cache module 116, the cache 102, and/or the storage device 118 may support a block I/O emulation layer 506, a direct interface 508, or both a block I/O emulation layer 506 and a direct interface 508.

As described above, certain storage devices, while appearing to a storage client 504 to be a block storage device, do not directly associate particular logical block addresses with particular physical blocks, also referred to in the art as sectors. Such storage devices may use a logical-to-physical translation layer 510. In the depicted embodiment, the cache 102 includes a logical-to-physical translation layer 510. In a further embodiment, the storage device 118 may also include a logical-to-physical translation layer 510. In another embodiment, the direct cache module 116 maintains a single logical-to-physical translation layer 510 for the cache 102 and the storage device 118. In another embodiment, the direct cache module 116 maintains a distinct logical-to-physical translation layer 510 for each of the cache 102 and the storage device 118.

The logical-to-physical translation layer 510 provides a level of abstraction between the logical block addresses used by the storage client 504 and the physical block addresses at which the cache 102 and/or the storage device 118 store the data. In the depicted embodiment, the logical-to-physical translation layer 510 maps logical block addresses to physical block addresses of data stored on the media of the cache 102. This mapping allows data to be referenced in a logical address space using logical identifiers, such as a logical block address. A logical identifier does not indicate the physical location of data in the cache 102, but is an abstract reference to the data. The mapping module 424 and the remapping module 430 of FIG. 4, discussed above, are one example of a logical-to-physical translation layer 510. Further examples of a logical-to-physical translation layer 510, in various embodiments, include the direct mapping module 606 of FIGS. 6 and 7, the forward mapping module 802 of FIG. 8, and the reverse mapping module 804 of FIG. 8, each of which are discussed below.

In the depicted embodiment, the cache 102 and the storage device 118 separately manage the physical block addresses in the distinct, separate physical address spaces of the cache 102 and the storage device 118. In one example, contiguous logical block addresses may in fact be stored in non-contiguous physical block addresses as the logical-to-physical translation layer 510 determines the location on the physical media of the cache 102 at which to perform data operations.

Furthermore, in one embodiment, the logical address space of the cache 102 is substantially larger than the physical address space or storage capacity of the cache 102. This "thinly provisioned" or "sparse address space" embodiment, allows the number of logical addresses for data references to greatly exceed the number of possible physical addresses. A thinly provisioned and/or sparse address space also allows the cache 102 to cache data for a storage device 118 with a larger address space (i.e. a larger storage capacity) than the physical address space of the cache 102.

In one embodiment, the logical-to-physical translation layer 510 includes a map or index that maps logical block addresses to physical block addresses. The map or index may be in the form of a B-tree, a content addressable memory ("CAM"), a binary tree, and/or a hash table, and the like. In certain embodiments, the logical-to-physical translation layer 510 is a tree with nodes that represent logical block addresses and include references to corresponding physical block addresses. Example embodiments of B-tree mapping structure are described below with regard to FIGS. 10 and 11.

As stated above, in conventional block storage devices, a logical block address maps directly to a particular physical block. When a storage client 504 communicating with the conventional block storage device deletes data for a particular logical block address, the storage client 504 may note that the particular logical block address is deleted and can re-use the physical block associated with that deleted logical block address without the need to perform any other action.

Conversely, when a storage client 504, communicating with a storage controller 104 or device driver with a logical-to-physical translation layer 510 (a storage controller 104 or device driver that does not map a logical block address directly to a particular physical block), deletes data of a logical block address, the corresponding physical block address may remain allocated because the storage client 504 may not communicate the change in used blocks to the storage controller 104 or device driver. The storage client 504 may not be configured to communicate changes in used blocks (also referred to herein as "data block usage information"). Because the storage client 504, in one embodiment, uses the block I/O emulation 506 layer, the storage client 504 may erroneously believe that the direct cache module 116, the cache 102, and/or the storage device 118 is a conventional block storage device that would not utilize the data block usage information. Or, in certain embodiments, other software layers between the storage client 504 and the direct cache module 116, the cache 102, and/or the storage device 118 may fail to pass on data block usage information.

Consequently, the storage controller 104 or device driver may preserve the relationship between the logical block address and a physical address and the data on the cache 102 and/or the storage device 118 corresponding to the physical block. As the number of allocated blocks increases, the performance of the cache 102 and/or the storage device 118 may suffer depending on the configuration of the cache 102 and/or the storage device 118.

Specifically, in certain embodiments, the cache 102, and/or the storage device 118 are configured to store data sequentially, using an append-only writing process, and use a storage space recovery process that re-uses non-volatile storage media storing deallocated/unused logical blocks. Specifically, as described above, the cache 102, and/or the storage device 118 may sequentially write data on the solid-state storage media 110 in a log structured format and within one or more physical structures of the storage elements, the data is sequentially stored on the solid-state storage media 110. Those of skill in the art will recognize that other embodiments that include several caches 102 can use the same append-only writing process and storage space recovery process.

As a result of storing data sequentially and using an append-only writing process, the cache 102 and/or the storage device 118 achieve a high write throughput and a high number of I/O operations per second ("IOPS"). The cache 102 and/or the storage device 118 may include a storage space recovery, or garbage collection process that re-uses data storage cells to provide sufficient storage capacity. The storage space recovery process reuses storage cells for logical blocks marked as deallocated, invalid, unused, or otherwise designated as available for storage space recovery in the logical-physical translation layer 510. In one embodiment, the direct cache module 116 marks logical blocks as deallocated or invalid based on a cache eviction policy, to recover storage capacity for caching additional data for the storage device 118. The storage space recovery process is described in greater detail below with regard to the garbage collection module 710 of FIG. 7.

As described above, the storage space recovery process determines that a particular section of storage may be recovered. Once a section of storage has been marked for recovery, the cache 102 and/or the storage device 118 may relocate valid blocks in the section. The storage space recovery process, when relocating valid blocks, copies the packets and writes them to another location so that the particular section of storage may be reused as available storage space, typically after an erase operation on the particular section. The cache 102 and/or the storage device 118 may then use the available storage space to continue sequentially writing data in an append-only fashion. Consequently, the storage controller 104 expends resources and overhead in preserving data in valid blocks. Therefore, physical blocks corresponding to deleted logical blocks may be unnecessarily preserved by the storage controller 104, which expends unnecessary resources in relocating the physical blocks during storage space recovery.

Some storage devices are configured to receive messages or commands notifying the storage device of these unused logical blocks so that the storage device may deallocate the corresponding physical blocks. As used herein, to deallocate a physical block includes marking the physical block as invalid, unused, or otherwise designating the physical block as available for storage space recovery, its contents on storage media no longer needing to be preserved by the storage device. Data block usage information may also refer to information maintained by a storage device regarding which physical blocks are allocated and/or deallocated/unallocated and changes in the allocation of physical blocks and/or logical-to-physical block mapping information. Data block usage information may also refer to information maintained by a storage device regarding which blocks are in use and which blocks are not in use by a storage client 504. Use of a block may include storing of data in the block on behalf of the storage client 504, reserving the block for use by the storage client 504, and the like.

While physical blocks may be deallocated, in certain embodiments, the cache 102 and/or the storage device 118 may not immediately erase the data on the storage media. An erase operation may be performed later in time. In certain embodiments, the data in a deallocated physical block may be marked as unavailable by the cache 102 and/or the storage device 118 such that subsequent requests for data in the physical block return a null result or an empty set of data.

One example of a command or message for such deallocation is the "TRIM" function of the "Data Set Management" command under the T13 technical committee command set specification maintained by INCITS. A storage device, upon receiving a TRIM command, may deallocate physical blocks for logical blocks whose data is no longer needed by the storage client 504. A storage device that deallocates physical blocks may achieve better performance and increased storage space, especially storage devices that write data using certain processes and/or use a similar data storage recovery process as that described above.

Consequently, the performance of the storage device is enhanced as physical blocks are deallocated when they are no longer needed such as through the TRIM command or other similar deallocation commands issued to the cache 102 and/or the storage device 118. In one embodiment, the direct cache module 116 clears, trims, and/or evicts cached data from the cache 102 based on a cache eviction policy, or the like. As used herein, clearing, trimming, or evicting data includes deallocating physical media associated with the data, marking the data as invalid or unused (using either a logical or physical address of the data), erasing physical media associated with the data, overwriting the data with different data, issuing a TRIM command or other deallocation command relative to the data, or otherwise recovering storage capacity of physical storage media corresponding to the data. Clearing cached data from the cache 102 based on a cache eviction policy frees storage capacity in the cache 102 to cache more data for the storage device 118.

The direct cache module 116, in various embodiments, may represent itself, the cache 102, and the storage device 118 to the storage client 504 in different configurations. In one embodiment, the direct cache module 116 may represent itself to the storage client 504 as a single storage device (i.e. as the storage device 118, as a storage device with a similar physical capacity as the storage device 118, or the like) and the cache 102 may be transparent or invisible to the storage client 504. In another embodiment, the direct cache module 116 may represent itself to the direct cache module 116 as a cache device (i.e. as the cache 102, as a cache device with certain cache functions or APIs available, or the like) and the storage device 118 may be separately visible and/or available to the storage client 504 (with part of the physical capacity of the storage device 118 reserved for the cache 102). In a further embodiment, the direct cache module 116 may represent itself to the storage client 504 as a hybrid cache/storage device including both the cache 102 and the storage device 118.

Depending on the configuration, the direct cache module 116 may pass certain commands down to the cache 102 and/or to the storage device 118 and may not pass down other commands. In a further embodiment, the direct cache module 116 may support certain custom or new block I/O commands. In one embodiment, the direct cache module 116 supports a deallocation or trim command that clears corresponding data from both the cache 102 and the storage device 118, i.e. the direct cache module 116 passes the command to both the cache 102 and the storage device 118. In a further embodiment, the direct cache module 116 supports a flush type trim or deallocation command that ensures that corresponding data is stored in the storage device 118 (i.e. that the corresponding data in the cache 102 is clean) and clears the corresponding data from the cache 102, without clearing the corresponding data from the storage device 118. In another embodiment, the direct cache module 116 supports an evict type trim or deallocation command that evicts corresponding data from the cache 102, marks corresponding data for eviction in the cache 102, or the like, without clearing the corresponding data from the storage device 118.

In a further embodiment, the direct cache module 116 may receive, detect, and/or intercept one or more predefined commands that a storage client 504 or another storage manager sent to the storage device 118, that a storage manager sends to a storage client 504, or the like. For example, in various embodiments, the direct cache module 116 or a portion of the direct cache module 116 may be part of a filter driver that receives or detects the predefined commands, the direct cache module 116 may register with an event server to receive a notification of the predefined commands, or the like. In another embodiment, the direct cache module 116 may present an API through which the direct cache module 116 receives predefined commands. The direct cache module 116, in one embodiment, performs one or more actions on the cache 102 in response to detecting or receiving one or more predefined commands for the storage device 118, such as writing or flushing data related to a command from the cache 102 to the storage device 118, evicting data related to a command from the cache 102, switching from a write back policy to a write through policy for data related to a command, or the like.

One example of predefined commands that the direct cache module 116 may intercept or respond to, in one embodiment, includes a "freeze/thaw" commands. "Freeze/thaw" commands are used in SANs, storage arrays, and the like, to suspend storage access, such as access to the storage device 118 or the like, to take an snapshot or backup of the storage without interrupting operation of the applications using the storage. "Freeze/thaw" commands alert a storage client 504 that a snapshot is about to take place, the storage client 504 flushes pending operations, for example in-flight transactions, or data cached in volatile memory, the snapshot takes place while the storage client 504 use of the storage is in a "frozen" or ready state, and once the snapshot is complete the storage client 504 continues normal use of the storage in response to a thaw command.

The direct cache module 116, in one embodiment, flushes or cleans dirty data from the cache 102 to the storage device 118 in response to detecting a "freeze/thaw" command. In a further embodiment, the direct cache module 116 suspends access to the storage device 118 during a snapshot or other backup of a detected "freeze/thaw" command and resumes access in response to a completion of the snapshot or other backup. In another embodiment, the direct cache module 116 may cache data for the storage device 118 during a snapshot or other backup without interrupting the snapshot or other backup procedure. In other words, rather than the backup/snapshot software signaling the application to quiesce I/O operations, the direct cache module 116 receives and responds to the freeze/thaw commands. Other embodiments of predefined commands may include one or more of a read command, a write command, a TRIM command, an erase command, a flush command, a pin command, an unpin command, and the like.

Figure 6:
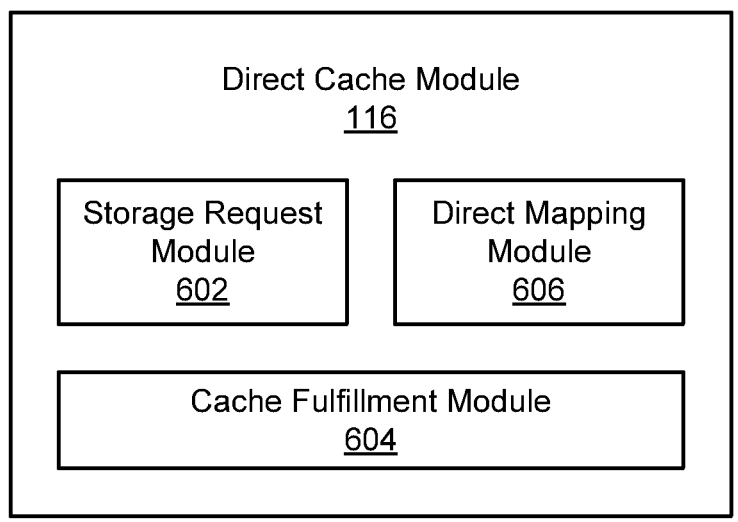
FIG. 6 is a schematic block diagram illustrating one embodiment of a direct cache module in accordance with the present invention.

FIG. 6 depicts one embodiment of the direct cache module 116. In the depicted embodiment, the direct cache module 116 includes a storage request module 602, a cache fulfillment module 604, and a direct mapping module 606. The direct cache module 116 of FIG. 6, in one embodiment, is substantially similar to the direct cache module 116 described above with regard to FIG. 1 and/or FIG. 5. In general, the direct cache module 116 caches data for the storage device 118 without an extra cache mapping layer. Instead of using a cache mapping layer, in one embodiment, the direct cache module 116 directly maps logical addresses of the storage device 118 to logical addresses of the cache 102 using the same mapping structure that maps the logical addresses of the cache 102 to the physical storage media 110 of the cache 102.

In one embodiment, the storage request module 602 detects input/output ("I/O") requests for the storage device 118, such as read requests, write requests, erase requests, TRIM requests, and/or other I/O requests for the storage device 118. The storage request module 602 may detect an I/O request by receiving the I/O request directly, detecting an I/O request sent to a different module or entity (such as detecting an I/O request sent directly to the storage device 118), or the like. In one embodiment, the host device 114 sends the I/O request. The direct cache module 116, in one embodiment, represents itself to the host device 114 as a storage device, and the host device 114 sends I/O requests directly to the storage request module 602.

An I/O request, in one embodiment, may include or may request data that is not stored on the cache 102. Data that is not stored on the cache 102, in various embodiments, may include new data not yet stored on the storage device 118, modifications to data that is stored on the storage device 118, data that is stored on the storage device 118 but not currently stored in the cache 102, or the like. An I/O request, in various embodiments, may directly include data, may include a reference, a pointer, or an address for data, or the like. For example, in one embodiment, an I/O request (such as a write request or the like) may include a range of addresses indicating data to be stored on the storage device 118 by way of a Direct Memory Access ("DMA") or Remote DMA ("RDMA") operation.

In a further embodiment, a single I/O request may include several different contiguous and/or noncontiguous ranges of addresses or blocks. In a further embodiment, an I/O request may include one or more destination addresses for data, such as logical and/or physical addresses for the data on the cache 102 and/or on the storage device 118. The storage request module 602 and/or another cooperating module, in various embodiments, may retrieve the data of an I/O request directly from an I/O request itself, from a storage location referenced by an I/O request (i.e. from a location in system memory or other data storage referenced in a DMA or RDMA request), or the like.

The direct mapping module 606, in one embodiment, directly maps logical or physical addresses of the storage device 118 to logical addresses of the cache 102 and directly maps logical addresses of the cache 102 to logical addresses of the storage device 118. As used herein, direct mapping of addresses means that for a given address in a first address space there is exactly one corresponding address in a second address space with no translation or manipulation of the address to get from an address in the first address space to the corresponding address in the second address space. The direct mapping module 606, in a further embodiment, maps addresses of the storage device 118 to logical addresses of the cache 102 such that each storage device 118 address has a one to one relationship with a logical address of the cache 102.

As described above, in certain embodiments, logical addresses of the cache 102 are independent of physical storage addresses of the solid-state storage media 110 for the cache 102, making the physical storage addresses of the solid-state storage media 110 fully associative with the storage device 118. Because the solid-state storage media 110 is fully associative with the storage device 118, any physical storage block of the cache 102 may store data associated with any storage device address of the storage device 118.

The cache 102, in one embodiment, is logically directly mapped and physically fully associative, combining the benefits of both cache types. The direct mapping module 606 maps each storage block of the storage device 118 to a distinct unique logical address of the cache 102 and associated distinct unique entry in the mapping structure, which may be associated with any distinct storage address of the solid-state storage media 110. This means that the direct mapping module 606 maps a storage block of the storage device 118 (represented by an LBA or other address) consistently to the same distinct unique logical address of the cache 102 while any distinct storage address of the solid-state storage media 110 may store the associated data, depending on a location of an append point of a sequential log-based writing structure, or the like.

The combination of logical direct mapping and full physical associativity that the direct mapping module 606 provides, in one embodiment, precludes cache collisions from occurring because logical addresses of the cache 102 are not shared and any storage block of the solid-state storage media 110 may store data for any address of the storage device 118, providing caching flexibility and optimal cache performance. Instead of overwriting data due to cache collisions, in one embodiment described below with regard to FIG. 7, a garbage collection module 710 and/or an eviction module 712 clear invalid or old data from the cache 102 to free storage capacity for caching data. Further, because the direct mapping module 606 maps storage device addresses to logical addresses of the cache 102 directly, in certain embodiments, the cache 102 provides fully associative physical storage media 110 without the processing overhead and memory consumption of a separate cache map, cache index, cache tags, or other lookup means traditionally associated with fully associative caches, eliminating a cache translation layer. Instead of a separate cache translation layer, the direct mapping module 606 (which may be embodied by the logical-to-physical translation layer 510 described above and/or the forward mapping module 802 described below) and the associated single mapping structure serve as both a cache index or lookup structure and as a storage address mapping layer.

In one embodiment, the direct mapping module 606 maps addresses of the storage device 118 directly to logical addresses of the cache 102 so that the addresses of the storage device 118 and the logical addresses of the cache 102 are equal or equivalent. In one example of this embodiment, the addresses of the storage device 118 and the logical addresses of the cache 102 share a lower range of the logical address space of the cache 102, such as $0-2^{32}$, or the like. In embodiments where the direct mapping module 606 maps addresses of the storage device 118 as equivalents of logical addresses of the cache 102, the direct mapping module 606 may use the addresses of the storage device 118 and the logical addresses of the cache 102 interchangeably, substituting one for the other without translating between them. Because the direct mapping module 606 directly maps addresses of the storage device 118 to logical addresses of the cache 102, an address of an I/O request directly identifies both an entry in the mapping structure for a logical address of the cache 102 and an associated address of the storage device 118. In one embodiment, logical block addresses of the storage device 118 are used to index both the logical address space of the cache 102 and the logical address space of the storage device 118. This is enabled by the direct mapping module 606 presenting an address space to the host device 114 that is the same size or larger than the address space of the storage device 118.

In one embodiment, the direct mapping module 606 maps logical addresses of the cache 102 (and associated addresses of the storage device 118) to physical addresses and/or locations on the physical storage media 110 of the cache 102. In a further embodiment, the direct mapping module 606 uses a single mapping structure to map addresses of the storage device 118 to logical addresses of the cache 102 and to map logical addresses of the cache 102 to locations on the physical storage media 110 of the cache 102. The direct mapping module 606 references the single mapping structure to determine whether or not the cache 102 stores data associated with an address of an I/O request. An address of an I/O request may comprise an address of the storage device 118, a logical address of the cache 102, or the like.

The single mapping structure, in various embodiments, may include a B-tree, B*-tree, B+-tree, a CAM, a binary tree, a hash table, an index, an array, a linked-list, a look-up table, or another mapping data structure. Use of a B-tree as the mapping structure in certain embodiments, is particularly advantageous where the logical address space presented to the client is a very large address space ($2^{64}$ addressable blocks—which may or may not be sparsely populated). Because B-trees maintain an ordered structure, searching such a large space remains very fast. Example embodiments of a B-tree as a mapping structure are described in greater detail with regard to FIGS. 10 and 11. For example, in one embodiment, the mapping structure includes a B-tree with multiple nodes and each node may store several entries. In the example embodiment, each entry may map a variable sized range or ranges of logical addresses of the cache 102 to a location on the physical storage media 110 of the cache 102. Furthermore, the number of nodes in the B-tree may vary as the B-tree grows wider and/or deeper. Caching variable sized ranges of data associated with contiguous and/or non-contiguous ranges of storage device addresses, in certain embodiments, is more efficient than caching fixed size cache lines, as the cache 102 may more closely match data use patterns without restrictions imposed by fixed size cache lines.

In one embodiment, the mapping structure of the direct mapping module 606 only includes a node or entry for logical addresses of the cache 102 that are associated with currently cached data in the cache 102. In this embodiment, membership in the mapping structure represents membership in the cache 102. The direct mapping module 606, in one embodiment, adds entries, nodes, and the like to the mapping structure as data is stored in the cache and removes entries, nodes, and the like from the mapping structure in response to data being evicted, cleared, trimmed, or otherwise removed from the cache 102. Similarly, membership in the mapping structure may represent valid allocated blocks on the solid-state storage media 110. The solid-state storage controller 104, in one embodiment, adds entries, nodes, and the like to the mapping structure as data is stored on the solid-state storage media 110 and removes entries, nodes, and the like from the mapping structure in response to data being invalidated cleared, trimmed, or otherwise removed from the solid-state storage media 110. In the case where the mapping structure is shared for both cache management and data storage management on the solid-state storage media, the present invention also tracks whether the data is dirty or not to determine whether the data is persisted on the storage device 118.

In a further embodiment, the mapping structure of the direct mapping module 606 may include one or more nodes or entries for logical addresses of the cache 102 that are not associated with currently stored data in the cache 102, but that are mapped to addresses of the storage device 118 that currently store data. The nodes or entries for logical addresses of the cache 102 that are not associated with currently stored data in the cache 102, in one embodiment, are not mapped to locations on the physical storage media 110 of the cache 102, but include an indicator that the cache 102 does not store data corresponding to the logical addresses. The nodes or entries, in a further embodiment, may include information that the data resides in the storage device 118.

Nodes, entries, records, or the like of the mapping structure, in one embodiment, may include information (such as physical addresses, offsets, indicators, etc.) directly, as part of the mapping structure, or may include pointers, references, or the like for locating information in memory, in a table, or in another data structure. The direct mapping module 606, in one embodiment, optimizes the mapping structure by monitoring the shape of the mapping structure, monitoring the size of the mapping structure, balancing the mapping structure, enforcing one or more predefined rules with regard to the mapping structure, ensuring that leaf nodes of the mapping structure are at the same depth, combining nodes, splitting nodes, and/or otherwise optimizing the mapping structure.

The direct mapping module 606, in one embodiment, stores at least a copy of the mapping structure to the solid-state storage media 110 of the cache 102 periodically. By storing the mapping structure on the cache 102, in a further embodiment, the mapping of addresses of the storage device 118 to the logical addresses of the cache 102 and/or the mapping of the logical addresses of the cache 102 to locations on the physical storage media 110 of the cache 102 are persistent, even if the cache 102 is subsequently paired with a different host device 114, the cache 102 undergoes an unexpected or improper shutdown, the cache 102 undergoes a power loss, or the like. In one embodiment, the storage device 118 is also subsequently paired with the different host device 114 along with the cache 102. In a further embodiment, the cache 102 rebuilds or restores at least a portion of data from the storage device 118 on a new storage device associated with the different host device 114, based on the mapping structure and data stored on the cache 102.

Figure 8:
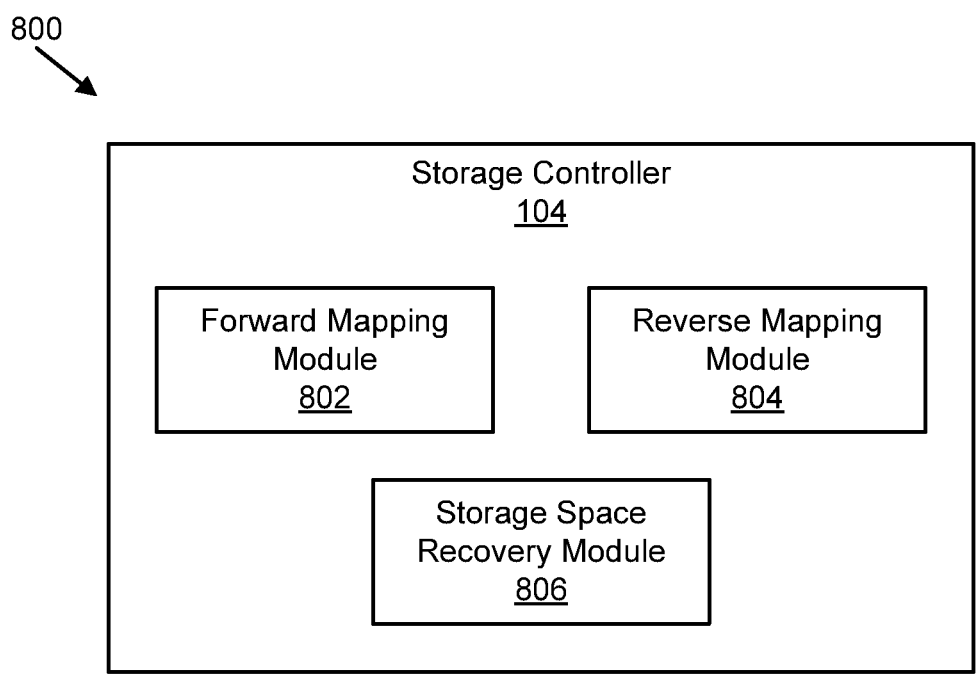
FIG. 8 is a schematic block diagram illustrating one embodiment of a storage controller in accordance with the present invention.
Figure 9:
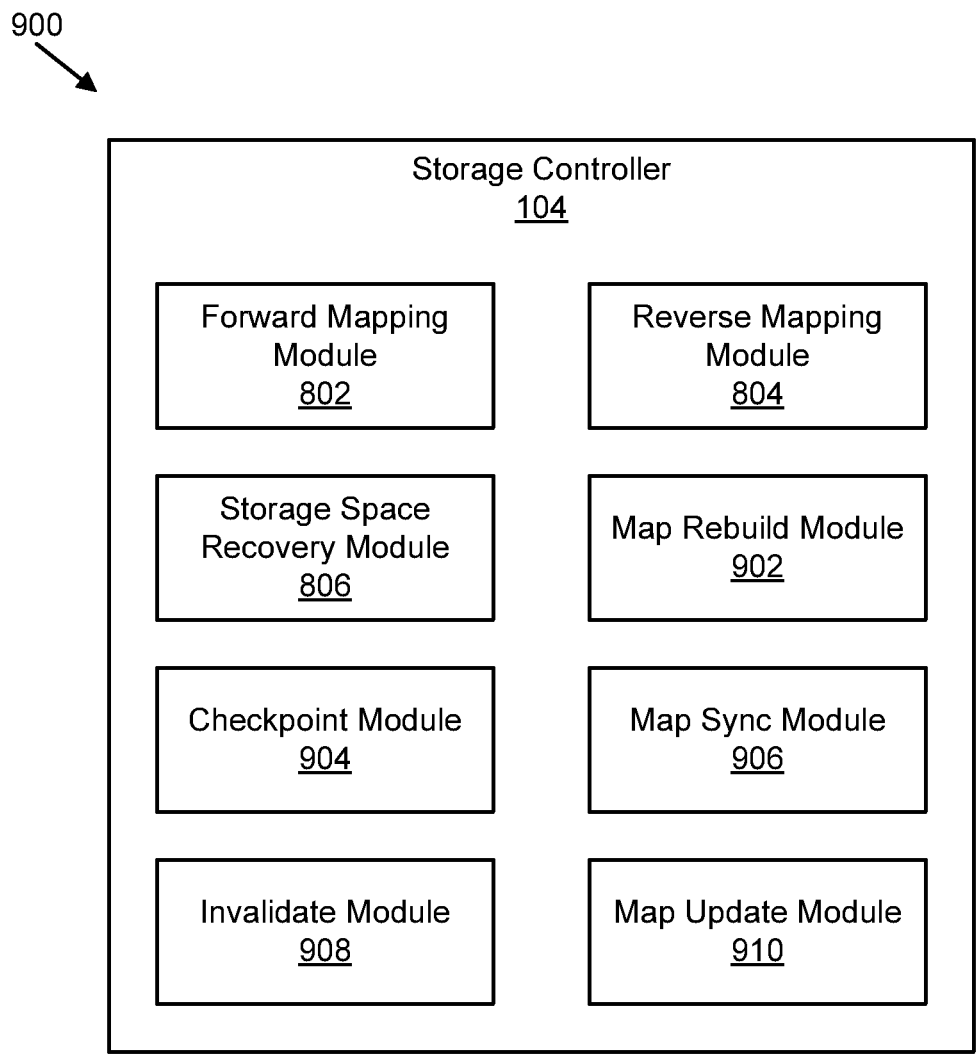
FIG. 9 is a schematic block diagram illustrating another embodiment of a storage controller in accordance with the present invention.

The direct mapping module 606, in one embodiment, reconstructs the mapping structure and included entries by scanning data on the solid-state storage media 110, such as a sequential log-based writing structure or the like, and extracting logical addresses, sequence indicators, and the like from data at physical locations on the solid-state storage media 110. For example, as described below, in certain embodiments the cache fulfillment module 604 stores data of I/O requests in a format that associates the data with sequence indicators for the data and with respective logical addresses of the cache 102 for the data. If the mapping structure becomes lost or corrupted, the direct mapping module 606 may use the physical address or location of data on the solid-state storage media 110 with the associated sequence indicators, logical addresses, and/or other metadata stored with the data, to reconstruct entries of the mapping structure. The forward map module 802 described below with regard to FIGS. 8 and 9 is another embodiment of the direct mapping module 606.

In one embodiment, the direct mapping module 606 receives one or more addresses of an I/O request, such as logical block addresses of the storage device 118 or the like, from the storage request module 602 and the direct mapping module 606 references the mapping structure to determine whether or not the cache 102 stores data associated with the I/O request. The direct mapping module 606, in response to referencing the mapping structure, may provide information from the mapping structure to the cache fulfillment module 604, such as a determination whether the cache 102 stores data of the I/O request, a physical storage address on the solid-state storage media 110 for data of the I/O request, or the like to assist the cache fulfillment module 604 in satisfying the I/O request. In response to the cache fulfillment module 604 satisfying an I/O request, in certain embodiments, the direct mapping module 606 updates the mapping structure to reflect changes or updates to the cache 102 that the cache fulfillment module 604 made to satisfy the I/O request.

The cache fulfillment module 604 satisfies I/O requests that the storage request module 602 detects. In certain embodiments, if the direct mapping module 606 determines that the cache 102 stores data of an I/O request, such as storing at least one data block of the I/O request or the like, the cache fulfillment module 604 satisfies the I/O request at least partially using the cache 102. The cache fulfillment module 604 satisfies an I/O request based on the type of I/O request. For example, the cache fulfillment module 604 may satisfy a write I/O request by storing data of the I/O request to the cache 102, may satisfy a read I/O request by reading data of the I/O request from the cache 102, and the like. An embodiment of the cache fulfillment module 604 that includes a write request module 703 for fulfilling write I/O requests and a read request module 704 for fulfilling read I/O requests is described below in greater detail with regard to FIG. 7.

In one embodiment, if the direct mapping module 606 determines that the cache 102 does not store data of an I/O request, i.e. there is a cache miss, the cache fulfillment module 604 stores data of the I/O request to the cache 102. The cache fulfillment module 604, in response to a write I/O request, a cache miss, or the like, in certain embodiments, stores data of an I/O request to the solid-state storage media 110 of the cache 102 sequentially to preserve an ordered sequence of I/O operations performed on the solid-state storage media 110. For example, the cache fulfillment module 604 may store the data of I/O requests to the cache 102 sequentially by appending the data to an append point of a sequential, log-based, cyclic writing structure of the solid-state storage media 110, in the order that the storage request module 602 receives the I/O requests. One embodiment of a sequential, log-based, cyclic writing structure is described below with regard to FIG. 11.

The cache fulfillment module 604, in one embodiment, stores data in a manner that associates the data with a sequence indicator for the data. The cache fulfillment module 604 may store a numerical sequence indicator as metadata with data of an I/O request, may use the sequential order of a log-based writing structure as a sequence indicator, or the like. In a further embodiment, the cache fulfillment module 604 stores data in a manner that associates the data with respective logical addresses of the data, storing one or more logical block addresses of the data with the data in a sequential, log-based writing structure or the like. By storing sequence indicators and logical addresses of data with the data on the solid-state storage media 110 of the cache 102, the cache fulfillment module 604 enables the direct mapping module 606 to reconstruct, rebuild, and/or recover entries in the mapping structure using the stored sequence indicators and logical addresses, as described above.

Figure 7:
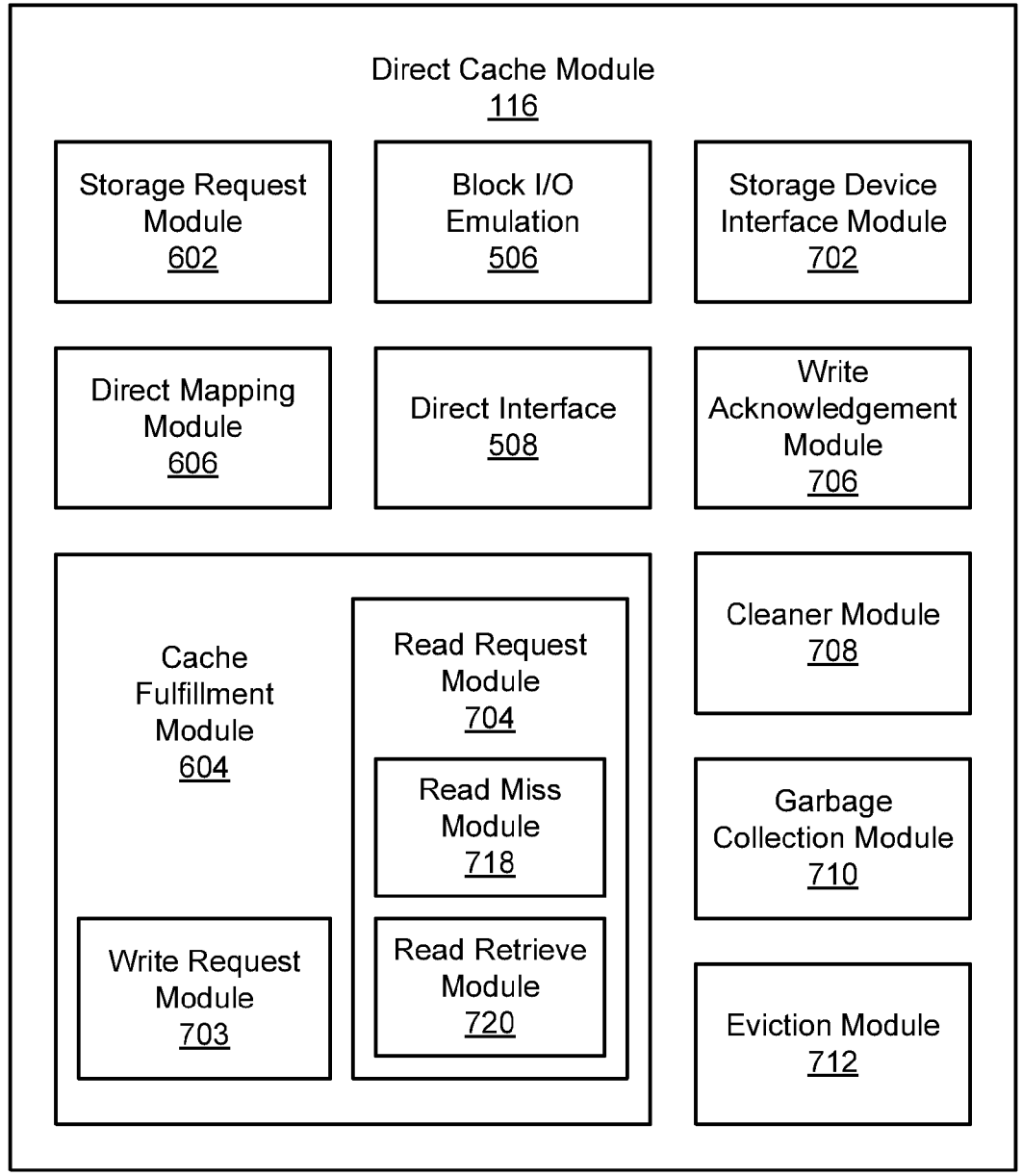
FIG. 7 is a schematic block diagram illustrating another embodiment of a direct cache module in accordance with the present invention.

FIG. 7 depicts another embodiment of the direct cache module 116. In the depicted embodiment, the direct cache module 116 includes the block I/O emulation layer 506, the direct interface layer 508, the storage request module 602, the cache fulfillment module 604, and the direct mapping module 606, substantially as described above with regard to FIGS. 5 and 6. The direct cache module 116, in the depicted embodiment, further includes a storage device interface module 702, a write acknowledgement module 706, a cleaner module 708, a garbage collection module 710, and an eviction module 712. The cache fulfillment module 604, in the depicted embodiment, includes a write request module 703 and a read request module 704.

In one embodiment, the write request module 703 services and satisfies write I/O requests that the storage request module 602 detects. A write request, in one embodiment, includes data that is not stored on the storage device 118, such as new data not yet stored on the storage device 118, modifications to data that is stored on the storage device 118, and the like. A write request, in various embodiments, may directly include the data, may include a reference, a pointer, or an address for the data, or the like. For example, in one embodiment, a write request includes a range of addresses indicating data to be stored on the storage device 118 by way of a Direct Memory Access ("DMA") or Remote DMA ("RDMA") operation.

In a further embodiment, a single write request may include several different contiguous and/or noncontiguous ranges of addresses or blocks. In a further embodiment, a write request includes one or more destination addresses for the associated data, such as logical and/or physical addresses for the data on the storage device 118. The write request module 703 and/or another cooperating module, in various embodiments, may retrieve the data of a write request directly from the write request itself, from a storage location referenced by a write request (i.e. from a location in system memory or other data storage referenced in a DMA or RDMA request), or the like to service the write request.

The write request module 703, in one embodiment, writes data of a write request to the cache 102 at one or more logical addresses of the cache 102 corresponding to the addresses of the write request as mapped by the direct mapping module 606. In a further embodiment, the write request module 703 writes the data of the write request to the cache 102 by appending the data to a sequential, log-based, cyclic writing structure of the physical solid-state storage media 110 of the cache 102 at an append point. The write request module 703, in one embodiment, returns one or more physical addresses or locations corresponding to the append point and the direct mapping module 606 maps the one or more logical addresses of the cache 102 to the one or more physical addresses corresponding to the append point.

In one embodiment, the read request module 704 services and satisfies read I/O requests that the storage request module 602 detects for data stored in the cache 102 and/or the storage device 118. A read request is a read command with an indicator, such as a logical address or range of logical addresses, of the data being requested. In one embodiment, the read request module 704 supports read requests with several contiguous and/or noncontiguous ranges of logical addresses, as discussed above with regard to the storage request module 602.

In the depicted embodiment, the read request module 704 includes a read miss module 718 and a read retrieve module 720. The read miss module 718, in one embodiment, determines whether or not requested data is stored in the cache 102, in cooperation with the direct mapping module 606 or the like. The read miss module 718 may query the cache 102 directly, query the direct mapping module 606, query the mapping structure of the direct mapping module 606, or the like to determine whether or not requested data is stored in the cache 102.

The read retrieve module 720, in one embodiment, returns requested data to the requesting entity, such as the host device 114. If the read miss module 718 and/or the direct mapping module 606 determine that the cache 102 stores the requested data, in one embodiment, the read retrieve module 720 reads the requested data from the cache 102 and returns the data to the requesting entity. The direct mapping module 606, in one embodiment, provides the read retrieve module 720 with one or more physical addresses of the requested data in the cache 102 by mapping one or more logical addresses of the requested data to the one or more physical addresses of the requested data.

If the read miss module 718 and/or the direct mapping module 606 determines that the cache 102 does not store the requested data, in one embodiment, the read retrieve module 720 reads the requested data from the storage device 118, stores the requested data to the cache 102, and returns the requested data to the requesting entity to satisfy the associated read request. In one embodiment, the read retrieve module 720 writes the requested data to the cache 102 by appending the requested data to an append point of a sequential, log-based, cyclic writing structure of the cache 102. In a further embodiment, the read retrieve module 720 provides one or more physical addresses corresponding to the append point to the direct mapping module 606 with the one or more logical addresses of the requested data and the direct mapping module 606 adds and/or updates the mapping structure with the mapping of logical and physical addresses for the requested data. The read retrieve module 720, in one embodiment, writes the requested data to the cache 102 using and/or in conjunction with the cache fulfillment module 604.

In one embodiment, the read miss module 718 detects a partial miss, where the cache 102 stores one portion of the requested data but does not store another. A partial miss, in various embodiments, may be the result of eviction of the unstored data, a block I/O request for noncontiguous data, or the like. The read miss module 718, in one embodiment, reads the missing data or "hole" data from the storage device 118 and returns both the portion of the requested data from the cache 102 and the portion of the requested data from the storage device 118 to the requesting entity. In one embodiment, the read miss module 718 stores the missing data retrieved from the storage device 118 in the cache 102.

In one embodiment, the write acknowledgement module 706 acknowledges, to a requesting entity such as the host device 114, a write request that the storage request module 602 receives. The write acknowledgement module 706, in a further embodiment, acknowledges persistence of the write request. In one embodiment, the write acknowledgement module 706 implements a particular data integrity policy. Advantageously, embodiments of the present invention permit variations in the data integrity policy that is implemented. The write acknowledgement module 706, in one embodiment, acknowledges the write request in response to the cache fulfillment module 604 writing data of the write request to the cache 102. In a further embodiment, the write acknowledgement module 706 acknowledges the write request in response to the cleaner module 708 writing data of the write request to the storage device 118, as described below.

In one embodiment, the cleaner module 708 writes data from the cache 102 to the storage device 118, destaging or cleaning the data. Data that is stored in the cache 102 that is not yet stored in the storage device 118 is referred to as "dirty" data. Once the storage device 118 stores data, the data is referred to as "clean." The cleaner module 708 cleans data in the cache 102 by writing the data to the storage device 118. The cleaner module 708, in one embodiment, may determine an address for the data in the storage device 118 based on a write request corresponding to the data. In a further embodiment, the cleaner module 708 determines an address for the data in the storage device 118 based on a logical address of the data in the cache 102, based on the mapping structure of the direct mapping module 606, or the like. In another embodiment, the cleaner module 708 uses the reverse mapping module 804 to determine an address for the data in the storage device 118 based on a physical address of the data in the cache 102.

The cleaner module 708, in one embodiment, writes data to the storage device 118 based on a write policy. In one embodiment, the cleaner module 708 uses a write-back write policy, and does not immediately write data of a write request to the storage device 118 upon receiving the write request. Instead, the cleaner module 708, in one embodiment, performs an opportunistic or "lazy" write, writing data to the storage device 118 when the data is evicted from the cache 102, when the cache 102 and/or the direct cache module 116 has a light load, when available storage capacity in the cache 102 falls below a threshold, or the like. In a write-back embodiment, the cleaner module 708 reads data from the cache 102, writes the data to the storage device 118, and sets an indicator that the storage device 118 stores the data, in response to successfully writing the data to the storage device 118. Setting the indicator that the storage device 118 stores the data alerts the garbage collection module 710 that the data may be cleared from the cache 102 and/or alerts the eviction module 712 that the data may be evicted from the cache 102.

In one embodiment, the cleaner module 708 sets an indicator that the storage device 118 stores data by marking the data as clean in the cache 102. In a further embodiment, the cleaner module 708 may set an indicator that the storage device 118 stores data by communicating an address of the data to the direct mapping module 606, sending a request to the direct mapping module 606 to update an indicator in a logical to physical mapping or other mapping structure, or the like.

In one embodiment, the cleaner module 708 maintains a separate data structure indicating which data in the cache 102 is clean and which data is dirty. In another embodiment, the cleaner module 708 references indicators in a mapping of logical addresses to physical media addresses, such as a mapping structure maintained by the direct mapping module 606, to determine which data in the cache 102 is clean and which data is dirty.

In another embodiment, instead of cleaning data according to a write-back write policy, the cleaner module 708 uses a write-through policy, performing a synchronous write to the storage device 118 for each write request that the storage request module 602 receives. The cleaner module 708, in one embodiment, transitions from a write-back to a write-through write policy in response to a predefined error condition, such as an error or failure of the cache 102, or the like.

In one embodiment, the garbage collection module 710 recovers storage capacity of physical storage media corresponding to data that is marked as invalid, such as data cleaned by the cleaner module 708 and/or evicted by the eviction module 712. The garbage collection module 710, in one embodiment, recovers storage capacity of physical storage media corresponding to data that the cleaner module 708 has cleaned and that the eviction module 712 has evicted, or that has been otherwise marked as invalid. In one embodiment, the garbage collection module 710 allows clean data to remain in the cache 102 as long as possible until the eviction module 712 evicts the data or the data is otherwise marked as invalid, to decrease the number of cache misses.

In one embodiment, the garbage collection module 710 recovers storage capacity of physical storage media corresponding to invalid data opportunistically. For example, the garbage collection module 710 may recover storage capacity in response to a lack of available storage capacity, a percentage of data marked as invalid reaching a predefined threshold level, a consolidation of valid data, an error detection rate for a section of physical storage media reaching a threshold value, performance crossing a threshold value, a scheduled garbage collection cycle, identifying a section of the physical storage media 110 with a high amount of invalid data, identifying a section of the physical storage media 110 with a low amount of wear, or the like.

In one embodiment, the garbage collection module 710 relocates valid data that is in a section of the physical storage media 110 in the cache 102 that the garbage collection module 710 is recovering to preserve the valid data. In one embodiment, the garbage collection module 710 is part of an autonomous garbage collector system that operates within the cache 102. This allows the cache 102 to manage data so that data is systematically spread throughout the solid-state storage media 110, or other physical storage media, to improve performance, data reliability and to avoid overuse and underuse of any one location or area of the solid-state storage media 110 and to lengthen the useful life of the solid-state storage media 110.

The garbage collection module 710, upon recovering a section of the physical storage media 110, allows the cache 102 to re-use the section of the physical storage media 110 to store different data. In one embodiment, the garbage collection module 710 adds the recovered section of physical storage media to an available storage pool for the cache 102, or the like. The garbage collection module 710, in one embodiment, erases existing data in a recovered section. In a further embodiment, the garbage collection module 710 allows the cache 102 to overwrite existing data in a recovered section. Whether or not the garbage collection module 710, in one embodiment, erases existing data in a recovered section may depend on the nature of the physical storage media. For example, Flash media requires that cells be erased prior to reuse where magnetic media such as hard drives does not have that requirement. In an embodiment where the garbage collection module 710 does not erase data in a recovered section, but allows the cache 102 to overwrite data in the recovered section, the garbage collection module 710, in certain embodiments, may mark the data in the recovered section as unavailable to service read requests so that subsequent requests for data in the recovered section return a null result or an empty set of data until the cache 102 overwrites the data.

In one embodiment, the garbage collection module 710 recovers storage capacity of the cache 102 one or more storage divisions at a time. A storage division, in one embodiment, is an erase block or other predefined division. For flash memory, an erase operation on an erase block writes ones to every bit in the erase block. This is a lengthy process compared to a program operation which starts with a location being all ones, and as data is written, some bits are changed to zero. However, where the solid-state storage 110 is not flash memory or has flash memory where an erase cycle takes a similar amount of time as other operations, such as a read or a program, the eviction module 712 may erase the data of a storage division as it evicts data, instead of the garbage collection module 710.

In one embodiment, allowing the eviction module 712 to mark data as invalid rather than actually erasing the data and allowing the garbage collection module 710 to recover the physical media associated with invalid data, increases efficiency because, as mentioned above, for flash memory and other similar storage an erase operation takes a significant amount of time. Allowing the garbage collection module 710 to operate autonomously and opportunistically within the cache 102 provides a way to separate erase operations from reads, writes, and other faster operations so that the cache 102 operates very efficiently.

In one embodiment, the garbage collection module 710 is integrated with and/or works in conjunction with the cleaner module 708 and/or the eviction module 712. For example, the garbage collection module 710, in one embodiment, clears data from the cache 102 in response to an indicator that the storage device stores the data (i.e. that the cleaner module 708 has cleaned the data) based on a cache eviction policy (i.e. in response to the eviction module 712 evicting the data). The eviction module 712, in one embodiment, evicts data by marking the data as invalid. In other embodiments, the eviction module 712 may evict data by erasing the data, overwriting the data, trimming the data, deallocating physical storage media associated with the data, or otherwise clearing the data from the cache 102.

The eviction module 712, in one embodiment, evicts data from the cache 102 based on a cache eviction policy. The cache eviction policy, in one embodiment, is based on a combination or a comparison of one or more cache eviction factors. In one embodiment, the cache eviction factors include wear leveling of the physical storage media 110. In another embodiment, the cache eviction factors include a determined reliability of a section of the physical storage media 110. In a further embodiment, the cache eviction factors include a failure of a section of the physical storage media 110. The cache eviction factors, in one embodiment, include a least recently used ("LRU") block of data. In another embodiment, the cache eviction factors include a frequency of access of a block of data, i.e. how "hot" or "cold" a block of data is. In one embodiment, the cache eviction factors include a position of a block of data in the physical storage media 110 relative to other "hot" data. One of skill in the art, in light of this specification, will recognize other cache eviction factors suitable for use in the cache eviction policy.

In one embodiment, the direct mapping module 606 determines one or more of the cache eviction factors based on a history of access to the mapping structure. The direct mapping module 606, in a further embodiment, identifies areas of high frequency, "hot," use and/or low frequency, "cold," use by monitoring accesses of branches or nodes in the mapping structure. The direct mapping module 606, in a further embodiment, determines a count or frequency of access to a branch, directed edge, or node in the mapping structure. In one embodiment, a count associated with each node of a b-tree like mapping structure may be incremented for each I/O read operation and/or each I/O write operation that visits the node in a traversal of the mapping structure. Of course, separate read counts and write counts may be maintained for each node. Certain counts may be aggregated to different levels in the mapping structure in other embodiments. The eviction module 712, in one embodiment, evicts data from the cache 102 intelligently and/or opportunistically based on activity in the mapping structure monitored by the direct mapping module 606, based on information about the physical storage media 110, and/or based on other cache eviction factors.

The direct mapping module 606, the eviction module 712, and/or the garbage collection module 710, in one embodiment, share information to increase the efficiency of the cache 102, to reduce cache misses, to make intelligent eviction decisions, and the like. In one embodiment, the direct mapping module 606 tracks or monitors a frequency that I/O requests access logical addresses in the mapping structure. The direct mapping module 606, in a further embodiment, stores the access frequency information in the mapping structure, communicates the access frequency information to the eviction module 712 and/or to the garbage collection module 710, or the like. The direct mapping module 606, in another embodiment, may track, collect, or monitor other usage/access statistics relating to the logical to physical mapping of addresses for the cache 102 and/or relating to the mapping between the logical address space of the cache 102 and the address space of the storage device 118, and may share that data with the eviction module 712 and/or with the garbage collection module 710.

One example of a benefit of sharing information between the direct mapping module 606, the eviction module 712, and the garbage collection module 710, in certain embodiments, is that write amplification can be reduced. As described above, in one embodiment, the garbage collection module 710 copies any valid data in an erase block forward to the current append point of the log-based append-only writing structure of the cache 102 before recovering the physical storage capacity of the erase block. By cooperating with the direct mapping module 606 and/or with the eviction module 712, in one embodiment, the garbage collection module 710 may clear certain valid data from an erase block without copying the data forward (for example because the replacement algorithm for the eviction module 712 indicates that the valid data is unlikely to be re-requested soon), reducing write amplification, increasing available physical storage capacity and efficiency.

For example, in one embodiment, the garbage collection module 710 preserves valid data with an access frequency in the mapping structure that is above a predefined threshold, and clears valid data from an erase block if the valid data has an access frequency below the predefined threshold. In a further embodiment, the eviction module 712 may mark certain data as conditionally evictable, conditionally invalid, or the like, and the garbage collection module 710 may evict the conditionally invalid data based on an access frequency or other data that the direct mapping module 606 provides. In another example, the direct mapping module 606, the eviction module 712, and the garbage collection module 710, in one embodiment, cooperate such that valid data that is in the cache 102 and is dirty gets stored on the storage device 118 by the garbage collection module 710 rather than copied to the front of the log, because the eviction module 712 indicated that it is more advantageous to do so.

Those of skill in the art will appreciate a variety of other examples and scenarios in which the modules responsible for managing the non-volatile storage media that uses a log-based append-only writing structure can leverage the information available in the direct cache module 116. Furthermore, those of skill in the art will appreciate a variety of other examples and scenarios in which the modules responsible for managing the cache 102 (direct cache module 116, cleaning and eviction determinations) can leverage the information available in solid-state controller 104 regarding the condition of the non-volatile storage media.

In another example, the direct mapping module 606, the eviction module 712, and the garbage collection module 710, in one embodiment, cooperate such that selection of one or more blocks of data by the eviction module 712 is influenced by the Uncorrectable Bit Error Rates (UBER), Correctable Bit Error Rates (BER), Program/Erase (PE) cycle counts, read frequency, or other non-volatile solid state storage specific attributes of the region of the solid-state storage media 110 in the cache 102 that presently holds the valid data. High BER, UBER, PEs may be used as factors to increase the likelihood that the eviction module 712 will evict a particular block range stored on media having those characteristics.

In one embodiment, the storage device interface module 702 provides an interface between the direct cache module 116, the cache 102, and/or the storage device 118. As described above with regard to FIG. 5, in various embodiments, the direct cache module 116 may interact with the cache 102 and/or the storage device 118 through a block device interface, a direct interface, a device driver on the host device 114, a storage controller, or the like. In one embodiment, the storage device interface module 702 provides the direct cache module 116 with access to one or more of these interfaces. For example, the storage device interface module 702 may receive read commands, write commands, and clear (or TRIM) commands from one or more of the cache fulfillment module 604, the direct mapping module 606, the read request module 704, the cleaner module 708, the garbage collection module 710, and the like and relay the commands to the cache 102 and/or the storage device 118. In a further embodiment, the storage device interface module 702 may translate or format a command into a format compatible with an interface for the cache 102 and/or the storage device 118.

In one embodiment, the storage device interface module 702 has exclusive ownership over the storage device 118 and the direct cache module 116 is an exclusive gateway to accessing the storage device 118. Providing the storage device interface module 702 with exclusive ownership over the storage device 118 and preventing access to the storage device 118 by other routes obviates stale data issues and cache coherency requirements, because all changes to data in the storage device 114 are processed by the direct cache module 116.

In a further embodiment, the storage device interface module 702 does not have exclusive ownership of the storage device 118, and the storage device interface module 702 manages cache coherency for the cache 102. For example, in various embodiments, the storage device interface module 702 may access a common directory with other users of the storage device 118 to maintain coherency, may monitor write operations from other users of the storage device 118, may participate in a predefined coherency protocol with other users of the storage device 118, or the like.

FIG. 8 is a schematic block diagram illustrating one embodiment of an apparatus 800 to efficiently map physical and logical addresses in accordance with the present invention. The apparatus 800 includes a forward mapping module 802, a reverse mapping module 804, and a storage space recovery module 806, which are described below. At least a portion of one or more of the forward mapping module 802, the reverse mapping module 804, and the storage space recovery module 806 is located within one or more of a requesting device that transmits the storage request, the solid-state storage media 110, the storage controller 104, and a computing device separate from the requesting device, the solid-state storage media 110, and the storage controller 104.

In one embodiment, the forward mapping module 802 and the reverse mapping module 804 work in conjunction with the direct mapping module 606. The forward mapping module 802 and the reverse mapping module 804 may be part of the direct mapping module 606, may be separate and work together with the direct mapping module 606, or the like.

The apparatus 800 includes a forward mapping module 802 that uses a forward map to identify one or more physical addresses of data of a data segment. The physical addresses are identified from one or more logical addresses of the data segment, which are identified in a storage request directed to the solid-state storage media 110. For example, a storage request may include a request to read data stored in the solid-state storage media 110. The storage request to read data includes a logical address or logical identifier associated with the data stored on the solid-state storage media 110. The read request may include a logical or virtual address of a file from which the data segment originated, which may be interpreted that the read request is a request to read an entire data segment associated with the logical or virtual address.

The read request, in another example, includes a logical address along with an offset as well a data length of the data requested in the read request. For example, if a data segment is 20 blocks, a read request may include an offset of 16 blocks (i.e. start at block 16 of 20) and a data length of 5 so that the read request reads the last 5 blocks of the data segment. The read request may include an offset and data length also in a request to read an entire data segment or to read from the beginning of a data segment. Other requests may also be included in a storage request, such as a status request. Other types and other forms of storage requests are contemplated within the scope of the present invention and will be recognized by one of skill in the art.

The apparatus 800 includes a forward map that maps of one or more logical addresses to one or more physical addresses of data stored in the solid-state storage media 110. The logical addresses correspond to one or more data segments relating to the data stored in the solid-state storage media 110. The one or more logical addresses typically include discrete addresses within a logical address space where the logical addresses sparsely populate the logical address space. For a logical address of a data segment, data length information may also be associated with the logical address and may also be included in the forward map. The data length typically corresponds to the size of the data segment. Combining a logical address and data length information associated with the logical address may be used to facilitate reading a particular portion within a data segment.

Often logical addresses used to identify stored data represent a very small number of logical addresses that are possible within a name space or range of possible logical addresses. Searching this sparsely populated space may be cumbersome. For this reason, the forward map is typically a data structure that facilitates quickly traversing the forward map to find a physical address based on a logical address. For example, the forward map may include a B-tree, a content addressable memory ("CAM"), a binary tree, a hash table, or other data structure that facilitates quickly searching a sparsely populated space or range. By using a forward map that quickly searches a sparsely populated logical namespace or address space, the apparatus 800 provides an efficient way to determine one or more physical addresses from a logical address.

While the forward map may be optimized, or at least designed, for quickly determining a physical address from a logical address, typically the forward map is not optimized for locating all of the data within a specific region of the solid-state storage media 110. For this reason, the apparatus 800 includes a reverse mapping module 804 that uses a reverse map to determine a logical address of a data segment from a physical address. The reverse map is used to map the one or more physical addresses to one or more logical addresses and can be used by the reverse mapping module 804 or other process to determine a logical address from a physical address. The reverse map beneficially maps the solid-state storage media 110 into erase regions such that a portion of the reverse map spans an erase region of the solid-state storage media 110 erased together during a storage space recovery operation. The storage space recovery operation (or garbage collection operation) recovers erase regions for future storage of data. By organizing the reverse map by erase region, the storage space recovery module 806 can efficiently identify an erase region for storage space recovery and identify valid data. The storage space recovery module 806 is discussed in more detail below.

The physical addresses in the reverse map are associated or linked with the forward map so that if logical address A is mapped to physical address B in the forward map, physical address B is mapped to logical address A in the reverse map. In one embodiment, the forward map includes physical addresses that are linked to entries in the reverse map. In another embodiment, the forward map includes pointers to physical addresses in the reverse map or some other intermediate list, table, etc. One of skill in the art will recognize other ways to link physical addresses to the forward map and reverse map.

In one embodiment, the reverse map includes one or more source parameters. The source parameters are typically received in conjunction with a storage request and include at least one or more logical addresses. The source parameters may also include data lengths associated with data of a data segment received in conjunction with a storage request.

In another embodiment, the reverse map does not include source parameters in the form of logical addresses or data lengths and the source are stored with data of the data segment stored on the solid-state storage media 110. In this embodiment, the source parameters may be discovered from a physical address in the reverse map which leads to the source parameters stored with the data. Said differently, the reverse map may use the primary logical-to-physical map rather than the secondary-logical-to-physical map.

Storing the source parameters with the data is advantageous in a sequential storage device because the data stored in the solid-state storage media 110 becomes a log that can be replayed to rebuild the forward and reverse maps. This is due to the fact that the data is stored in a sequence matching when storage requests are received, and thus the source data serves a dual role; rebuilding the forward and reverse maps and determining a logical address from a physical address.

The apparatus 800 includes a storage space recovery module 806 that uses the reverse map to identify valid data in an erase region prior to an operation to recover the erase region. The identified valid data is moved to another erase region prior to the recovery operation. By organizing the reverse map by erase region, the storage space recovery module 806 can scan through a portion of the reverse map corresponding to an erase region to quickly identify valid data or to determine a quantity of valid data in the erase region. An erase region may include an erase block, a fixed number of pages, etc. erased together. The reverse map may be organized so that once the entries for a particular erase region are scanned, the contents of the erase region are known.

By organizing the reverse map by erase region, searching the contents of an erase region is more efficient than searching a B-tree, binary tree, or other similar structure used for logical-to-physical address searches. Searching forward map in the form of a B-tree, binary tree, etc. is cumbersome because the B-tree, binary tree, etc. would frequently have to be searched in its entirety to identify all of the valid data of the erase region. The reverse may include a table, data base, or other structure that allows entries for data of an erase region to be stored together to facilitate operations on data of an erase region.

In one embodiment, the forward map and the reverse map are independent of a file structure, a name space, a directory, etc. that organize data for the requesting device transmitting the storage request, such as a file server or client operating in a server or the host device 114. By maintaining the forward map and the reverse map separate from any file server of the requesting device, the apparatus 800 is able to emulate a random access, logical block storage device storing data as requested by the storage request.

Use of the forward map and reverse map allows the apparatus 800 to appear to be storing data in specific locations as directed by a storage request while actually storing data sequentially in the solid-state storage media 110. Beneficially, the apparatus 800 overcomes problems that random access causes for solid-state storage, such as flash memory, by emulating logical block storage while actually storing data sequentially. The apparatus 800 also allows flexibility because one storage request may be a logical block storage request while a second storage request may be an object storage request, file storage request, etc. Maintaining independence from file structures, namespaces, etc. of the requesting device provides great flexibility as to which type of storage requests may be serviced by the apparatus 800.

FIG. 9 is a schematic block diagram illustrating another embodiment of an apparatus 900 for efficient mapping of logical and physical addresses in accordance with the present invention. The apparatus 900 includes a forward mapping module 802, a reverse mapping module 804, and a storage space recovery module 806, which are substantially similar to those described above in relation to the apparatus 800 of FIG. 8. The apparatus 900 also includes a map rebuild module 902, a checkpoint module 904, a map sync module 906, an invalidate module 908, and a map update module 910, which are described below.

The apparatus 900 includes a map rebuild module 902 that rebuilds the forward map and the reverse map using the source parameters stored with the data. Where data is stored on the solid-state storage media 110 sequentially, by keeping track of the order in which erase regions or erase blocks in the solid-state storage media 110 were filled and by storing source parameters with the data, the solid-state storage media 110 becomes a sequential log. The map rebuild module 902 replays the log by sequentially reading data packets stored on the solid-state storage media 110. Each physical address and data packet length is paired with the source parameters found in each data packet to recreate the forward and reverse maps.

In another embodiment, the apparatus 900 includes a checkpoint module 904 that stores information related to the forward map and the reverse map where the checkpoint is related to a point in time or state of the data storage device. The stored information is sufficient to restore the forward map and the reverse map to a status related to the checkpoint. For example, the stored information may include storing the forward and reverse maps in non-volatile storage, such as on the data storage device, along with some identifier indicating a state or time checkpoint.

For example, a timestamp could be stored with the checkpoint information. The timestamp could then be correlated with a location in the solid-state storage media 110 where data packets were currently being stored at the checkpoint. In another example, state information is stored with the checkpoint information, such as a location in the solid-state storage media 110 where data is currently being stored. One of skill in the art will recognize other checkpoint information that may be stored by the checkpoint module 904 to restore the forward and reverse maps to the checkpoint.

In another embodiment, the apparatus 900 includes a map sync module 906 that updates the forward map and the reverse map from the status related to the checkpoint to a current status by sequentially applying source parameters and physical addresses. The source parameters applied are stored with data that was sequentially stored after the checkpoint. The physical addresses are derived from a location of the data on the solid-state storage media 110.

Beneficially the map sync module 906 restores the forward and reverse maps to a current state from a checkpoint rather than starting from scratch and replaying the entire contents of the solid-state storage media 110. The map sync module 906 uses the checkpoint to go to the data packet stored just after the checkpoint and then replays data packets from that point to a current state where data packets are currently being stored on the solid-state storage media 110. The map sync module 906 typically takes less time to restore the forward and reverse maps than the map rebuild module 902.

In one embodiment, the forward and reverse maps are stored on the solid-state storage media 110 and another set of forward and reverse maps are created to map the stored forward and reverse maps. For example, data packets may be stored on a first storage channel while the forward and reverse maps for the stored data packets may be stored as data on a second storage channel; the forward and reverse maps for the data on the second storage channel may be stored as data on a third storage channel, and so forth. This recursive process may continue as needed for additional forward and reverse maps. The storage channels may be on a single element of solid-state storage media 110 or on separate elements of solid-state storage media 110.

The apparatus 900 includes an invalidate module 908 that marks an entry for data in the reverse map indicating that data referenced by the entry is invalid in response to an operation resulting in the data being invalidated. The invalidate module 908 may mark an entry invalid as a result of a delete request, a read-modify-write request, and the like. The reverse map includes some type of invalid marker or tag that may be changed by the invalidate module 908 to indicate data associated with an entry in the reverse map is invalid. For example, the reverse map may include a bit that is set by the invalidate module 908 when data is invalid.

In one embodiment, the reverse map includes information for valid data and invalid data stored in the solid-state storage media 110 and the forward includes information for valid data stored in the solid-state storage media 110. Since the reverse map is useful for storage space recovery operations, information indicating which data in an erase block is invalid is included in the reverse map. By maintaining the information indicating invalid data in the reverse map, the forward map, in one embodiment, need only maintain information related to valid data stored on the solid-state storage media 110, thus improving the efficiency and speed of forward lookup.

The storage space recovery module 806 may then use the invalid marker to determine a quantity of invalid data in an erase region by scanning the reverse map for the erase region to determine a quantity of invalid data in relation to a storage capacity of the erase region. The storage space recovery module 806 can then use the determined quantity of invalid data in the erase region to select an erase region for recovery. By scanning several erase regions, or even all available erase regions, the storage space recovery module 806 can use selection criteria, such as highest amount of invalid data in an erase region, to then select an erase region for recovery.

Once an erase region is selected for recovery, in one embodiment the storage space recovery module 806 may then write valid data from the selected erase region to a new location in the solid-state storage media 110. The new location is typically within a page of an erase region where data is currently being stored sequentially. The storage space recovery module 806 may write the valid data using a data pipeline as described in U.S. patent application Ser. No. 11,952,091 entitled "Apparatus, System, and Method for Managing Data Using a Data Pipeline" for David Flynn et al. and filed Dec. 6, 2007, which is hereinafter incorporated by reference.

In one embodiment, the storage space recovery module 806 also updates the reverse map to indicate that the valid data written to the new location is invalid in the selected erase region and updates the forward and reverse maps based on the valid data written to the new location. In another embodiment, the storage space recovery module 806 coordinates with the map update module 910 (described below) to update the forward and reverse maps.

In a preferred embodiment, the storage space recovery module 806 operates autonomously with respect to data storage and retrieval associated with storage requests and other commands. Storage space recovery operations that may be incorporated in the storage space recovery module 806 are described in more detail in the Storage Space Recovery Application referenced above.

In one embodiment, the apparatus 900 includes a map update module 910 that updates the forward map and/or the reverse map in response to contents of the solid-state storage media 110 being altered. In a further embodiment, the map update module 910 receives information linking a physical address of stored data to a logical address from the data storage device based on a location where the data storage device stored the data. In the embodiment, the location where a data packet is stored may not be available until the solid-state storage media 110 stores the data packet.

For example, where data from a data segment is compressed to form a data packet, the size of each data packet may be unknown until after compression. Where the solid-state storage media 110 stores data sequentially, once a data packet is compressed and stored, an append point is set to a location after the stored data packet and a next data packet is stored. Once the append point is known, the solid-state storage media 110 may then report back the physical address corresponding to the append point where the next data packet is stored. The map update module 910 uses the reported physical address and associated data length of the stored data packet to update the forward and reverse maps. One of skill in the art will recognize other embodiments of a map update module 910 to update the forward and reverse maps based on physical addresses and associated data lengths of data stored on the solid-state storage media 110.

Figure 10:
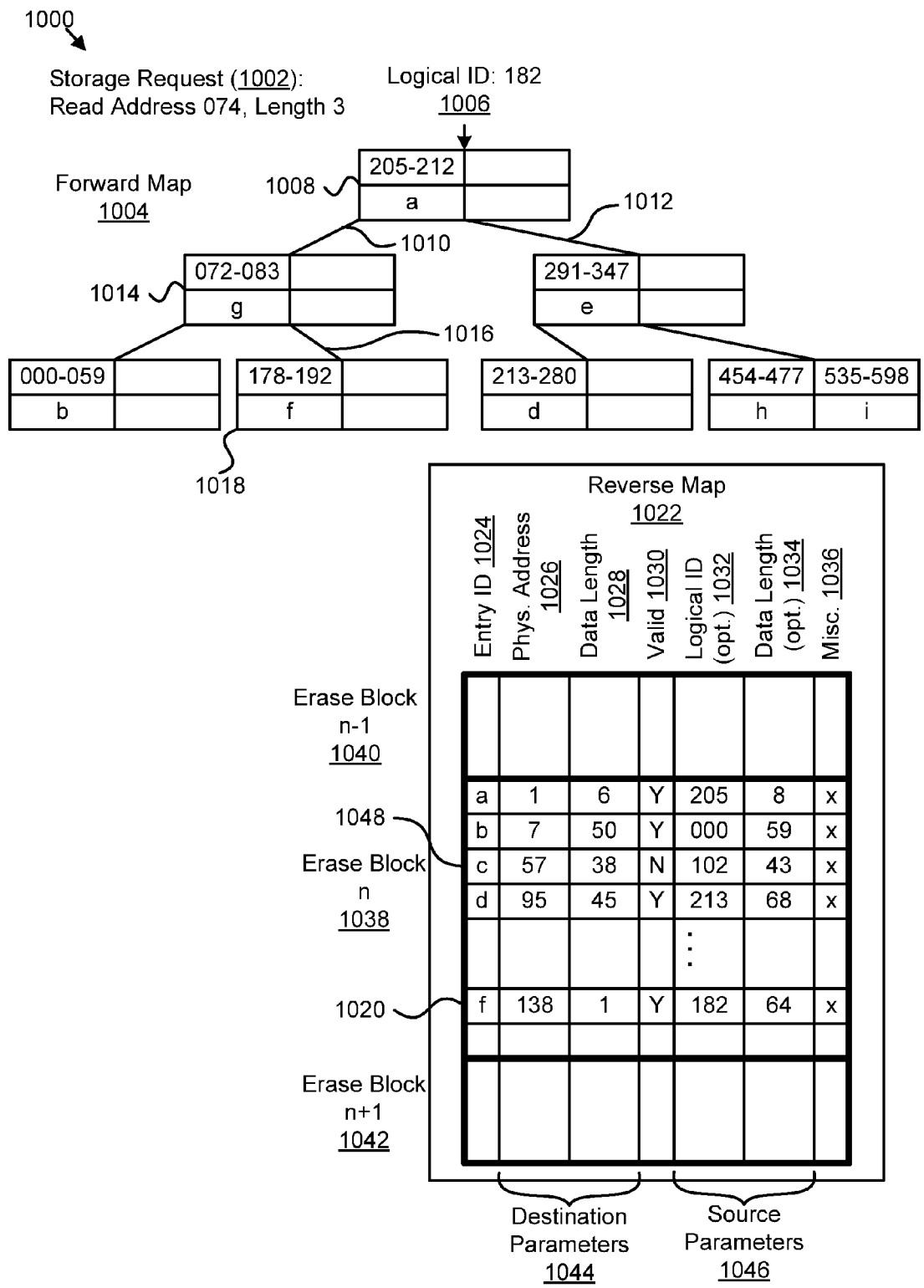
FIG. 10 is a schematic block diagram illustrating one embodiment of a forward map and a reverse map in accordance with the present invention.

FIG. 10 is a schematic block diagram of an example of a forward map 1004 and a reverse map 1022 in accordance with the present invention. Typically, the apparatus 800, 900 receives a storage request, such as storage request to read an address. For example, the apparatus 800, 900 may receive a logical block storage request 1002 to start reading read address "182" and read 3 blocks. Typically the forward map 1004 stores logical block addresses as virtual/logical addresses along with other virtual/logical addresses so the forward mapping module 802 uses forward map 1004 to identify a physical address from the virtual/logical address "182" of the storage request 1002. In the example, for simplicity only logical addresses that are numeric are shown, but one of skill in the art will recognize that any logical address may be used and represented in the forward map 1004. A forward map 1004, in other embodiments, may include alphanumerical characters, hexadecimal characters, and the like.

In the example, the forward map 1004 is a simple B-tree. In other embodiments, the forward map 1004 may be a content addressable memory ("CAM"), a binary tree, a hash table, or other data structure known to those of skill in the art. In the depicted embodiment, a B-Tree includes nodes (e.g. the root node 1008) that may include entries of two logical addresses. Each entry, in one embodiment, may include a range of logical addresses. For example, a logical address may be in the form of a logical identifier with a range (e.g. offset and length) or may represent a range using a first and a last address or location.

Where a single logical address is included at a particular node, such as the root node 1008, if a logical address 1006 being searched is lower than the logical address of the node, the search will continue down a directed edge 1010 to the left of the node 1008. If the searched logical address 1006 matches the current node 1008 (i.e. is located within the range identified in the node), the search stops and the pointer, link, physical address, etc. at the current node 1008 is identified. If the searched logical address 1006 is greater than the range of the current node 1008, the search continues down directed edge 1012 to the right of the current node 1008. Where a node includes two logical addresses and a searched logical address 1006 falls between the listed logical addresses of the node, the search continues down a center directed edge (not shown) to nodes with logical addresses that fall between the two logical addresses of the current node 1008. A search continues down the B-tree until either locating a desired logical address or determining that the searched logical address 1006 does not exist in the B-tree. As described above, in one embodiment, membership in the B-tree denotes membership in the cache 102, and determining that the searched logical address 1006 is not in the B-tree is a cache miss.

In the example depicted in FIG. 10, the forward mapping module 802 searches for logical address "182" 1006 starting at the root node 1008. Since the searched logical address 1006 is lower than the logical address of 205-212 in the root node 1008, the forward mapping module 802 searches down the directed edge 1010 to the left to the next node 1014. The searched logical address "182" 1006 is more than the logical address (072-083) stored in the next node 1014 so the forward mapping module 802 searches down a directed edge 1016 to the right of the node 1014 to the next node 1018. In this example, the next node 1018 includes a logical address of 178-192 so that the searched logical address "182" 1006 matches the logical address 178-192 of this node 1018 because the searched logical address "182" 1006 falls within the range 178-192 of the node 1018.

Once the forward mapping module 802 determines a match in the forward map 1004, the forward mapping module 802 returns a physical address, either found within the node 1018 or linked to the node 1018. In the depicted example, the node 1018 identified by the forward mapping module 802 as containing the searched logical address 1006 includes a link "f" that maps to an entry 1020 in the reverse map 1022.

In the depicted embodiment, for each entry 1020 in the reverse map 1022 (depicted as a row in a table), the reverse map 1022 includes an entry ID 1024, a physical address 1026, a data length 1028 associated with the data stored at the physical address 1026 on the solid-state storage media 110 (in this case the data is compressed), a valid tag 1030, a logical address 1032 (optional), a data length 1034 (optional) associated with the logical address 1032, and other miscellaneous data 1036. The reverse map 1022 is organized into erase blocks (erase regions). In this example, the entry 1020 that corresponds to the selected node 1018 is located in erase block n 1038. Erase block n 1038 is preceded by erase block n−1 1040 and followed by erase block n+1 1042 (the contents of erase blocks n−1 and n+1 are not shown). An erase block may be some erase region that includes a predetermined number of pages. An erase region is an area in the solid-state storage media 110 erased together in a storage recovery operation.

While the entry ID 1024 is shown as being part of the reverse map 1022, the entry ID 1024 may be an address, a virtual link, or other means to tie an entry in the reverse map 1022 to a node in the forward map 1004. The physical address 1026 is an address in the solid-state storage media 110 where data that corresponds to the searched logical address 1006 resides. The data length 1028 associated with the physical address 1026 identifies a length of the data packet stored at the physical address 1026. (Together the physical address 1026 and data length 1028 may be called destination parameters 1044 and the logical address 1032 and associated data length 1034 may be called source parameters 1046 for convenience.) In the example, the data length 1028 of the destination parameters 1044 is different from the data length 1034 of the source parameters 1046 in one embodiment compression the data packet stored on the solid-state storage media 110 was compressed prior to storage. For the data associated with the entry 1020, the data was highly compressible and was compressed from 64 blocks to 1 block.

The valid tag 1030 indicates if the data mapped to the entry 1020 is valid or not. In this case, the data associated with the entry 1020 is valid and is depicted in FIG. 10 as a "Y" in the row of the entry 1020. Typically the reverse map 1022 tracks both valid and invalid data and the forward map 1004 tracks valid data. In the example, entry "c" 1048 indicates that data associated with the entry 1048 is invalid. Note that the forward map 1004 does not include logical addresses associated with entry "c" 1048. The reverse map 1022 typically maintains entries for invalid data so that valid and invalid data can be quickly distinguished during a storage recovery operation.

The depicted reverse map 1022 includes source parameters 1046 for convenience, but the reverse map 1022 may or may not include the source parameters 1046. For example, if the source parameters 1046 are stored with the data, possibly in a header of the stored data, the reverse map 1022 could identify a logical address indirectly by including a physical address 1026 associated with the data and the source parameters 1046 could be identified from the stored data. One of skill in the art will recognize when storing source parameters 1046 in a reverse map 1022 would be beneficial.

The reverse map 1022 may also include other miscellaneous data 1036, such as a file name, object name, source data, etc. One of skill in the art will recognize other information useful in a reverse map 1022. While physical addresses 1026 are depicted in the reverse map 1022, in other embodiments, physical addresses 1026, or other destination parameters 1044, may be included in other locations, such as in the forward map 1004, an intermediate table or data structure, etc.

Typically, the reverse map 1022 is arranged by erase block or erase region so that traversing a section of the map associated with an erase block (e.g. erase block n 1038) allows the storage space recovery module 806 to identify valid data in the erase block 1038 and to quantify an amount of valid data, or conversely invalid data, in the erase block 1038. Arranging an index into a forward map 1004 that can be quickly searched to identify a physical address 1026 from a logical address 1006 and a reverse map 1022 that can be quickly searched to identify valid data and quantity of valid data in an erase block 1038 is beneficial because the index may be optimized for searches and storage recovery operations. One of skill in the art will recognize other benefits of an index with a forward map 1004 and a reverse map 1022.

Figure 11:
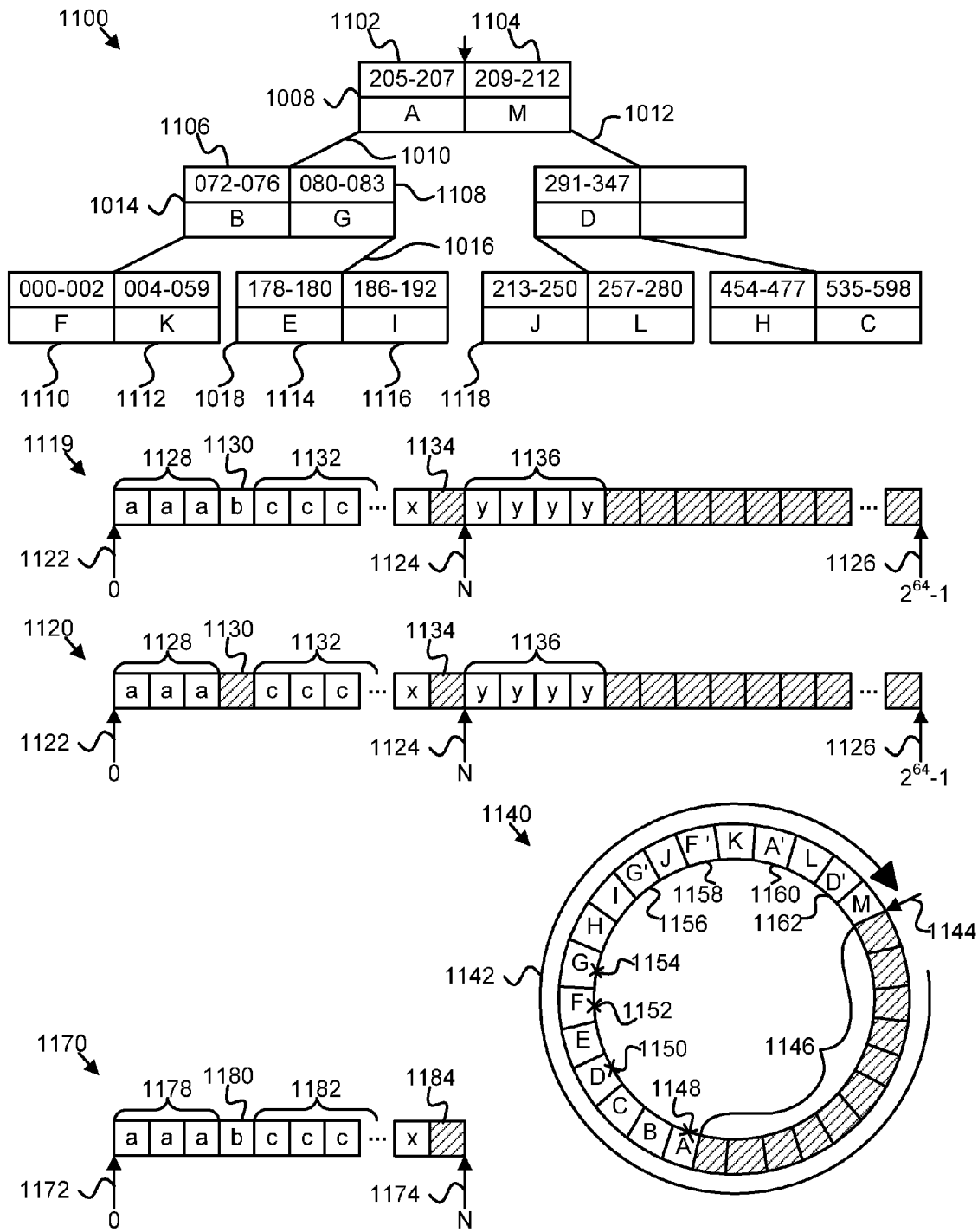
FIG. 11 is a schematic block diagram illustrating one embodiment of a mapping structure, a logical address space of a cache, a sequential, log-based, append-only writing structure, and an address space of a storage device in accordance with the present invention.

FIG. 11 depicts one embodiment of a mapping structure 1100, a logical address space 1120 of the cache 102, a combined logical address space 1119 that is accessible to a storage client, a sequential, log-based, append-only writing structure 1140, and a storage device address space 1170 of the storage device 118. The mapping structure 1100, in one embodiment, is maintained by the direct mapping module 606. The mapping structure 1100, in the depicted embodiment, is a B-tree that is substantially similar to the forward map 1004 described above with regard to FIG. 10, with several additional entries. Further, instead of links that map to entries in a reverse map 1022, the nodes of the mapping structure 1100 include direct references to physical locations in the cache 102. The mapping structure 1100, in various embodiments, may be used either with or without a reverse map 1022. As described above with regard to the forward map 1004 of FIG. 10, in other embodiments, the references in the mapping structure 1100 may include alpha-numerical characters, hexadecimal characters, pointers, links, and the like.

The mapping structure 1100, in the depicted embodiment, includes a plurality of nodes. Each node, in the depicted embodiment, is capable of storing two entries. In other embodiments, each node may be capable of storing a greater number of entries, the number of entries at each level may change as the mapping structure 1100 grows or shrinks through use, or the like.

Each entry, in the depicted embodiment, maps a variable length range of logical addresses of the cache 102 to a physical location in the storage media 110 for the cache 102. Further, while variable length ranges of logical addresses, in the depicted embodiment, are represented by a starting address and an ending address, in other embodiments, a variable length range of addresses may be represented by a starting address and a length, or the like. In one embodiment, the capital letters 'A' through 'M' represent a logical or physical erase block in the physical storage media 110 of the cache 102 that stores the data of the corresponding range of logical addresses. In other embodiments, the capital letters may represent other physical addresses or locations of the cache 102. In the depicted embodiment, the capital letters 'A' through 'M' are also depicted in the writing structure 1140 which represents the physical storage media 110 of the cache 102.

In the depicted embodiment, membership in the mapping structure 1100 denotes membership (or storage) in the cache 102. In another embodiment, an entry may further include an indicator of whether the cache 102 stores data corresponding to a logical block within the range of logical addresses, data of the reverse map 1022 described above, and/or other data. For example, in one embodiment, the mapping structure 1100 may also map logical addresses of the storage device 118 to physical addresses or locations within the storage device 118, and an entry may include an indicator that the cache 102 does not store the data and a physical address or location for the data on the storage device 118. The mapping structure 1100, in the depicted embodiment, is accessed and traversed in a similar manner as that described above with regard to the forward map 1004.

In the depicted embodiment, the root node 1008 includes entries 1102, 1104 with noncontiguous ranges of logical addresses. A "hole" exists at logical address "208" between the two entries 1102, 1104 of the root node. In one embodiment, a "hole" indicates that the cache 102 does not store data corresponding to one or more logical addresses corresponding to the "hole." In one embodiment, a "hole" may exist because the eviction module 712 evicted data corresponding to the "hole" from the cache 102. If the eviction module 712 evicted data corresponding to a "hole," in one embodiment, the storage device 118 still stores data corresponding to the "hole." In another embodiment, the cache 102 and/or the storage device 118 supports block I/O requests (read, write, trim, etc.) with multiple contiguous and/or noncontiguous ranges of addresses (i.e. ranges that include one or more "holes" in them). A "hole," in one embodiment, may be the result of a single block I/O request with two or more noncontiguous ranges of addresses. In a further embodiment, a "hole" may be the result of several different block I/O requests with address ranges bordering the "hole."

In FIG. 10, the root node 1008 includes a single entry with a logical address range of "205-212," without the hole at "208." If the entry of the root node 1008 were a fixed size cache line of a traditional cache, the entire range of logical addresses "205-212" would be evicted together. Instead, in the embodiment depicted in FIG. 11, the eviction module 712 evicts data of a single logical address "208" and splits the range of logical addresses into two separate entries 1102, 1104. In one embodiment, the direct mapping module 606 may rebalance the mapping structure 1100, adjust the location of a directed edge, root node, or child node, or the like in response to splitting a range of logical addresses. Similarly, in one embodiment, each range of logical addresses may have a dynamic and/or variable length, allowing the cache 102 to store dynamically selected and/or variable lengths of logical block ranges.

In the depicted embodiment, similar "holes" or noncontiguous ranges of logical addresses exist between the entries 1106, 1108 of the node 1014, between the entries 1110, 1112 of the left child node of the node 1014, between entries 1114, 1116 of the node 1018, and between entries of the node 1118. In one embodiment, similar "holes" may also exist between entries in parent nodes and child nodes. For example, in the depicted embodiment, a "hole" of logical addresses "060-071" exists between the left entry 1106 of the node 1014 and the right entry 1112 of the left child node of the node 1014.

The "hole" at logical address "003," in the depicted embodiment, can also be seen in the logical address space 1120 of the cache 102 at logical address "003" 1130. The hash marks at logical address "003" 1140 represent an empty location, or a location for which the cache 102 does not store data. In the depicted embodiment, storage device address "003" 1180 of the storage device address space 1170 does store data (identified as 'b'), indicating that the eviction module 712 evicted data from logical address "003" 1130 of the cache 102. The "hole" at logical address 1134 in the logical address space 1120, however, has no corresponding data in storage device address 1184, indicating that the "hole" is due to one or more block I/O requests with noncontiguous ranges, a trim or other deallocation command to both the cache 102 and the storage device 118, or the like.

The "hole" at logical address "003" 1130 of the logical address space 1120, however, in one embodiment, is not viewable or detectable to a storage client. In the depicted embodiment, the combined logical address space 1119 represents the data that is available to a storage client, with data that is stored in the cache 102 and data that is stored in the storage device 118 but not in the cache 102. As described above, the read miss module 718 of FIG. 7 handles misses and returns requested data to a requesting entity. In the depicted embodiment, if a storage client requests data at logical address "003" 1130, the read miss module 718 will retrieve the data from the storage device 118, as depicted at address "003" 1180 of the storage device address space 1170, and return the requested data to the storage client. The requested data at logical address "003" 1130 may then also be placed back in the cache 102 and thus logical address 1130 would indicate 'b' as present in the cache 102.

For a partial miss, the read miss module 718 may return a combination of data from both the cache 102 and the storage device 118. For this reason, the combined logical address space 1119 includes data 'b' at logical address "003" 1130, and the "hole" in the logical address space 1120 of the cache 102 is transparent. In the depicted embodiment, the combined logical address space 1119 is the size of the logical address space 1120 of the cache 102 and is larger than the storage device address space 1180. In another embodiment, the direct cache module 116 may size the combined logical address space 1119 as the size of the storage device address space 1180, or as another size.

The logical address space 1120 of the cache 102, in the depicted embodiment, is larger than the physical storage capacity and corresponding storage device address space 1170 of the storage device 118. In the depicted embodiment, the cache 102 has a 64 bit logical address space 1120 beginning at logical address "0" 1122 and extending to logical address "$2^{64}-1$" 1126. The storage device address space 1170 begins at storage device address "0" 1172 and extends to storage device address "N" 1174. Storage device address "N" 1174, in the depicted embodiment, corresponds to logical address "N" 1124 in the logical address space 1120 of the cache 102. Because the storage device address space 1170 corresponds to only a subset of the logical address space 1120 of the cache 102, the rest of the logical address space 1120 may be shared with an additional cache 102, may be mapped to a different storage device 118, may store data in the cache 102 (such as a Non-volatile memory cache) that is not stored in the storage device 1170, or the like.

For example, in the depicted embodiment, the first range of logical addresses "000-002" 1128 stores data corresponding to the first range of storage device addresses "000-002" 1178. Data corresponding to logical address "003" 1130, as described above, was evicted from the cache 102 forming a "hole" and a potential cache miss. The second range of logical addresses "004-059" 1132 corresponds to the second range of storage device addresses "004-059" 1182. However, the final range of logical addresses 1136 extending from logical address "N" 1124 extends beyond storage device address "N" 1174. No storage device address in the storage device address space 1170 corresponds to the final range of logical addresses 1136. The cache 102 may store the data corresponding to the final range of logical addresses 1136 until the data storage device 118 is replaced with larger storage or is expanded logically, until an additional data storage device 118 is added, simply use the non-volatile storage capability of the cache to indefinitely provide storage capacity directly to a storage client 504 independent of a storage device 118, or the like. In a further embodiment, the direct cache module 116 alerts a storage client 504, an operating system, a user application 502, or the like in response to detecting a write request with a range of addresses, such as the final range of logical addresses 1136, that extends beyond the storage device address space 1170. The user may then perform some maintenance or other remedial operation to address the situation. Depending on the nature of the data, no further action may be taken. For example, the data may represent temporary data which if lost would cause no ill effects.

The sequential, log-based, append-only writing structure 1140, in the depicted embodiment, is a logical representation of the physical storage media 110 of the cache 102. In a further embodiment, the storage device 118 may use a substantially similar sequential, log-based, append-only writing structure 1140. In certain embodiments, the cache 102 stores data sequentially, appending data to the writing structure 1140 at an append point 1144. The cache 102, in a further embodiment, uses a storage space recovery process, such as the garbage collection module 710 and/or the storage space recovery module 806 that re-uses non-volatile storage media storing deallocated/unused logical blocks. Non-volatile storage media storing deallocated/unused logical blocks, in the depicted embodiment, is added to an available storage pool 1146 for the cache 102. By evicting and clearing certain data from the cache 102, as described above, and adding the physical storage capacity corresponding to the evicted and/or cleared data back to the available storage pool 1146, in one embodiment, the writing structure 1140 is cyclic, ring-like, and has a theoretically infinite capacity.

In the depicted embodiment, the append point 1144 progresses around the log-based, append-only writing structure 1140 in a circular pattern 1142. In one embodiment, the circular pattern 1142 wear balances the solid-state storage media 110, increasing a usable life of the solid-state storage media 110. In the depicted embodiment, the eviction module 712 and/or the garbage collection module 710 have marked several blocks 1148, 1150, 1152, 1154 as invalid, represented by an "X" marking on the blocks 1148, 1150, 1152, 1154. The garbage collection module 710, in one embodiment, will recover the physical storage capacity of the invalid blocks 1148, 1150, 1152, 1154 and add the recovered capacity to the available storage pool 1146. In the depicted embodiment, modified versions of the blocks 1148, 1150, 1152, 1154 have been appended to the writing structure 1140 as new blocks 1156, 1158, 1160, 1162 in a read, modify, write operation or the like, allowing the original blocks 1148, 1150, 1152, 1154 to be recovered.

Figure 12:
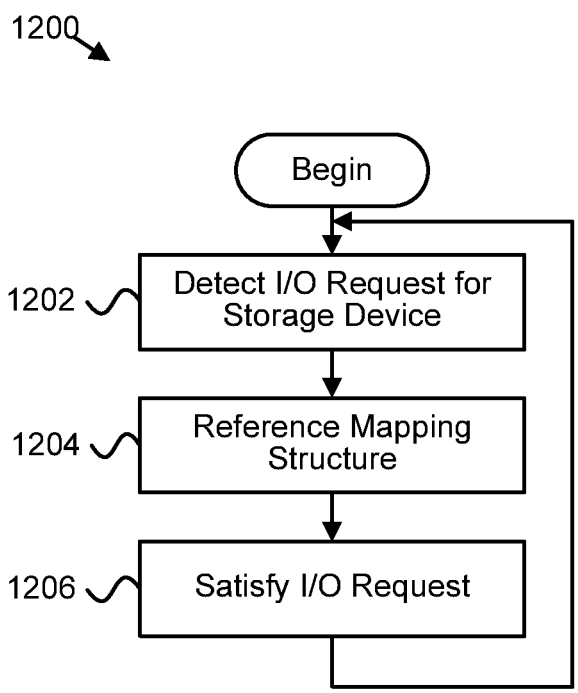
FIG. 12 is a schematic flow chart diagram illustrating one embodiment of a method for caching data in accordance with the present invention.

FIG. 12 depicts one embodiment of a method 1200 for caching data. The method 1200 begins and the storage request module 602 detects 1202 an I/O request for a storage device 118 cached by solid-state storage media 110 of a cache 102. The direct mapping module 606 references 1204 a single mapping structure to determine whether the cache 102 comprises data of the detected 1202 I/O request. The single mapping structure maps each logical block address of the storage device 102 directly to a logical block address of the cache 102 and also comprises a fully associative relationship between logical block addresses of the storage device 118 and physical storage addresses of the solid-state storage media 110. The cache fulfillment module 604 satisfies 1206 the detected 1202 I/O request using the cache 102 in response to the direct mapping module 606 determining 1204 that the cache 102 comprises at least one data block of the detected 1202 I/O request. The storage request module 602 continues to detect 1202 I/O requests and the method 1200 repeats.

Figure 13:
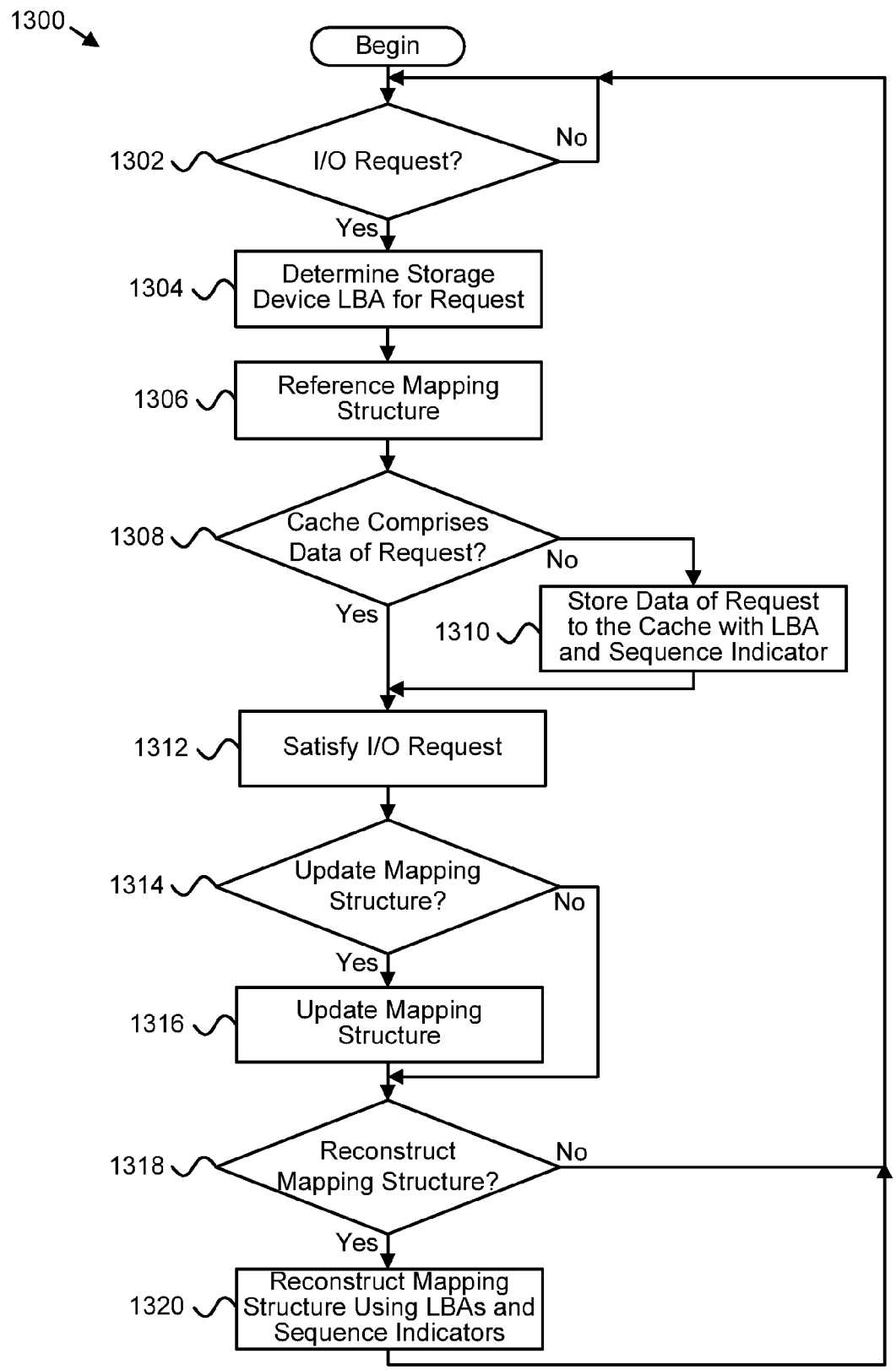
FIG. 13 is a schematic flow chart diagram illustrating another embodiment of a method for caching data in accordance with the present invention.

FIG. 13 depicts another embodiment of a method 1300 for caching data. The method 1300 begins and the storage request module 602 determines 1302 whether there are any I/O requests for a storage device 118 cached by solid-state storage media 110 of a cache 102. If the storage request module 602 does not detect 1302 an I/O request, the storage request module 602 continues to monitor 1302 I/O requests. If the storage request module 602 detects 1302 an I/O request, the storage request module 602 determines 1304 a storage device logical block address for the I/O request.

The direct mapping module 606 references 1306 a single mapping structure using the determined 1304 storage device logical block address to determine 1308 whether the cache 102 comprises/stores data of the I/O request. If the direct mapping module 606 determines 1308 that the cache 102 does not comprise data of the I/O request, the cache fulfillment module 604 stores 1310 data of the I/O request to the cache 102 in a manner that associates the data with the determined 1304 logical block address and a sequence indicator for the I/O request, to satisfy the I/O request.

If the direct mapping module 606 determines 1308 that the cache 102 comprises at least one data block of the I/O request, the cache fulfillment module 604 satisfies 1312 the I/O request, at least partially, using the cache 102. For a write I/O request, the cache fulfillment module 604 may satisfy 1312 the I/O request by storing data of the I/O request to the cache 102 sequentially on the solid-state storage media 110 to preserve an ordered sequence of storage operations. For a read I/O request, the cache fulfillment module 604 may satisfy 1312 the I/O request by reading data of the I/O request from the cache 102 using a physical storage address of the solid-state storage media 110 associated with the determined 1304 logical block address of the I/O request.

The direct mapping module 606 determines 1314 whether to update the mapping structure to maintain an entry in the mapping structure associating the determined 1304 logical block address and physical storage locations or addresses on the solid-state storage media 110. For example, the direct mapping module 606 may determine 1314 to update the mapping structure if storing 1310 data of the I/O request to the cache 102 or otherwise satisfying 1312 the I/O request changed the state of data on the cache 102, such as for a write I/O request, a cache miss, a TRIM request, an erase request, or the like.

If the direct mapping module 606 determines 1314 to update the mapping structure, the direct mapping module 606 updates 1316 the mapping structure to map the determined 1304 storage device logical block address for the I/O request directly to a logical block address of the cache 102 and to a physical storage address or location of data associated with the I/O request on the solid-state storage media 110 of the cache 102. If the direct mapping module 606 determines 1314 not to update the mapping structure, for a read I/O request resulting in a cache hit or the like, the method 1300 continues without the direct mapping module 606 updating 1316 the mapping structure.

The direct mapping module 606 determines 1318 whether to reconstruct the mapping structure, in response to a reconstruction event such as a power failure, a corruption of the mapping structure, an improper shutdown, or the like. If the direct mapping module 606 determines 1318 to reconstruct the mapping structure, the direct mapping module 606 reconstructs 1320 the mapping structure using the logical block addresses and sequence indicators associated with data on the solid-state storage media 110 of the cache 102, scanning a sequential, log-based, cyclic writing structure or the like. If the direct mapping module 606 determines 1318 not to reconstruct the mapping structure, the method 1300 skips the reconstruction step 1320 and the storage request module 602 continues to monitor 1302 I/O requests for the storage device 118.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for caching data, the method comprising:
   detecting an input/output ("I/O") request for a storage device being cached by solid-state storage media of a cache;
   referencing a single mapping structure to determine that the cache comprises data of the I/O request, the single mapping structure mapping each logical block address of the storage device directly to a logical block address of the cache, the single mapping structure comprising a fully associative relationship between logical block addresses of the storage device and physical storage addresses on the solid-state storage media; and
   satisfying the I/O request using the cache in response to determining that the cache comprises at least one data block of the I/O request.

2. The method of claim 1, wherein satisfying the I/O request comprises storing the data of the I/O request to the cache sequentially on the solid-state storage media to preserve an ordered sequence of storage operations performed on the solid-state storage media at one or more logical block addresses of the cache.

3. The method of claim 2, wherein storing the data of the I/O request to the cache sequentially comprises appending the data of the I/O request to an append point of a sequential, log-based, cyclic writing structure of the solid-state storage media, and wherein the single mapping structure is configured such that each logical block address of the storage device maps to a distinct unique entry in the single mapping structure and the unique entry maps to a distinct physical storage address on the solid-state storage media.

4. The method of claim 1, wherein satisfying the I/O request comprises reading the data of the I/O request from the cache using a physical storage address of the solid-state storage media associated with a logical block address of the I/O request.

5. The method of claim 1, further comprising storing the data of the I/O request on the solid-state storage media in a format that associates the data of the I/O request with respective logical block addresses of the data of the I/O request.

6. The method of claim 1, further comprising associating sequence indicators with the data of the I/O request on the solid-state storage media, wherein the sequence indicators record an ordered sequence of storage operations performed on the solid-state storage media.

7. The method of claim 6, further comprising:
   storing the data of the I/O request in a format that associates the data of the I/O request with respective logical block addresses on the solid-state storage media;
   maintaining an entry in the single mapping structure, the entry comprising an association between logical block addresses of the data of the I/O request and physical storage locations comprising the data of the I/O request on the solid-state storage media; and
   reconstructing the entry in the single mapping structure using the logical block addresses of the data of the I/O request and the sequence indicators associated with the data of the I/O request on the solid-state storage media.

8. The method of claim 1, wherein the I/O request comprises one or more sets of non-contiguous logical block address ranges for the storage device.

9. The method of claim 1, wherein the solid-state storage media is managed by a solid-state storage controller configured to mask differences in latency for storage operations performed on the solid-state storage media.

10. The method of claim 1, wherein the single mapping structure comprises a plurality of entries, each entry mapping a variable length range of logical block addresses of the cache to a location on the solid-state storage media of the cache.

11. The method of claim 1, wherein the presence of an entry for a logical block address of the cache in the single mapping structure indicates that the cache stores data associated with a corresponding logical block address of the storage device at a physical storage address on the solid-state storage media indicated by the entry.

12. The method of claim 1, further comprising performing one or more actions on the cache in response to detecting one or more predefined commands for the storage device, wherein the one or more predefined commands are selected from a group consisting of a flush command, a pin command, an unpin command, a freeze command, and a thaw command.

13. The method of claim 1, further comprising dynamically reducing a cache size for the cache in response to an age characteristic for storage media of the cache.

14. The method of claim 1, wherein the single mapping structure maps each logical block address of the storage device directly to a logical block address of the cache by using an address of the I/O request directly to identify both an entry in the single mapping structure for a logical block address of the cache and to identify a logical block address of the storage device.

15. The method of claim 1, wherein a cache data block associated with a logical block address of the cache is equal in size to a storage device data block associated with a logical block address of the storage device.

16. An apparatus for caching data, the apparatus comprising:
- a storage request module that detects an input/output ("I/O") request for a storage device cached by solid-state storage media of a cache;
- a direct mapping module that references a single mapping structure using an address of the I/O request to determine that the cache comprises data of the I/O request, the address of the I/O request directly identifying both an entry in the single mapping structure and a logical block address of the storage device, the single mapping structure maintaining a fully associative relationship between logical block addresses of the storage device and physical storage addresses on the solid-state storage media; and
- a cache fulfillment module that satisfies the I/O request using the cache in response to determining that the cache comprises at least one data block of the I/O request; wherein the storage request module, the direct mapping module, and the cache fulfillment module comprise one or more of logic hardware and executable code, the executable code stored on a non-transitory computer storage medium of the apparatus.

17. The apparatus of claim 16, wherein the cache fulfillment module satisfies the I/O request by storing the data of the I/O request to the cache sequentially on the solid-state storage media to preserve an ordered sequence of storage operations performed on the solid-state storage media at one or more logical block addresses of the cache.

18. The apparatus of claim 16, wherein the cache fulfillment module satisfies the I/O request by reading the data of the I/O request from the cache using a physical storage address of the solid-state storage media associated with a logical block address of the I/O request.

19. A system for caching data, the system comprising:
- a processor;
- a storage controller for a nonvolatile solid-state storage cache, the cache in communication with the processor over one or more communications buses;
- a cache controller in communication with the storage controller, the cache controller comprising,
    - a storage request module that detects an input/output ("I/O") request for a storage device cached by solid-state storage media of a cache;
    - a direct mapping module that references a single mapping structure using an address of the I/O request to determine that the cache comprises data of the I/O request, the address of the I/O request directly identifying both an entry in the single mapping structure and a logical block address of the storage device, the single mapping structure maintaining a fully associative relationship between logical block addresses of the storage device and physical storage addresses on the solid-state storage media; and
    - a cache fulfillment module that satisfies the I/O request using the cache in response to determining that the cache comprises at least one data block of the I/O request.

20. The system of claim 19, further comprising a host computer system, the host computer system comprising the processor, wherein the storage controller and the cache controller each comprise a device driver executing on the processor of the host computer system.

* * * * *